United States Patent
Chowdhury et al.

(10) Patent No.: US 10,312,361 B2
(45) Date of Patent: Jun. 4, 2019

(54) TRENCHED VERTICAL POWER FIELD-EFFECT TRANSISTORS WITH IMPROVED ON-RESISTANCE AND BREAKDOWN VOLTAGE

(71) Applicant: The Regents of the University of California, Oakland, CA (US)

(72) Inventors: Srabanti Chowdhury, San Ramon, CA (US); Jeonghee Kim, Mohegan Lake, NY (US); Chirag Gupta, Santa Barbara, CA (US); Stacia Keller, Santa Barbara, CA (US); Silvia H. Chan, Santa Barbara, CA (US); Umesh K. Mishra, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/344,377

(22) Filed: Nov. 4, 2016

(65) Prior Publication Data

US 2017/0125574 A1    May 4, 2017

Related U.S. Application Data

(63) Continuation-in-part of application No. PCT/US2015/031041, filed on May 15, 2015.
(Continued)

(51) Int. Cl.
*H01L 29/778* (2006.01)
*H01L 29/66* (2006.01)
(Continued)

(52) U.S. Cl.
CPC ...... *H01L 29/7787* (2013.01); *H01L 29/0646* (2013.01); *H01L 29/0649* (2013.01);
(Continued)

(58) Field of Classification Search
CPC ............ H01L 29/0646; H01L 29/0649; H01L 29/4236; H01L 29/4238; H01L 29/66462;
(Continued)

(56) References Cited

U.S. PATENT DOCUMENTS

| 2012/0319127 A1* | 12/2012 | Chowdhury ...... H01L 29/66462 257/76 |
| 2013/0147540 A1 | 6/2013 | Wu et al. |

(Continued)

OTHER PUBLICATIONS

Gupta, C., et al, "A novel device design to lower the on-resistance in GaN trench MOSFETs," 2016 74th Annual Device Research Conference (DRC), Newark, DE, Jun. 2016, pp. 1-2; doi: 10.1109/DRC.2016.7548466.
(Continued)

*Primary Examiner* — Cuong Q Nguyen
(74) *Attorney, Agent, or Firm* — Gates & Cooper LLP

(57) ABSTRACT

Trenched vertical power field-effect transistors with improved on-resistance and/or breakdown voltage are fabricated. In one or more embodiments, the modulation of the current flow of the transistor occurs in the lateral channel, whereas the voltage is predominantly held in the vertical direction in the off-state. When the device is in the on-state, the current is channeled through an aperture in a current-blocking region after it flows under a gate region into the drift region. In another embodiment, a novel vertical power low-loss semiconductor multi-junction device in III-nitride and non-III-nitride material system is provided. One or more multi-junction device embodiments aim at providing enhancement mode (normally-off) operation alongside ultra-low on resistance and high breakdown voltage.

19 Claims, 42 Drawing Sheets

Related U.S. Application Data

(60) Provisional application No. 61/993,759, filed on May 15, 2014, provisional application No. 62/075,556, filed on Nov. 5, 2014, provisional application No. 62/075,560, filed on Nov. 5, 2014, provisional application No. 62/250,741, filed on Nov. 4, 2015.

(51) Int. Cl.

| | |
|---|---|
| *H01L 29/205* | (2006.01) |
| *H01L 29/20* | (2006.01) |
| *H01L 29/423* | (2006.01) |
| *H01L 29/40* | (2006.01) |
| *H01L 29/417* | (2006.01) |
| *H01L 29/06* | (2006.01) |
| *H01L 29/51* | (2006.01) |
| *H01L 29/861* | (2006.01) |

(52) U.S. Cl.
CPC ........ *H01L 29/2003* (2013.01); *H01L 29/205* (2013.01); *H01L 29/407* (2013.01); *H01L 29/41766* (2013.01); *H01L 29/4236* (2013.01); *H01L 29/66462* (2013.01); *H01L 29/7788* (2013.01); *H01L 29/7789* (2013.01); *H01L 29/0623* (2013.01); *H01L 29/517* (2013.01); *H01L 29/861* (2013.01)

(58) Field of Classification Search
CPC ........... H01L 29/6656; H01L 29/66734; H01L 29/066272; H01L 29/7813
See application file for complete search history.

(56) References Cited

U.S. PATENT DOCUMENTS

| | | | |
|---|---|---|---|
| 2013/0210220 A1 | 8/2013 | Chu et al. | |
| 2013/0264578 A1 | 10/2013 | Mishra et al. | |
| 2015/0137220 A1* | 5/2015 | Li | H01L 29/6656 257/330 |

OTHER PUBLICATIONS

Gupta, C. et al, "OG-FET: An in-situ Oxide, GaN interlayer based vertical trench MOSFET," IEEE Electron Device Letters, vol. PP, No. 99, pp. 1-1; doi: 10.1109/LED.2016.2616508; http://ieeexplore.ieee.org/stamp/stamp.jsp?tp=&arnumber=7588148&isnumber=4357973, Oct. 2016.

Gupta, C., et al, "Regrown Mg doped GaN interlayer to enhance breakdown voltage in trench MOSFET", International Workshop on Nitrides 2016, Orlando, FL, Abstract; https://www.mrs.org/docs/default-source/meetings-events/mrs-conference-services/58th-emc/iwn-program.pdf?sfvrsn=14, Oct. 2016.

PCT International Search Report and Written Opinion dated Oct. 1, 2015, International Application No. PCT/US15/31041.

Chan, S.H., S. Keller, M. Tahhan, H. Li, B. Romanczyk, S. P. Denbaars and U.K. Mishra, "High electron mobility recovery in AlGaN/ GaN 2DEG channels regrown on etched surfaces," Semicond. Sci. Technol., 31.6 065008, pp. 1-8, Apr. 2016. DOI:10.1088/0268-1242/31/6/065008.

Chowdhury, S., "AlGaN/GaN CAVETs for high power switching application Title of dissertation," Ph.D. dissertation, ECE. Dept., UC Santa Barbara, Santa Barbara, California, 2010.

Gupta, C., et al., "In Situ Oxide, GaN Interlayer-Based Vertical Trench MOSFET (OG-FET) on Bulk GaN Substrates", IEEE Electron Device Letters, vol. 38, No. 3, Mar. 2017, pp. 353-355.

Gupta, C., S. H. Chan, A. Agarwal, N. Hatui, S. Keller and U. K. Mishra, "First Demonstration of AlSiO as Gate Dielectric in GaN FETs; Applied to a High Performance OG-FET," in IEEE Electron Device Letters, vol. 38, No. 11, pp. 1575-1578, Nov. 2017. doi: 10.1109/LED.2017.2756926.

Gupta, C., A. Agarwal, S. H. Chan, O. S. Koksaldi, S. Keller and U. K. Mishra, "1 kV field plated in-situ oxide, GaN interlayer based vertical trench MOSFET (OG-FET)," 2017 75th Annual Device Research Conference (DRC), South Bend, IN, 2017, pp. 1-2. doi: 10.1109/DRC.2017.7999410.

Gupta, C. et al., "Impact of Trench Dimensions on the Device Performance of GaN Vertical Trench MOSFETs," in IEEE Electron Device Letters, vol. 38, No. 11, pp. 1559-1562, Nov. 2017. doi: 10.1109/LED.2017.2749540.

Ji, D. et al., "First report of scaling a normally-off in-situ oxide, GaN interlayer based vertical trench MOSFET (OG-FET)," 2017 75th Annual Device Research Conference (DRC), South Bend, IN, 2017, pp. 1-2. doi: 10.1109/DRC.2017.7999442.

Kim J., N. G. Toledo, S. Lal, J. Lu, T. E. Buehl, and U. K. Mishra. "Wafer-Bonded p-n Heterojunction of GaAs and Chemomechanically Polished N-Polar GaN," IEEE Electron Device Lett., 34, No. 1, pp. 42-44, (2013).

Kim, J., S. Lal, M. A. Laurent, and U. K. Mishra. "Vertical electron transistors with In0.53Ga0.47As channel and N-polar In0.1Ga0.9N/GaN drain achieved by direct wafer-bonding," IEEE Device Research Conference (DRC), pp. 221-222, (2014).

Kodama, M., M. Sugimoto, E. Hayashi, N. Soejima, O. Ishiguro, M. Kanechika, K. Itoh, H. Ueda, T. Uesugi and T. Kachi, "GaN-based trench gate metal oxide semiconductor field-effect transistor fabricated with novel wet etching," Appl. Phys. Exp., vol. 1, No. 2, pp. 021104-1-021104-3, Feb. 2008. DOI: 10.1143/APEX.1.021104.

Lal, S., J. Lu, M. Guidry, B. Thibeault, S. P. DenBaars, and U. K. Mishra. "Controlling electronic properties of wafer-bonded interfaces among dissimilar materials: A path to developing novel wafer-bonded devices," IEEE Device Research Conference (DRC), pp. 121-122, (2013).

Liu, X., S.H. Chan, F. Wu, Y. Lie, S. Keller, J.S. Speck and U.K. Mishra, "Metalorganic chemical vapor deposition of Al2O3 using trimethylaluminum and O2 precursors: Growth mechanism and crystallinity," vol. 408, pp. 78-84, Sep. 2014. DOI:10.1016/j.jcrysgro.2014.09.029.

Nie, H. et al., IEEE-EDL, vol. 35, No. 9, pp. 939-941, (Sep. 2014).

Oka, T., T. Ina, Y. Ueno and J. Nishii, "1.8 mΩ.cm2 vertical GaN-based trench metal-oxide-semiconductor field-effect transistors on a free-standing GaN substrate for 1.2-kV-class operation," Appl. Phys. Exp., vol. 8, No. 5, pp. 054101-1-054101-3, May 2015. DOI: 10.7567/APEX.8.054101.

Oka, T., Y. Ueno, T. Ina and K. Hasegawa, "Vertical GaN-based trench metal oxide semiconductor field-effect transistors on a free-standing GaN substrate with blocking voltage of 1.6 kV," Appl. Phys. Exp., vol. 7, No. 2, pp. 021002-1-021002-3, Jan. 2014. DOI: 10.7567/APEX.7.021002.

Okada, M., Y. Saitoh, M. Yokoyama, K. Nakata, S. Yaegassi, K. Katayama, M. Ueno, M. Kiyama, T. Katsuyama, and Takao Nakamura, "Novel Vertical Heterojunction Field-Effect Transistors with Regrown AlGaN/GaN Two-Dimensional Electron Gas Channels on GaN Substrates," Appl. Phys. Exp., vol. 3, No. 5, pp. 054201-1-054201-3, Apr. 2010. DOI: 10.1143/APEX.3.054201.

Otake, H., S. Egami, H. Ohta, Y. Nanishi and H. Takasu, "GaN-based trench gate metal oxide semiconductor field affect transistors with over 100 cm2/(V-s) channel mobility," Jpn. J. Appl. Phys., vol. 46, No. 25, pp. L599-L601, Jun. 2007. DOI: 10.1143/JJAP.46.L599.

Otake, H., K. Chikamatsu, A. Yamaguchi, T. Fujishima and H. Ohta, "Vertical GaN-based trench gate metal oxide semiconductor field-effect transistors on GaN bulk substrates," Appl. Phys. Exp., vol. 1, No. 1, pp. 011105-1-011105-3, Jan. 2008. DOI: 10.1143/APEX.1.011105.

Xing, H., D. S. Green, H. Yu, T. Mates, P. Kozodoy, S. Keller, S. P. Denbaars and U. K. Mishra, "Memory effect and redistribution of Mg into sequentially regrown GaN layer by metalorganic chemical vapor deposition," Jpn. J. Appl. Phys., vol. 42, No. 1, pp. 50-53, Jan. 2003. DOI: 10.1143/JJAP.42.50.

Gupta, C., et al., "OG-FET: An In-Situ Oxide, GaN Interlayer-Based Vertical Trench MOSFET", IEEE Electron Device Letters, vol. 37, No. 12, Dec. 2016.

* cited by examiner

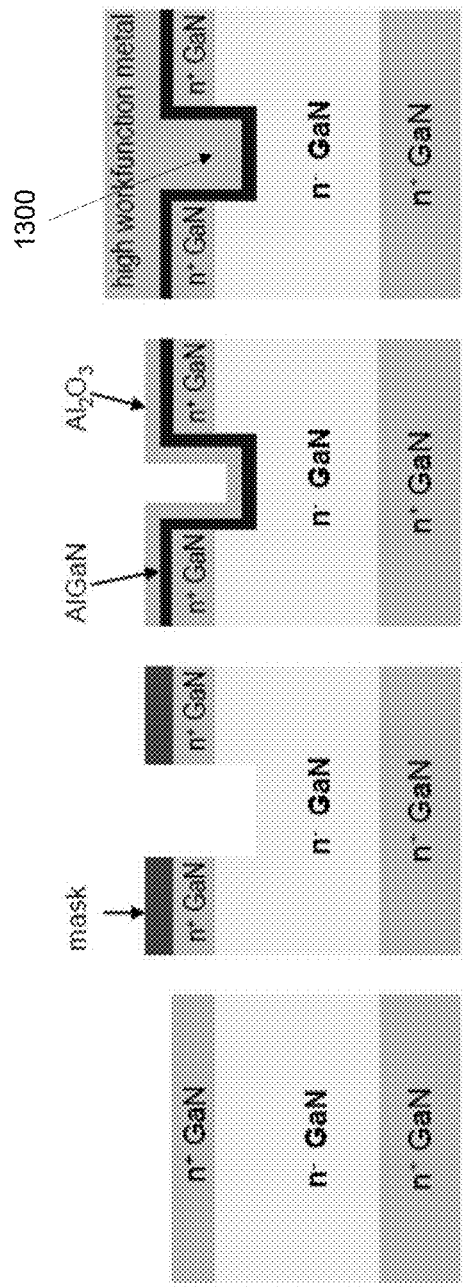
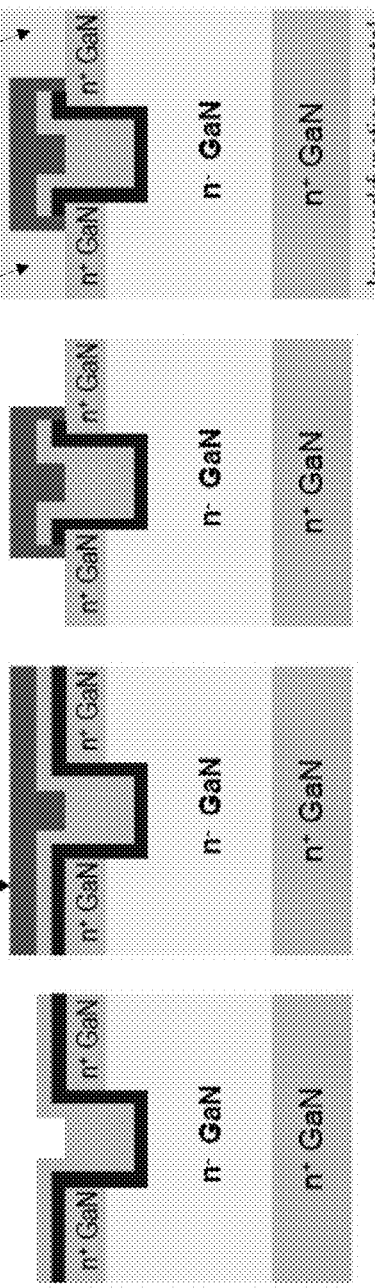

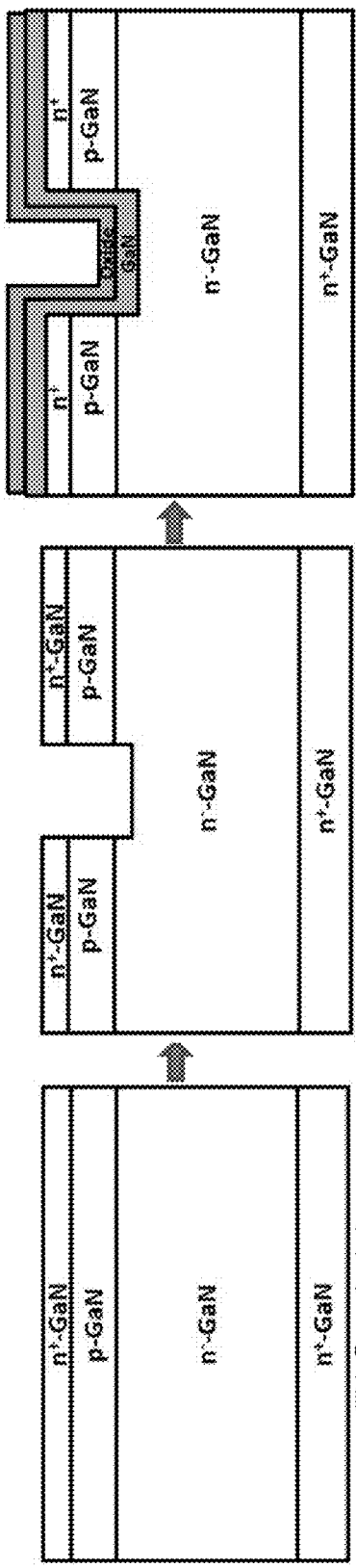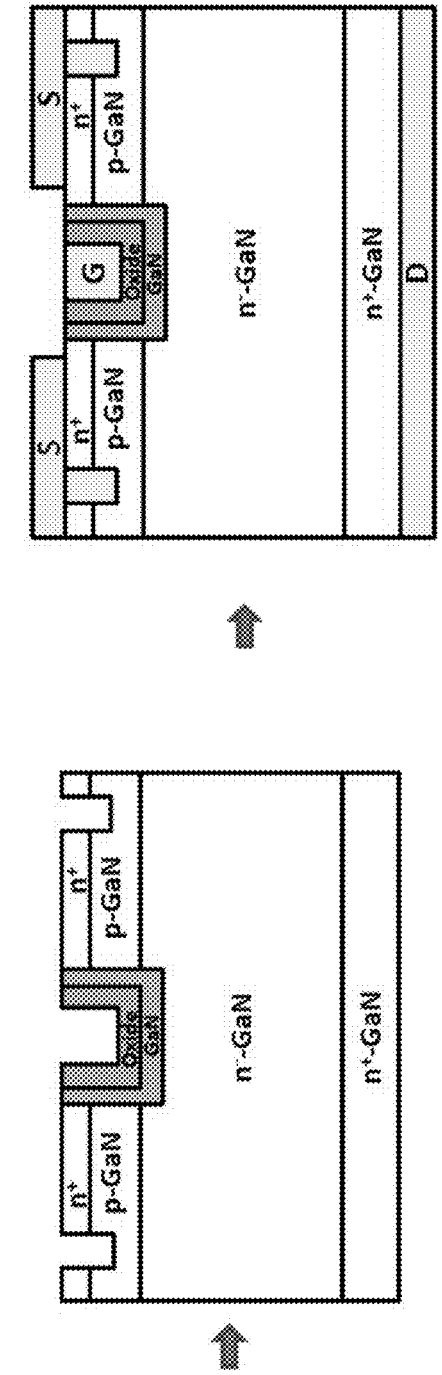
FIG. 24A
FIG. 24B
FIG. 24C
FIG. 24D
FIG. 24E

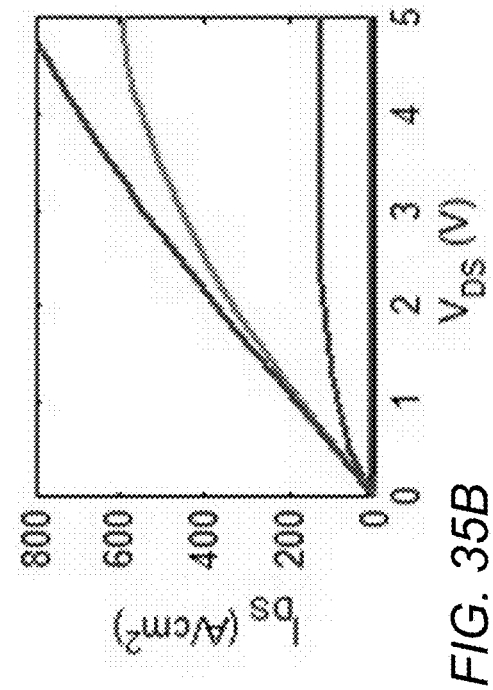
FIG. 35B
$R_{ON} = 5\ m\Omega\cdot cm^2$
$\mu_{CH,e} \sim 25\text{-}40\ cm^2/V\text{-}S$
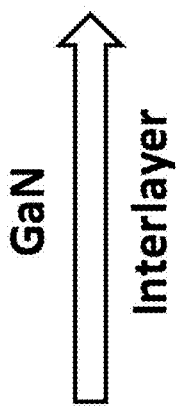
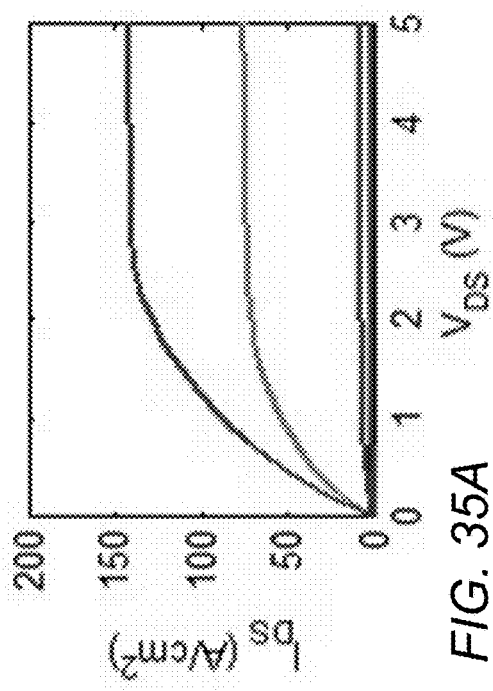
FIG. 35A
$R_{ON} = 10\ m\Omega\cdot cm^2$
$\mu_{CH,e} \sim 7\text{-}10\ cm^2/V\text{-}S$ $E_{BR}$ independent of drift region doping

| $V_{BR}$ | $N_D-N_A$ | $E_{BR}$ |
|---|---|---|
| ~600 V | $1.4 \times 10^{16}$ | 1.7 MV/cm |
| ~700 V | $1 \times 10^{16}$ | 1.6 MV/cm |
| ~1000 V | $7 \times 10^{15}$ | 1.6 MV/cm |

$V_{BR}$ increases with decrease in drift region doping

TRENCHED VERTICAL POWER FIELD-EFFECT TRANSISTORS WITH IMPROVED ON-RESISTANCE AND BREAKDOWN VOLTAGE

CROSS REFERENCE TO RELATED APPLICATIONS

This application is a continuation-in-part of and claims the benefit under 35 U.S.C. § 365(c) of PCT International Application No. PCT/US15/31041, filed May 15, 2015, by Srabanti Chowdhury, Jeonghee Kim, Chirag Gupta, Stacia Keller, and Umesh K. Mishra entitled "TRENCHED VERTICAL POWER FIELD-EFFECT TRANSISTORS WITH IMPROVED ON-RESISTANCE AND BREAKDOWN VOLTAGE,", which application claims the benefit under 35 U.S.C. Section 119(e) of the following and commonly-assigned U.S. Provisional Patent Applications:

U.S. Provisional Patent Application Ser. No. 61/993,759, filed on May 15, 2014, by Umesh Mishra, Stacia Keller, and Srabanti Chowdhury, entitled "GALLIUM NITRIDE (GAN) BASED VERTICAL METAL OXIDE SEMICONDUCTOR (MOS) TRANSISTORS AND JUNCTION FIELD EFFECT TRANSISTORS (JFETS)";

U.S. Provisional Patent Application Ser. No. 62/075,556, filed on Nov. 5, 2014, by Srabanti Chowdhury, Chirag Gupta, Stacia Keller and Umesh K. Mishra, entitled "SUPERJUNCTION CURRENT APERTURE VERTICAL ELECTRON TRANSISTOR FOR ULTRA-LOW ON-RESISTANCE"; and U.S. Provisional Patent Application Ser. No. 62/075,560, filed on Nov. 5, 2014, by Jeonghee Kim, Stacia Keller, Srabanti Chowdhury and Umesh K. Mishra, entitled "TRENCHED VERTICAL POWER FIELD-EFFECT TRANSISTORS WITH IMPROVED ON-RESISTANCE AND BREAKDOWN VOLTAGE";

all of which applications are incorporated by reference herein.

This application claims the benefit under 35 U.S.C. Section 119(e) of and commonly-assigned U.S. Provisional Patent Application No. 62/250,741, filed Nov. 4, 2015, by Chirag Gupta, Umesh K. Mishra, Silvia H. Chan, and Stacia Keller, entitled "DEVICE STRUCTURE TO ACHIEVE ENHANCEMENT MODE OPERATION ALONG WITH LOW ON-RESISTANCE AND HIGH BREAKDOWN VOLTAGE IN A SEMICONDUCTOR DEVICE,";

all of which applications are incorporated by reference herein.

This application is related to U.S. patent application Ser. No. 13/527,885, filed on Jun. 20, 2012, by Srabanti Chowdhury, Ramya Yeluri, Christopher Hurni, Umesh K. Mishra, and Ilan Ben-Yaacov, entitled "CURRENT APERTURE VERTICAL ELECTRON TRANSISTORS WITH AMMONIA MOLECULAR BEAM EPITAXY GROWN P-TYPE GALLIUM NITRIDE AS CURRENT BLOCKING LAYER," (client reference 2011-831-3), which application claims the benefit under 35 U.S.C. Section 119(e) of the following and commonly-assigned U.S. Provisional Patent Applications:

U.S. Provisional Patent Application Ser. No. 61/499,076, filed on Jun. 20, 2011, by Srabanti Chowdhury, Ramya Yeluri, Christopher Hurni, Umesh K. Mishra, and Ilan Ben-Yaacov, entitled "CURRENT APERTURE VERTICAL ELECTRON TRANSISTORS WITH AMMONIA MOLECULAR BEAM EPITAXY GROWN P-TYPE GALLIUM NITRIDE AS A CURRENT BLOCKING LAYER"; and U.S. Provisional Patent Application Ser. No. 61/583,015, filed on Jan. 4, 2012, by Srabanti Chowdhury, Ramya Yeluri, Christopher Hurni, Umesh K. Mishra, and Ilan Ben-Yaacov, entitled "CURRENT APERTURE VERTICAL ELECTRON TRANSISTORS WITH AMMONIA MOLECULAR BEAM EPITAXY GROWN P-TYPE GALLIUM NITRIDE AS A CURRENT BLOCKING LAYER", all of which applications are incorporated by reference herein.

BACKGROUND OF THE INVENTION

1. Field of the Invention

This invention relates to trenched vertical power field-effect transistors with improved on-resistance and breakdown voltage.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

Conventional transistors have performance limitations, particularly in power switching applications where power losses occur due to the switching. High power switching applications place unique demands on device structure. Current enhancement mode transistor devices suffer from low current density and high on resistance. Generally, there is a need for low on-resistance along with high breakdown voltage in such devices. One or more embodiments of the present invention satisfy this need.

SUMMARY OF THE INVENTION

To overcome the limitations in the prior art described above, and to overcome other limitations that will become apparent upon reading and understanding the present specification, one or more embodiments of the present invention disclose novel trenched vertical power field-effect transistor structures with improved on-resistance and breakdown voltage. One or more embodiments of the invention are fabricated by direct wafer-bonding of the drift region to the lateral channel, although other methods of fabrication can be employed. The modulation of the current flow of the transistor occurs in the lateral channel, whereas the voltage is predominantly held in the vertical direction in the off-state. When the device is in the on-state, the current is channeled through an aperture in a current-blocking region after it flows under a gate region into the drift region.

One or more embodiments of the present invention further disclose a superjunction current aperture vertical electron transistor (SJCAVET) for ultra-low on-resistance. The SJCAVET is a vertical device that is comprised of two parts. One part is a lateral channel that controls current flow from source to drain, wherein this channel may provide conductance via two-dimensional electron gas (2-DEG), a doped channel, or both. The second part is a drift region or a voltage blocking region which carries the current via either a vertical or sloped 2-DEG and/or through an adjacent doped region. The current flow from the lateral channel to the vertical drift region is confined substantially to an aperture defined by one or more current blocking layers (CBLs). In one or more embodiments of the device, in the off-state, the device voltage blocking layers can be completely depleted at voltages lower than the desired breakdown voltage enabling ultra-low on resistance and high breakdown voltage.

One or more embodiments of the invention further disclose the first true vertical GaN based transistors, where the gating is performed also on electrons traveling perpendicular to the surface in a vertical channel. An extremely low drift region spreading resistance is achieved by insertion of a two dimensional electron gas produced at an (Al,Ga,In)N/GaN heterojunction present on either side of the channel (referred to as the trench), significantly improving on the device performance by utilizing the full area of the drift region for conduction. The gating of the device can be either via a MOS structure to create a vertical MOSFET or a p-n junction to create a vertical JFET. Similar to the Current Aperture Vertical Electron Transistor (CAVET), both MOS and JFET have in common that the voltage in the off-state of the device is substantially held in the vertical direction in the n-drift region. To reduce on resistance and chip cost, the electrically active device area can be equal to the geometric chip area.

One or more embodiments of the invention disclose a vertical transistor e.g., III-nitride device), comprising a lateral channel connected to a drift region; a source contact to the lateral channel; a drain contact to the drift region; and one or more gates on the lateral channel and positioned to modulate current flowing vertically from the source contact, through the drift region, and to the drain contact, wherein the drift region comprises a current blocking structure; voltage is predominantly held in a vertical direction in an off-state; the current is channeled through an aperture in the current-blocking structure after it flows from under the one or more gates, into the drift region in an on-state; and the one or more gates and/or the current blocking structure (i) induce a two dimensional electron gas at one or more sidewalls of the gates and/or of the current blocking structure, and/or (ii) the current blocking structure comprises different material regions that can provide a compensating charge, wherein the compensating charge can fully deplete an ionized dopant concentration in a current carrying region of the drift region in the off-state.

The current-blocking structure can be comprised of trenches filled with insulator and metal to provide the compensating charge.

The current-blocking structure can be comprised of trenches filled with alternating layers of semiconductor material to provide the compensating charge.

The current blocking structure can have the one or more sidewalls adjacent to the current carrying region of the drift region, and be structured such that the one or more sidewalls reduce resistance to the current's flow in the current carrying drift region.

The device can comprise a part A bonded to a part B, wherein the Part A comprises the one or more gates, the source, and the lateral channel; the Part B comprises the drift region that carries the current flow via a vertical or sloped two-dimensional electron gas (2-DEG) and along the sidewall; and the current flow from the lateral channel to the drift region is confined substantially to an aperture defined by the current blocking structure.

The drift region can be a voltage blocking region that can be fully depleted at voltages lower than a desired breakdown voltage.

The current blocking structure can have one or more dimensions and materials, and the current-carrying region can have one or more dimensions and doping, such that an electric field held in the current blocking region is less than its breakdown field in the off-state, and the current-carrying region becomes fully depleted in the off-state, thus enabling a breakdown voltage of the device.

The gates can deplete the lateral channel adjacent the gates' sidewalls, so that the current flows predominantly from under the gate to the drift region.

The device can be a transistor further comprising a first III-nitride layer on a second III-nitride layer and comprising the lateral channel; a polar c-plane interface and nonpolar and/or semipolar interfaces between the first III-nitride layer (e.g., GaN) and the second III-nitride layer (e.g., AlGaN); the source contact to the lateral channel; and the drift region, comprising one or more doped Gallium Nitride (GaN) layers, wherein the polar interface is between the drift region and one or more gates.

The transistor can further comprise a plurality of trenches in one or more of the III-nitride layers, wherein the trenches shape the lateral channel; and one of the gates in each of the trenches.

The source contact can form metal regions between the gates and mitigate high field regions at the gate edges, ensuring the peak field is in the bulk of the device.

A polarization induced two dimensional electron gas (2DEG) can be formed in regions between the trenches, resulting in the 2DEG which spreads the current efficiently in the drift region to make the full chip area active.

In one or more embodiments, the channel comprising the 2DEG along the vertical non-polar (e.g., m-plane) and/or semipolar interfaces is induced only under forward bias on the gates and the 2DEG on the polar c-plane is always present for all operating conditions.

The transistor can further comprise a dielectric layer between the gates and the lateral channel, or the dielectric layer between the gates and the second III-nitride layer and along the interfaces; and wherein the dielectric provides negligible threshold shift under gate voltages between −10 V and +10V.

The transistor's electrically active device area can be equal to a geometric chip area on which the device is formed and a device having an on resistance of 1 m$\Omega$cm$^2$ can have three times smaller chip area for the same $R_{on}$ as a 3 m$\Omega$cm$^2$ device.

The transistor can be a Gallium Nitride (GaN) based vertical transistor, including but not limited to, a vertical metal oxide semiconductor field effect transistors (MOSFET) or a vertical junction field effect transistor (JFET).

One or more embodiments of the invention further disclose a method of fabricating a vertical transistor, comprising depositing a semiconductor structure comprising a lateral channel connected to a drift region; depositing a source contact to the lateral channel; depositing a drain contact to the drift region; depositing one or more gates on the lateral channel and positioned to modulate current flowing vertically from the source contact, through the drift region, and to the drain contact; and forming a trench region around a current carrying region of the drift region; and wherein: the trench region comprises a current blocking structure comprising different material layers that can provide a compensating charge, the compensating charge can fully deplete an ionized dopant concentration in a current carrying region of the drift region in an off-state, modulation of a current from a source to a drain occurs in the lateral channel, voltage is predominantly held in a vertical direction in the off-state, and the current is channeled through an aperture in the current-blocking structure after it flows from under the gates into the drift region in an on-state.

One or more embodiments of the invention further disclose a method of fabricating a transistor, comprising growing n-type GaN layers on a GaN substrate to serve as drift and channel layers; growing n++ GaN on the drift n-type GaN layer to serve as a contact layer; etching trenches in one or more of the GaN layers to form multiple channels in one or more of the GaN layers growing one or more III-Nitride layers on top of the channel GaN layer inside and outside the trenches, growing a first dielectric layer on the III-nitride layers inside and outside the trenches; depositing a planar metal layer on the first dielectric layer, etching the metal to leave a metal only in the trenches, wherein the metal forms one or more gates; covering the device with a second dielectric layer; etching the second dielectric to remove a portion of the second dielectric to expose the tops of the channel GaN layer outside the trenches; depositing metal on regions exposed by removal of the second dielectric layer to form a source ohmic contact to the channel GaN layer, forming metal regions between the gates that mitigate high field regions at gate edges and ensure the peak field is in the bulk of the device; and depositing metal on the contact layer to form a drain ohmic contact.

One or more embodiments of the invention further disclose a method of fabricating a Gallium Nitride based transistor, comprising growing one or more first III-nitride layers and one or more second III-nitride layers on a Gallium Nitride substrate, wherein polar c-plane interfaces between the first and second III-nitride layers are formed, a drift region, comprising one or more doped Gallium Nitride layers, is formed, and a conductive channel is formed; forming nonpolar and/or semipolar interfaces in one or more of the III-nitride layers; depositing one or more source contacts to the conductive channel; depositing a drain contact to the drift region, depositing one or more gates that modulate the conductive channel formed at the interfaces and a current passing through the conductive channel between the source contacts and the drain contacts, wherein: a polar interface is between the drift region and the one or more gates, the current from the source contact to the drain contact spreads laterally in the drift region in an on-state of the device, the gates modulate the current spreading laterally and passing between the source and the drain contact, and voltage in an off-state of the device is substantially held in the doped drift region in a vertical direction between the source and drain contacts.

One or more embodiments of the present invention further disclose semiconductor transistor, comprising: a first region A comprising a source contact on a current blocking layer (CBL); a second region B comprising a channel on a sidewall of the first region, a dielectric layer on the channel, and a gate contact on the dielectric layer; a third region comprising a drift region and a drain contact on the drift region. The CBL is doped and/or structured to prevent current flow from the source to the drain in both an ON-state and an OFF state and to achieve a desired threshold voltage. The gate contact controls or modulates the current flow from the source in a vertical direction through the channel, wherein modulation of the channel reduces on-resistance of the transistor, and the drift region is a voltage blocking region (e.g., which contains a substantial part of the blocked voltage in the OFF state in a vertical dimension). In one or more embodiments, an interface between the dielectric and the channel does not comprise positive charge, or comprises positive charge such that the transistor is an enhancement mode transistor.

In one or more embodiments of the semiconductor transistor, the drift region comprises a p-GaN region and an n-GaN region, the n-GaN region is between the drain and the channel and a p-GaN region, the p-GaN region is outside a region between the channel and the drain, and the p-GaN region is ohmically connected to the source contact such that upon application of a reverse bias, a depletion width of a p-n junction formed between the p-GaN and the n-GaN merges such that the transistor achieves a breakdown voltage of a p-n diode.

In one or more embodiments, an interface between the dielectric and the channel does not comprise positive charge, or comprises positive charge such that the transistor is an enhancement mode transistor. In one or more embodiments, the charge at the interface is such that the transistor's threshold voltage is greater than 1 Volt and/or a density of interface states at the interface in the channel is less than $10^{11}$ cm$^{-2}$.

In one or more embodiments, the channel, the CBL, and the drift region comprise III-Nitride or oxide materials e.g., polar materials).

One or more embodiments comprise a plurality of the transistors forming a multi-cell device, wherein the multi-cell device has edge termination.

BRIEF DESCRIPTION OF THE DRAWINGS

Referring now to the drawings in which like reference numbers represent corresponding parts throughout:

FIGS. 13(a)-13(h) show cross-sectional schematics illustrating a Vertical Metal Oxide Semiconductor High Electron Mobility (MOSHEMT) process flow where the 2DEG along vertical m-plane is induced only under forward bias on the gate and the 2DEG on the c-plane is always present for all operating conditions.

Figure 15:
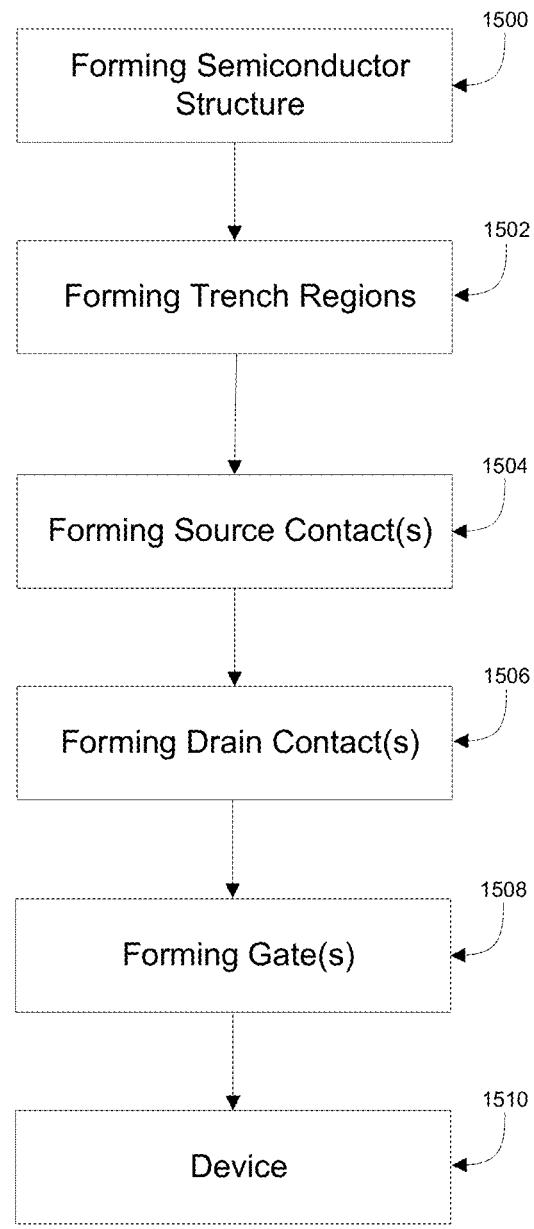

FIG. 15 is a flowchart illustrating a method of fabricating a device according to an embodiment of the invention.

Figure 16:
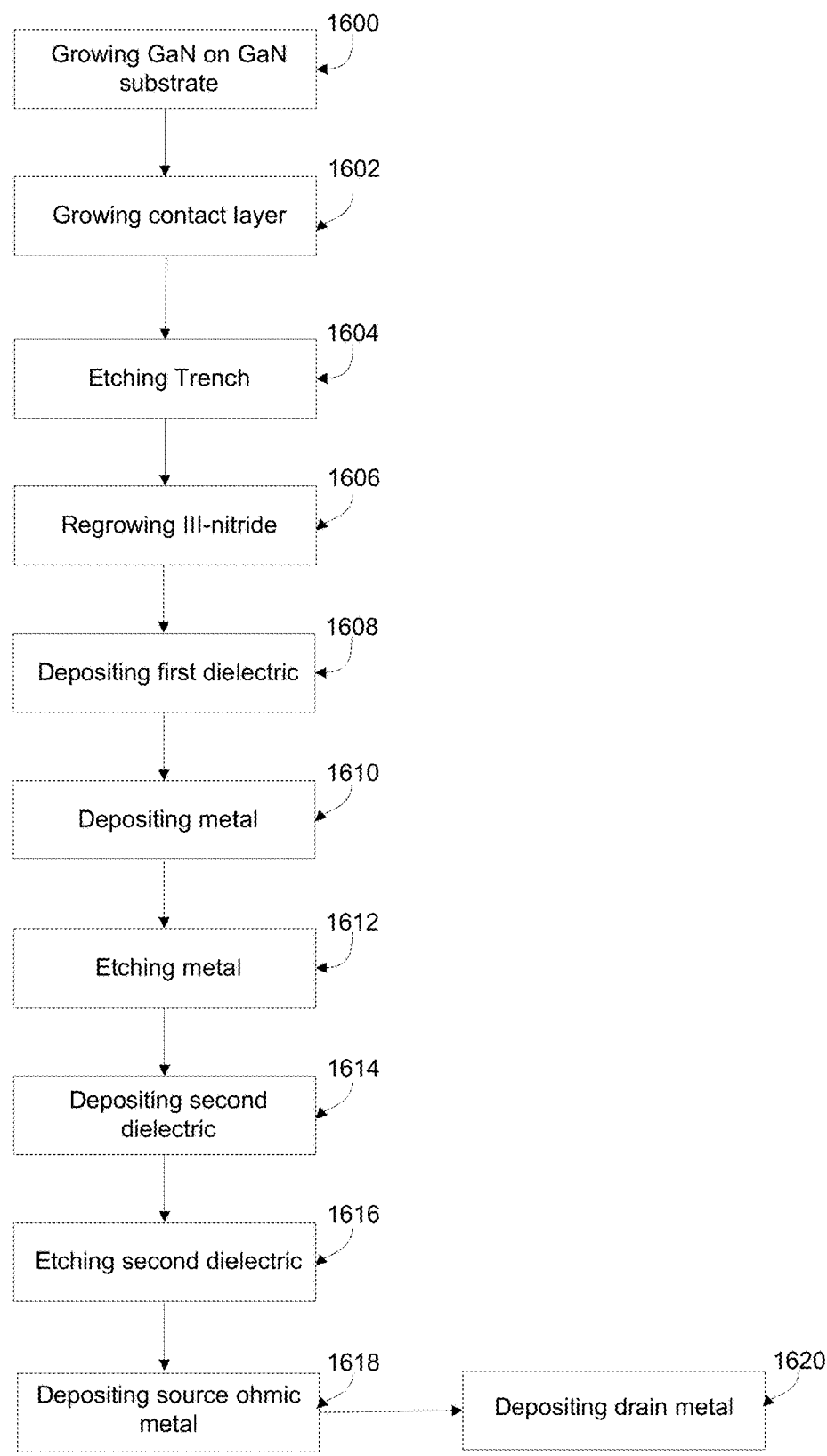

FIG. 16 is a flowchart illustrating a method of fabricating a device according to another embodiment of the invention.

Figure 17:
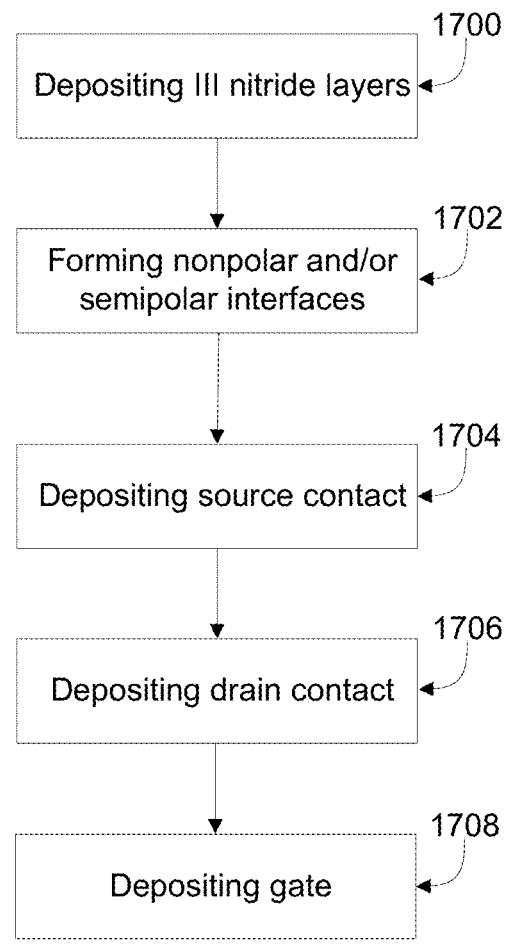

FIG. 17 is a flowchart illustrating a method of fabricating a device according to a further embodiment of the invention.

Figure 18:
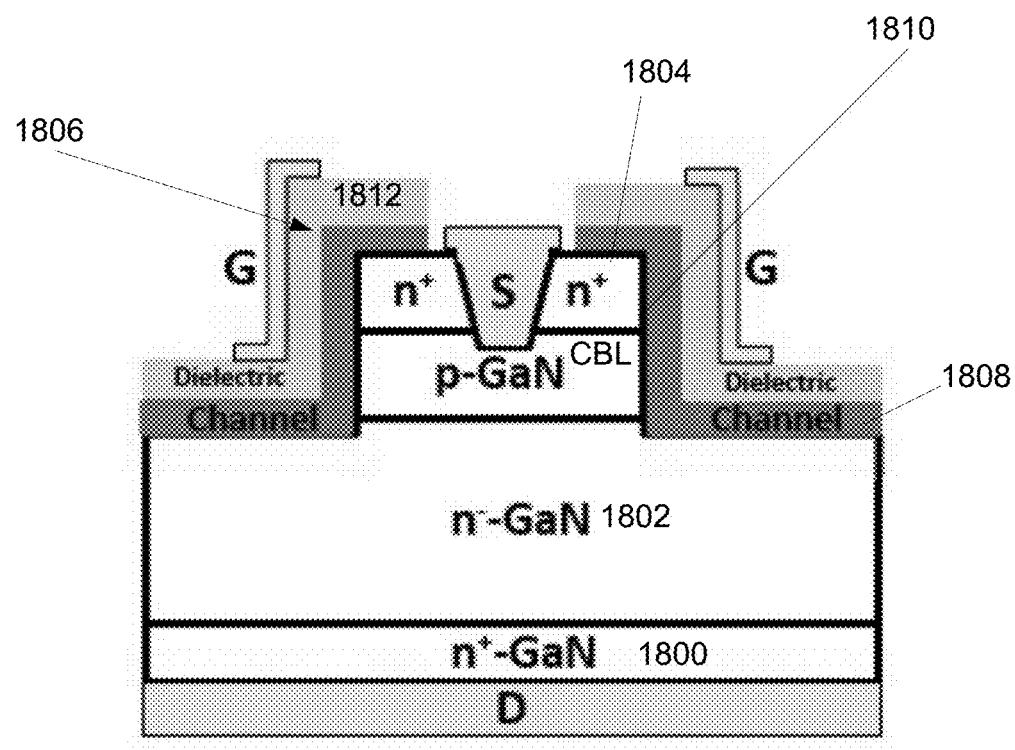

FIG. 18 is a cross-sectional schematic illustrating a device structure according to one or more embodiments of the invention.

Figure 19B:
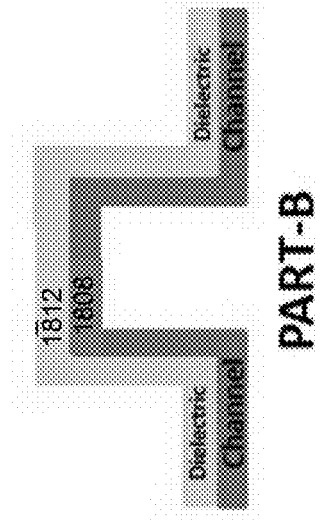
Figure 19A:
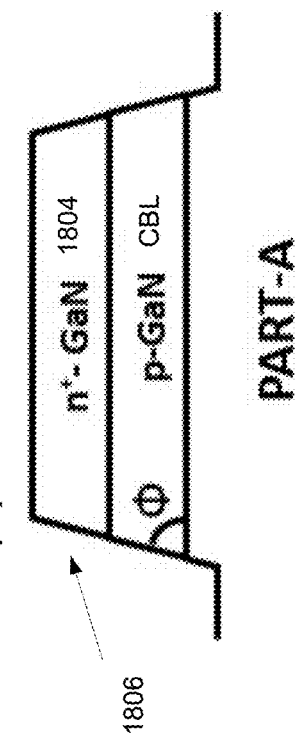
Figure 19C:
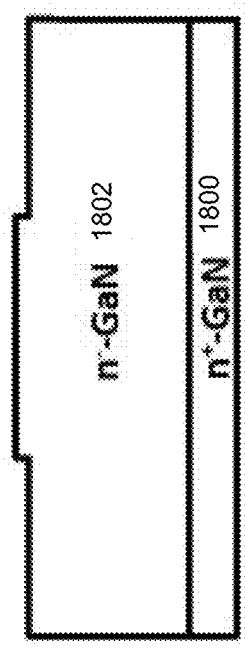

FIG. 19(a), FIG. 19(b), and FIG. 19(c) show how the device structure in FIG. 18 could be broadly divided into three regions A, B and C.

Figure 20:
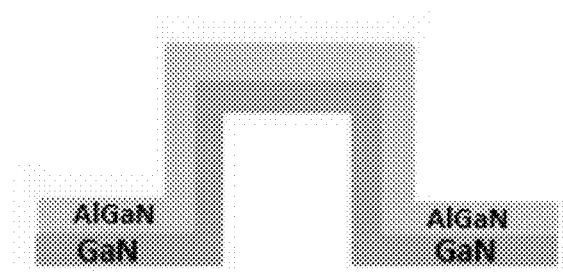

FIG. 20 illustrates how, in one or more embodiments, the channel region could be achieved by having a wide band gap material followed by a lower band gap material.

Figure 21:
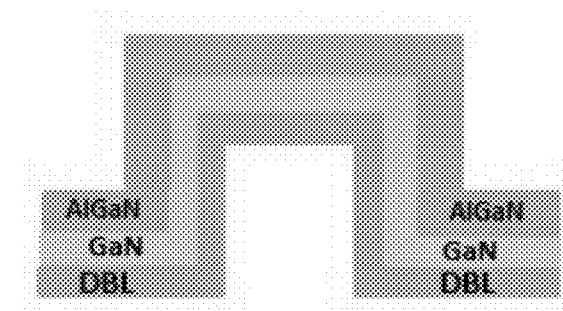

FIG. 21 illustrates how, in one or more embodiments, the channel could also contain a defect blocking layer (DBL) to arrest the diffusion of defects in the channel layers.

Figure 22:
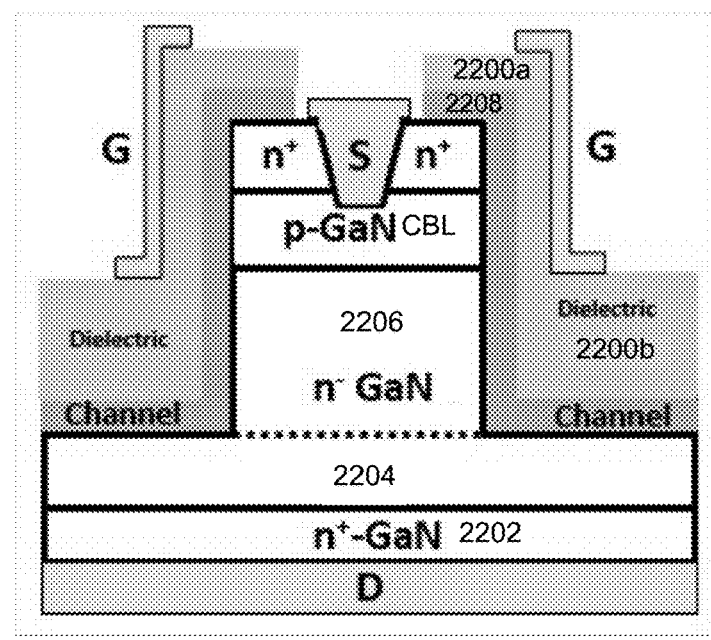

FIG. 22 illustrates the main current blocking region could be a metal-insulator combination, according to one or more embodiments.

Figure 23:
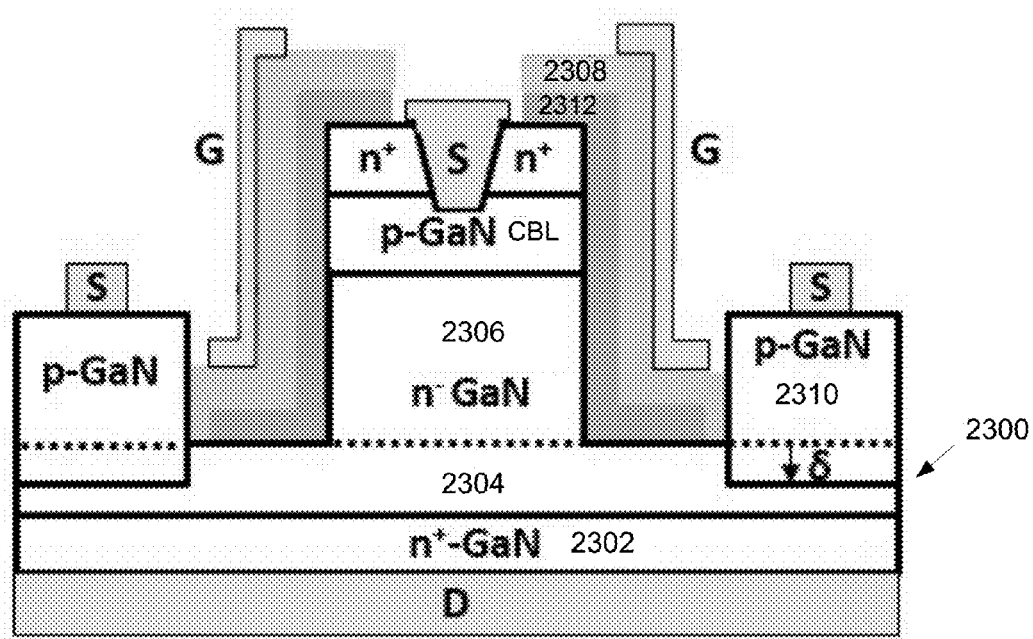

FIG. 23 illustrates regrowth of opposite conductivity type in the device could be employed to obtain high breakdown voltage of a p-n junction, according to one or more embodiments.

FIGS. 24A-24E illustrate a method of fabricating an Oxide, GaN interlayer-based vertical trench MOSEET (OG-FET) according to one or more embodiments of the present invention.

Figure 24F:
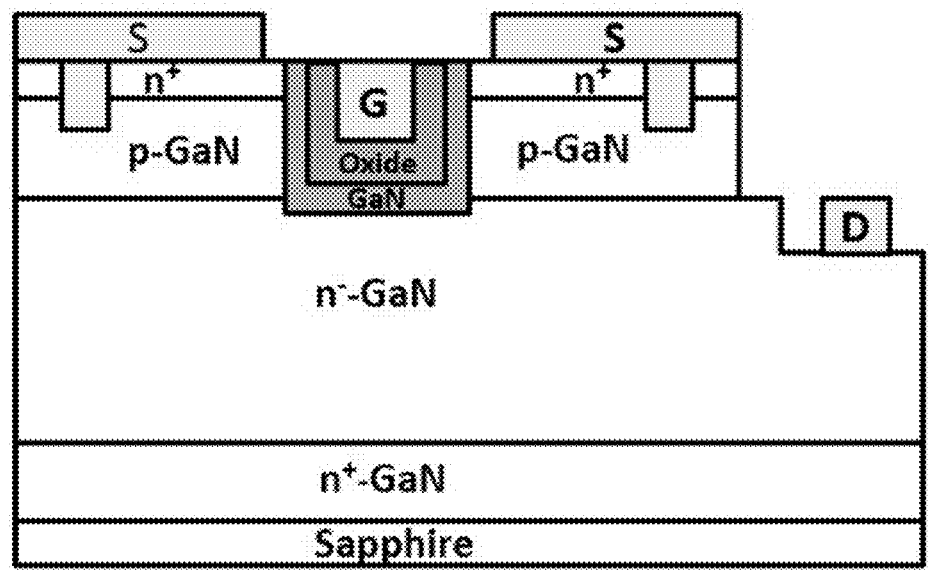

FIG. 24F illustrates a device example fabricated according to the method illustrated in FIGS. 24A-24E.

Figure 24G:
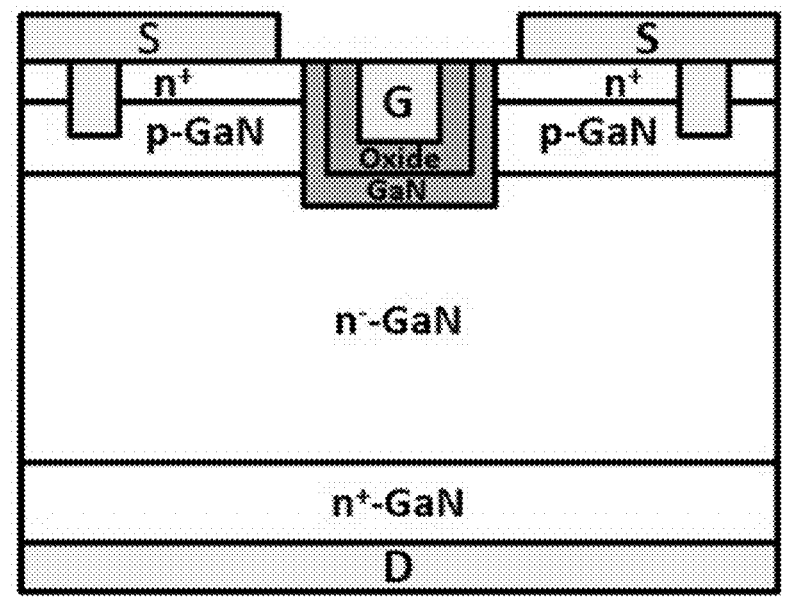

FIG. 24G illustrates another device example fabricated according to the method illustrated in FIGS. 24A-24E.

Figure 25:
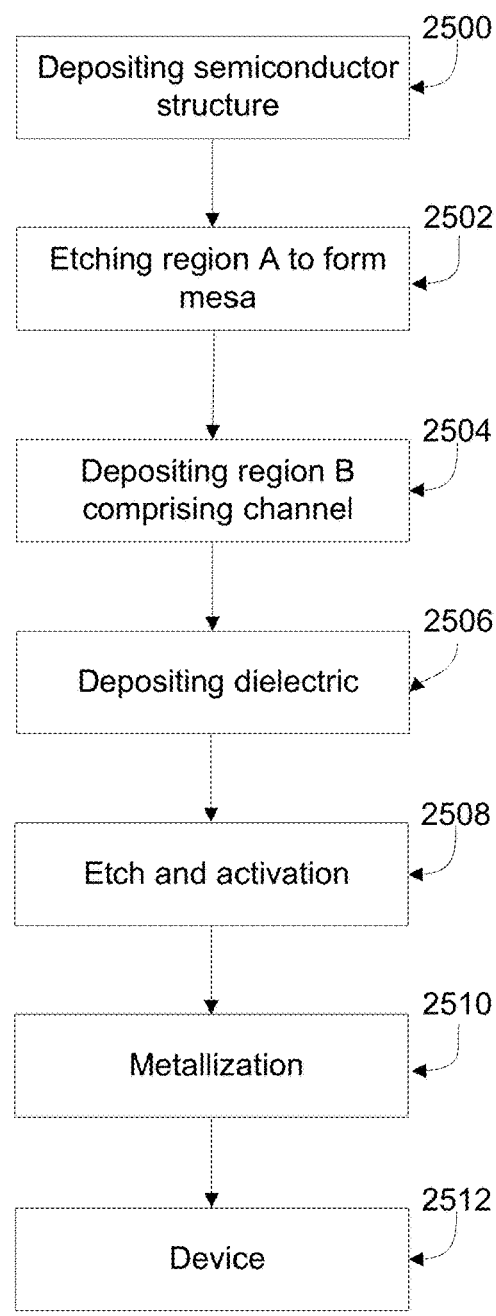

FIG. 25 is a flowchart illustrating a method of fabricating a transistor according to one or more embodiments of the present invention.

Figure 26A:
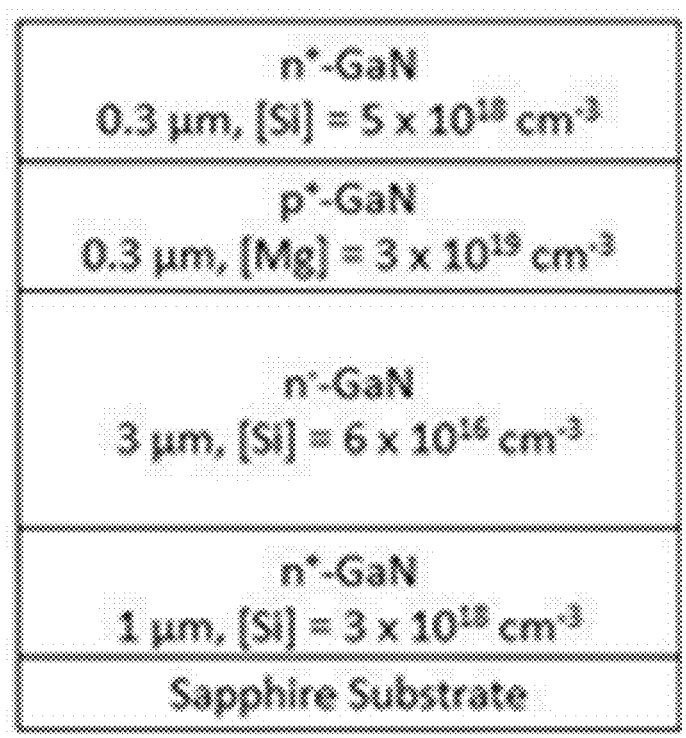

FIG. 26A is an epitaxial stack for an enhancement mode transistor according to one or more embodiments of the present invention.

Figure 26B:
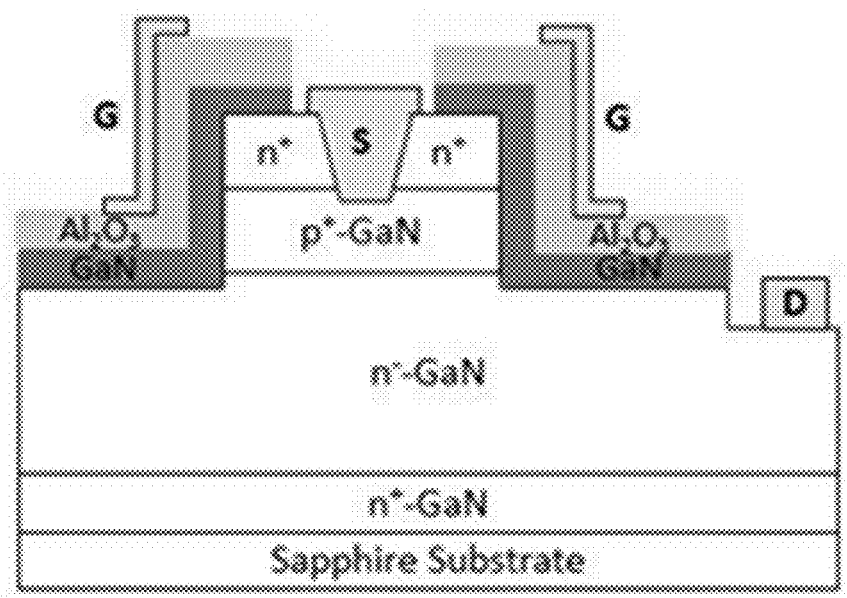
Figure 27A:
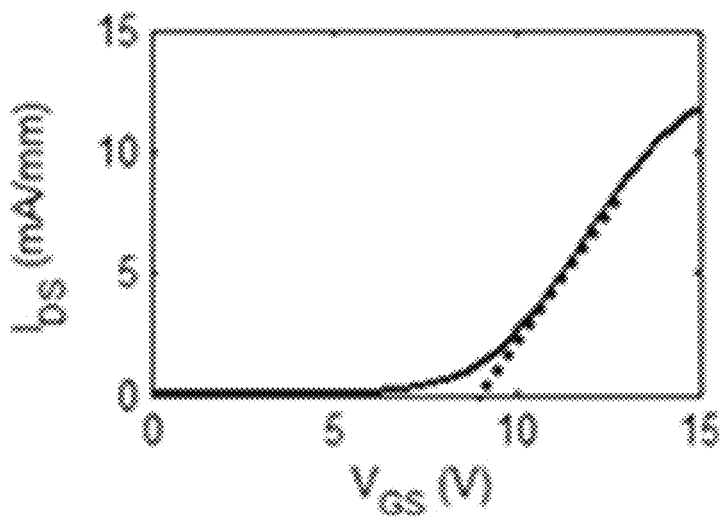
Figure 27B:
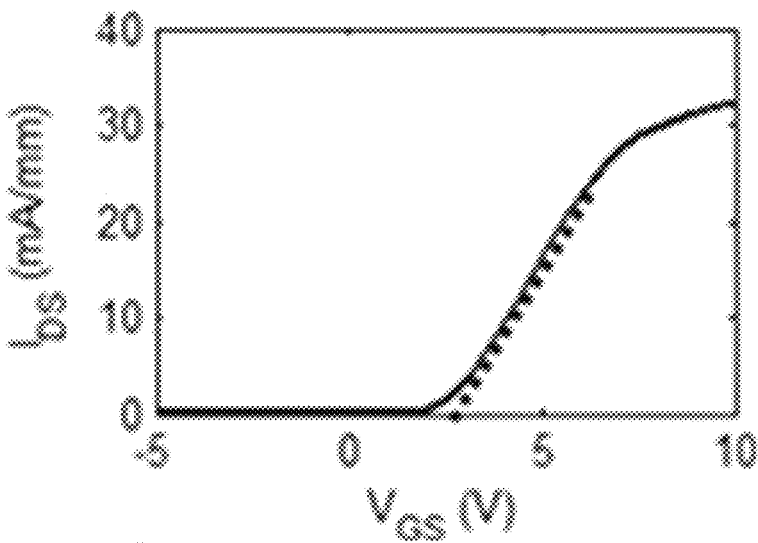
Figure 27C:
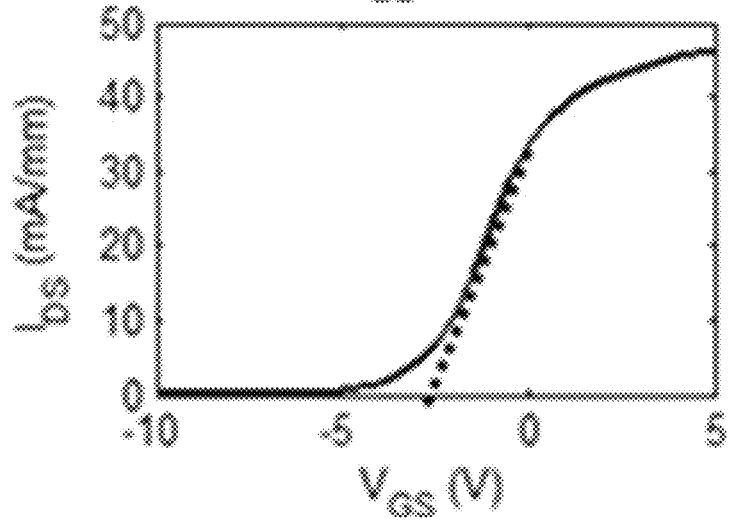

FIG. 26B is a device schematic comprising the epitaxial stack of FIG. 25, according to one or more embodiments of the present invention, FIGS. 27A-27C show transfer I-V characteristics ($I_{DS}$-$V_{GS}$) for different GaN interlayer thickness (0 nm (FIG. 27A), 10 nm (FIG. 27B) and 30 nm (FIG. 27C)) at $V_{DS}$=1V, for the device of FIG. 26B.

Figure 28A:
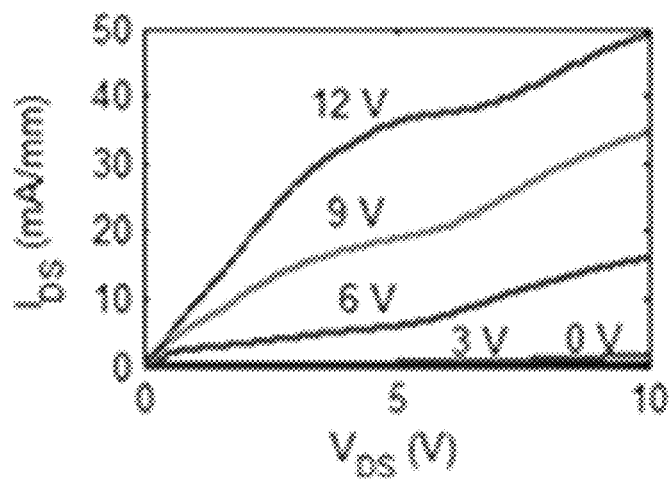
Figure 28B:
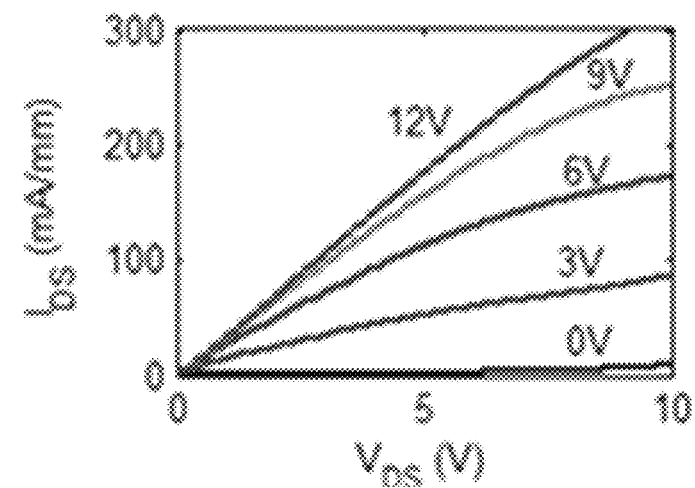
Figure 28C:
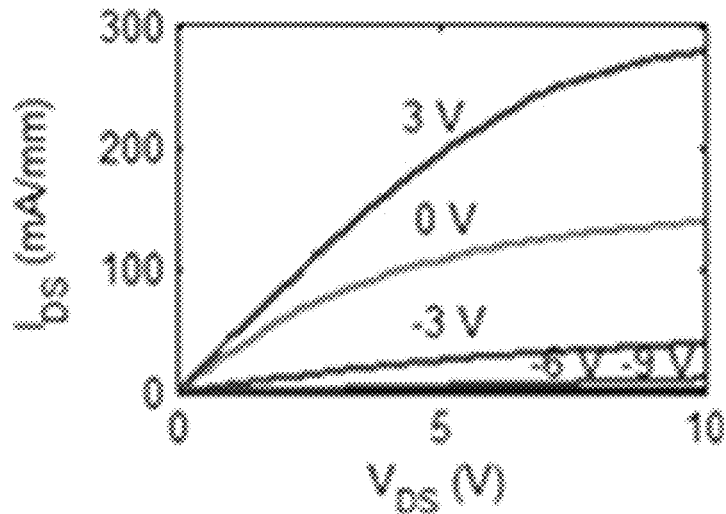

FIGS. 28A-28C show output characteristics (IDS-VDS) for different GaN interlayer thickness (0 nm (FIG. 28A), 10 nm (FIG. 28B) and 30 nm (FIG. 28C) at different gate voltages in steps of 3V, for the device of FIG. 26B.

Figure 29:
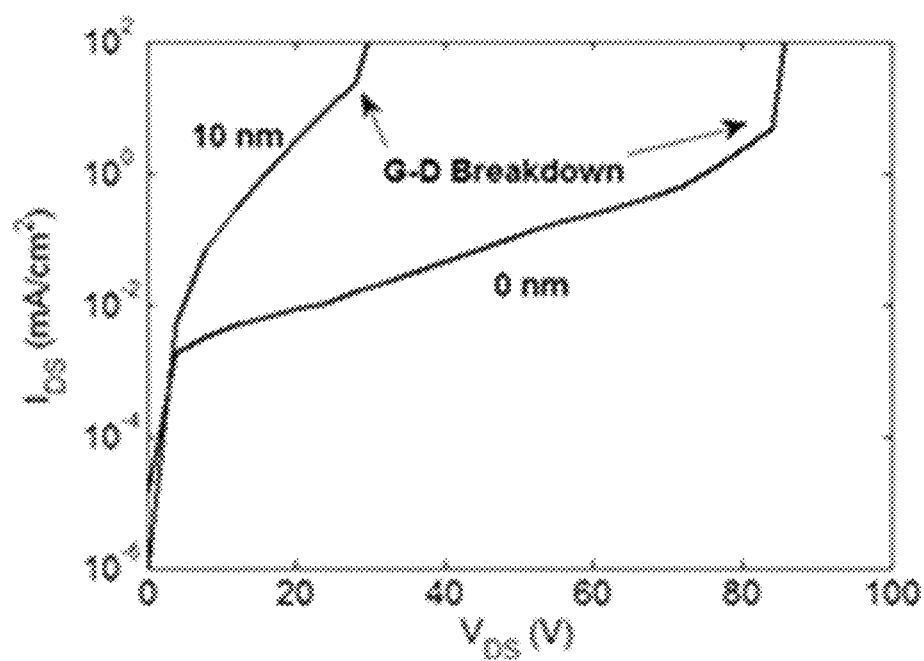

FIG. 29 shows breakdown characteristics for 0 nm and 10 nm GaN interlayer at $V_{GS}$=−5 V, for the device of FIG. 26B.

Figures 30A, 30B:
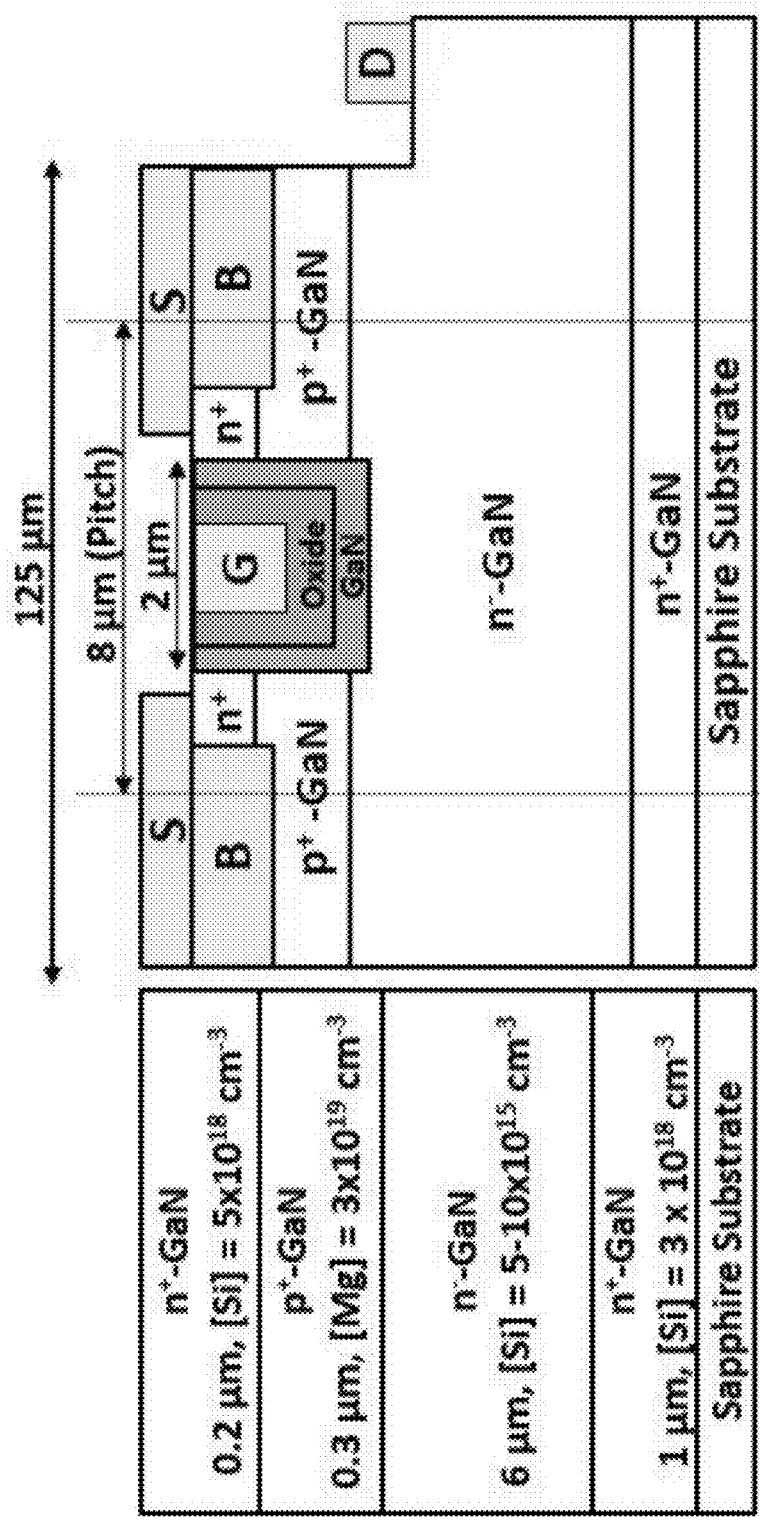

FIG. 30A shows an epitaxial stack and FIG. 30B shows a device schematic of OG-FET according to one or more embodiments of the present invention.

Figure 31A:
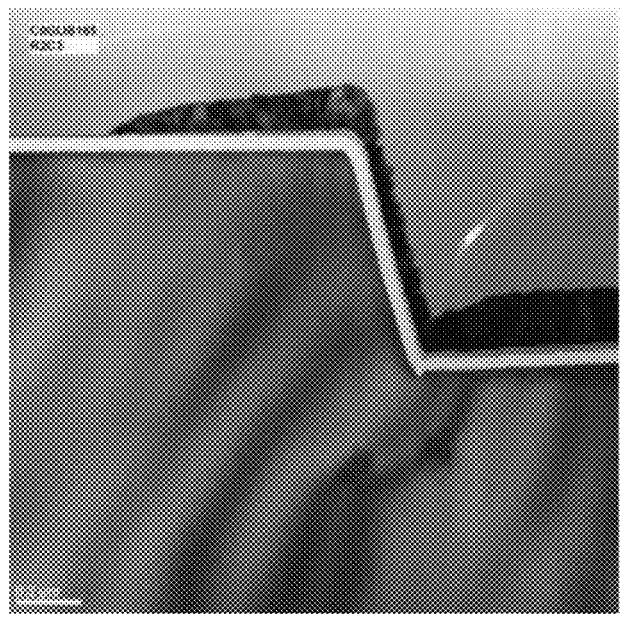
Figure 31B:
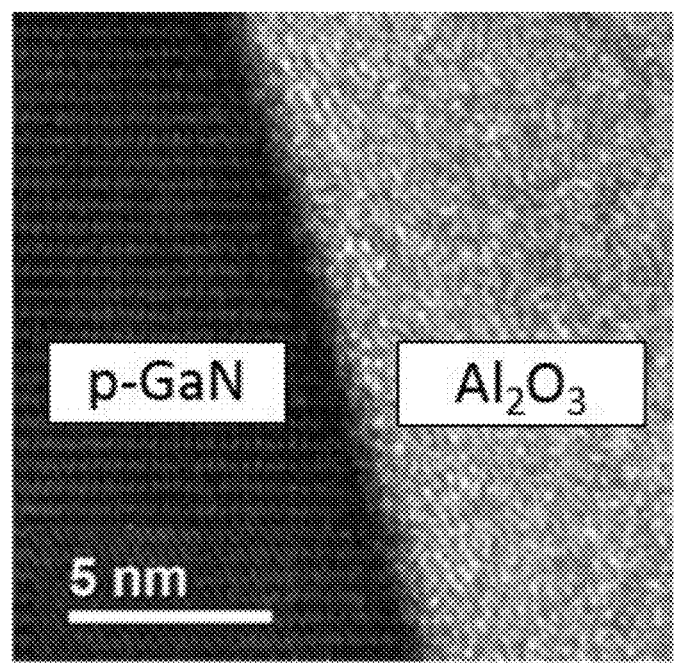
Figure 31C:
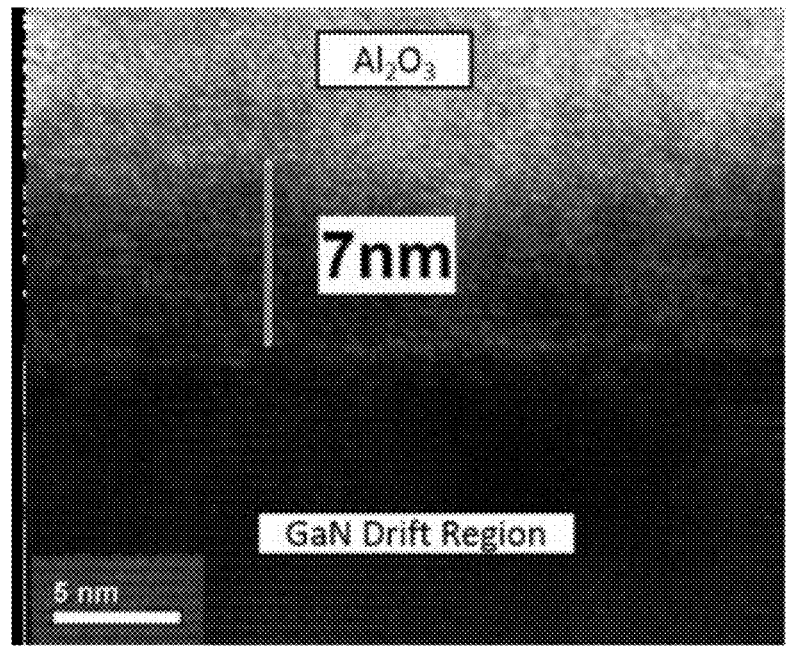
Figure 31D:
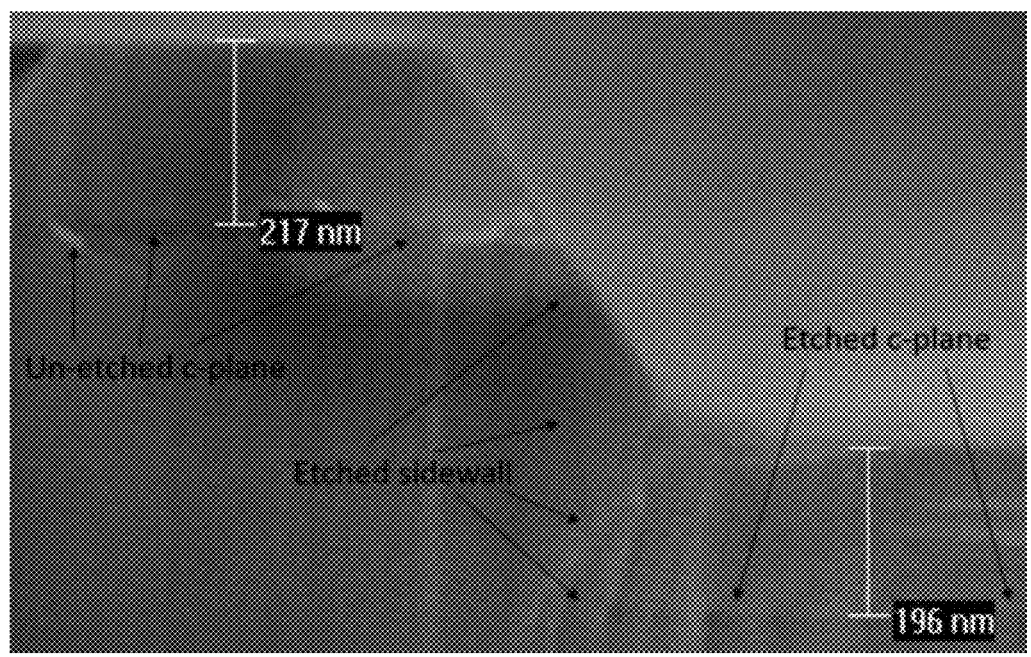

FIG. 31A-31D show cross-sectional Transmission Electron Microscope (TEM) images of the OG-FET fabricated according to FIG. 30A and FIG. 30B, wherein FIG. 31A shows the trench etch profile, the enlarged images of red boxes shown in FIG. 31A are shown in FIG. 31B and FIG. 31C, FIG. 31B shows GaN interlayer regrowth on the sidewall, FIG. 31C shows GaN interlayer regrowth on the etched c-plane, and FIG. 31D shows longer GaN regrowth (~200 nm) on etched sidewall and etched c-plane on a test sample.

Figure 32A:
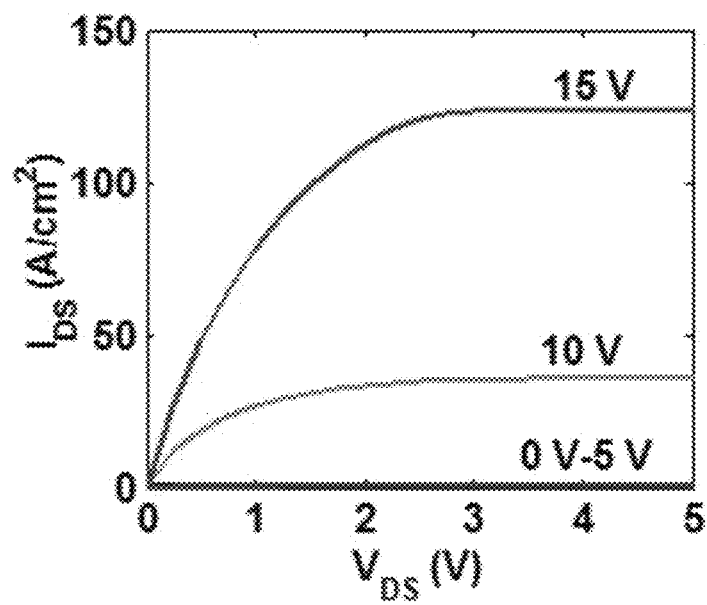
Figure 32B:
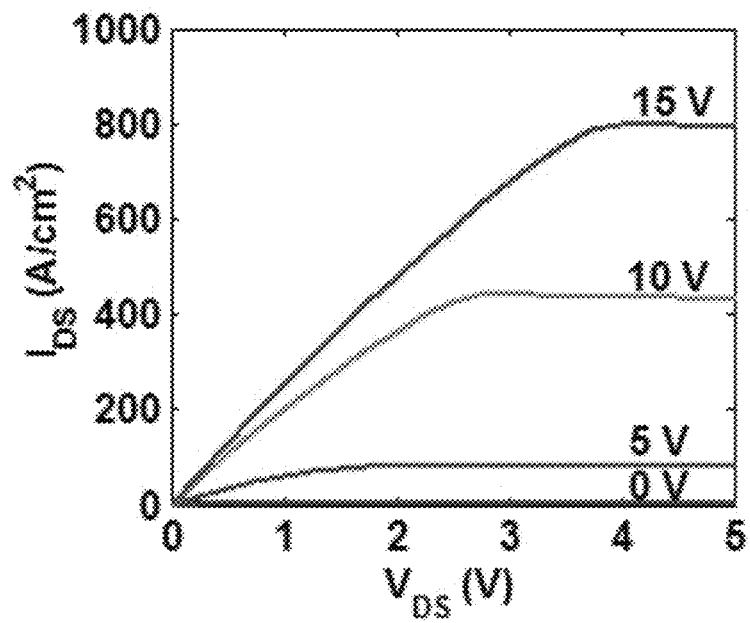

FIG. 32A and FIG. 32B show output current-voltage (I-V or IV) characteristics ($I_{DS}$-$V_{DS}$) for both samples, without GaN interlayer (FIG. 32A) and with GaN interlayer (FIG. 32B) at different gate voltages in steps of 5V (0V-15V) for the device of FIG. 30B, wherein $I_{DS}$ is drain-source current, $V_{DS}$ is drain-source voltage.

Figure 33:
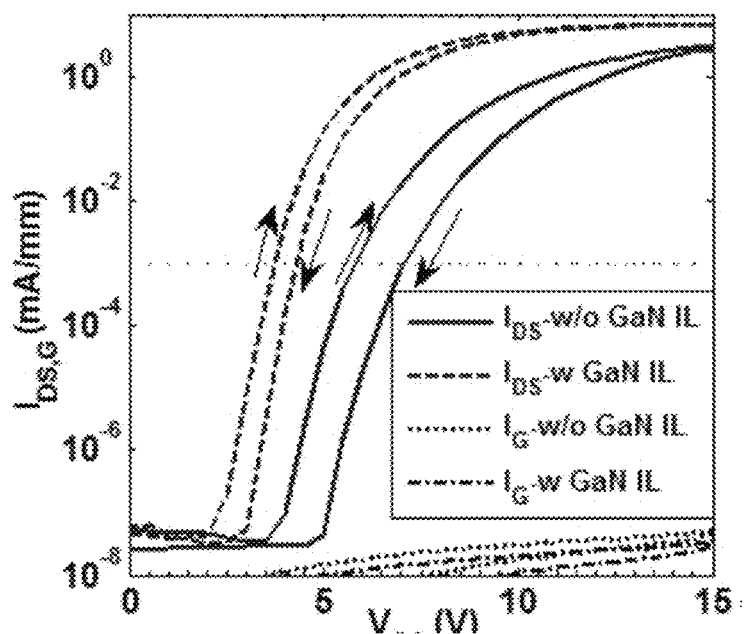

FIG. 33 shows transfer IV characteristics ($I_{DS}$-$V_{GS}$) and gate leakage ($I_G$-$V_{GS}$) characteristics for both samples, without GaN interlayer (w/o GaN IL) and with GaN interlayer (w GaN IL) at $V_{DS}$=1 V for the device of FIG. 30B, wherein $V_{GS}$ is gate-source voltage.

Figure 34:
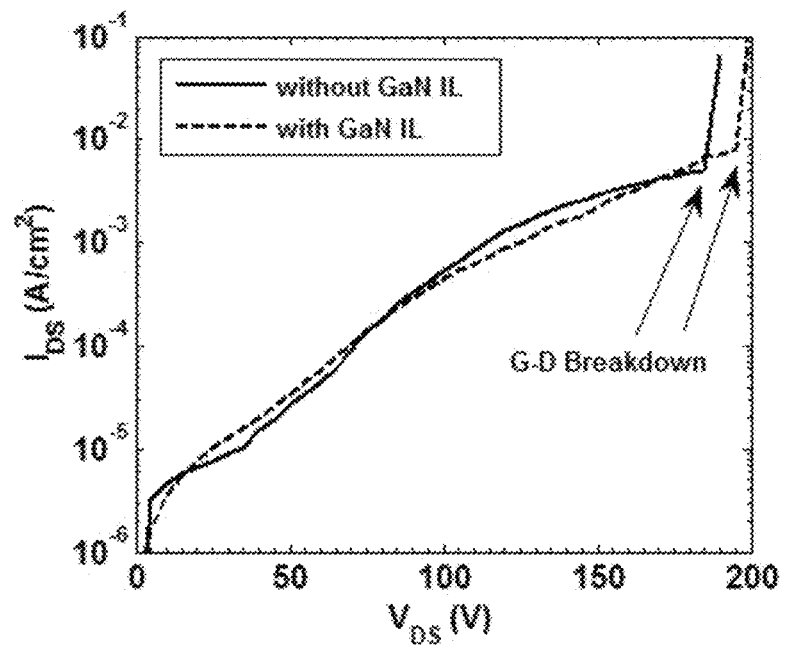

FIG. 34 shows off-state characteristics for both samples, without GaN interlayer and with GaN interlayer at VGS=0 V for the device of FIG. 30B.

FIG. 35A illustrates the output IV for the normally on device of FIG. 24F but without the GaN interlayer and FIG. 35B shows the output IV for the normally on device of 24F with the GaN interlayer (10 nm thickness).

Figure 35C:
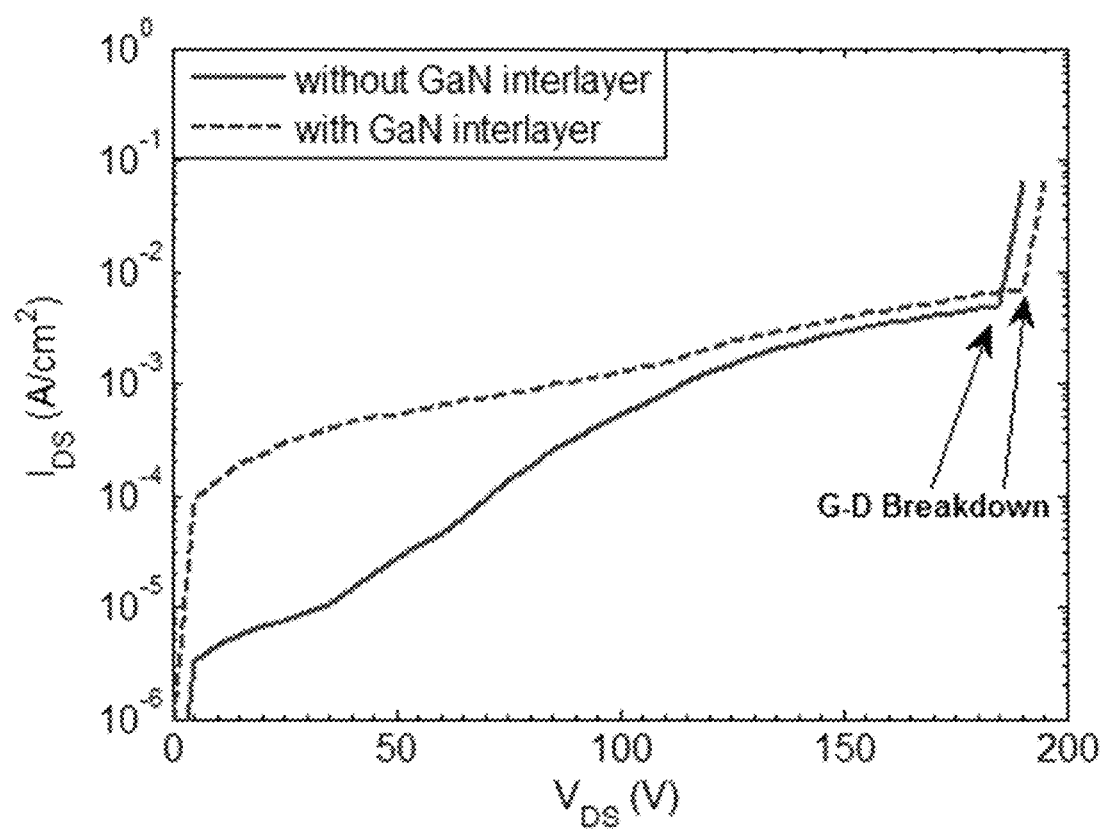

FIG. 35C shows similar breakdown voltage $V_{BR}$ for both devices with ($V_{BR}$=195 V) and without the GaN interlayer ($V_{BR}$=190 V).

Figures 36A, 36B, 36C:
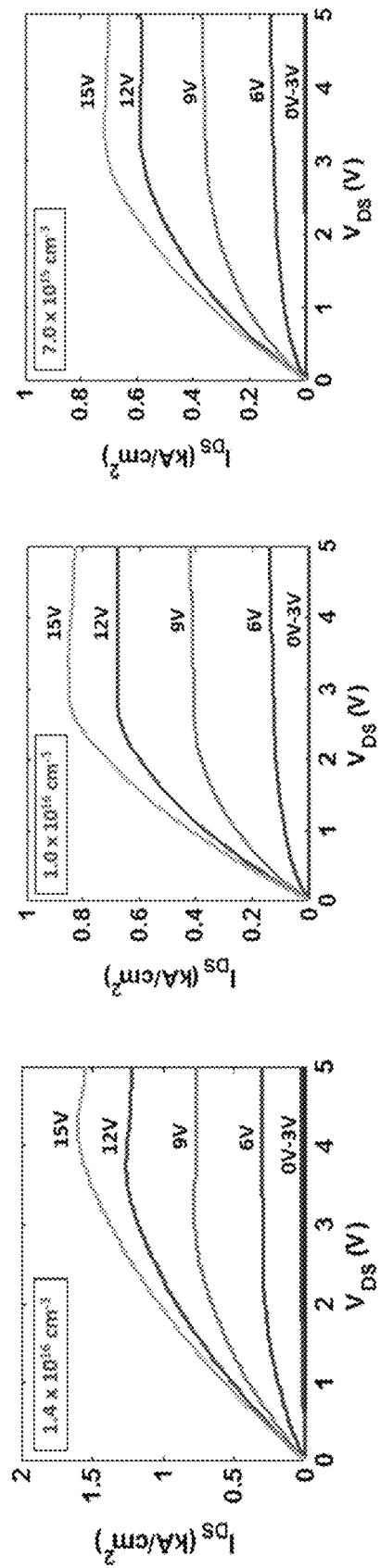

FIGS. 36A-36C illustrate the OG-FET output I-V for the drift region doping $N_D$-$N_A$=7, 10, 14×10$^{15}$ cm$^{-3}$, respectively, wherein the device is grown on a bulk GaN substrate (FIG. 24G).

Figures 37A, 37B, 37C:
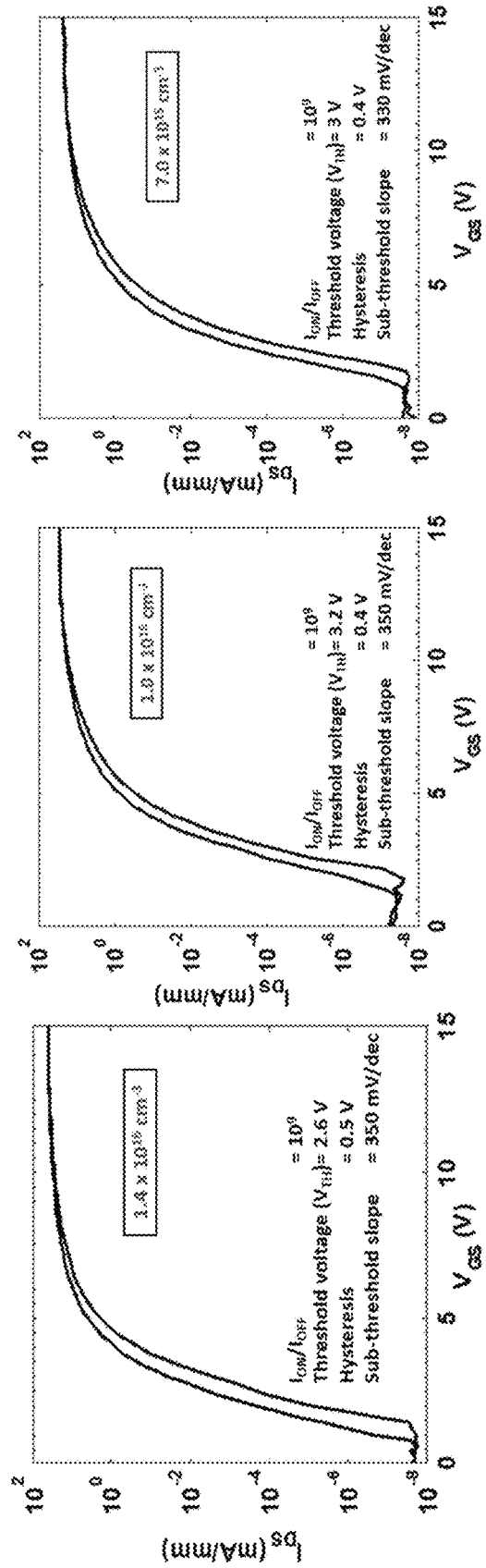

FIGS. 37A-37C illustrate transfer I-V curves for the OG-FET of FIG. 24G.

Figures 38A, 38B:
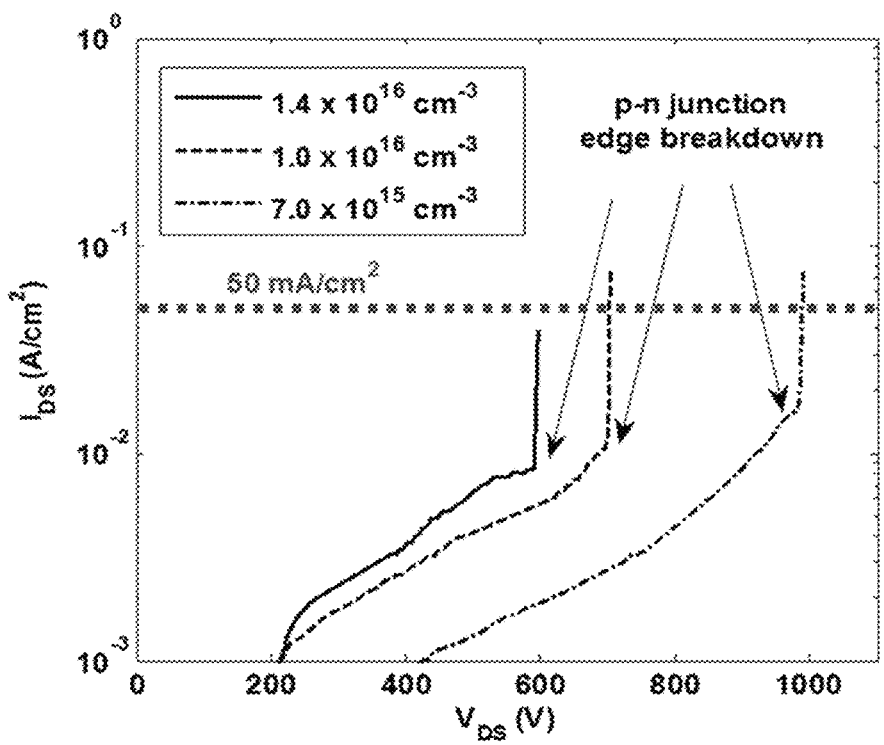

FIG. 38A and FIG. 38B illustrate the off state I-V for the device of FIG. 24G.

Figure 39:
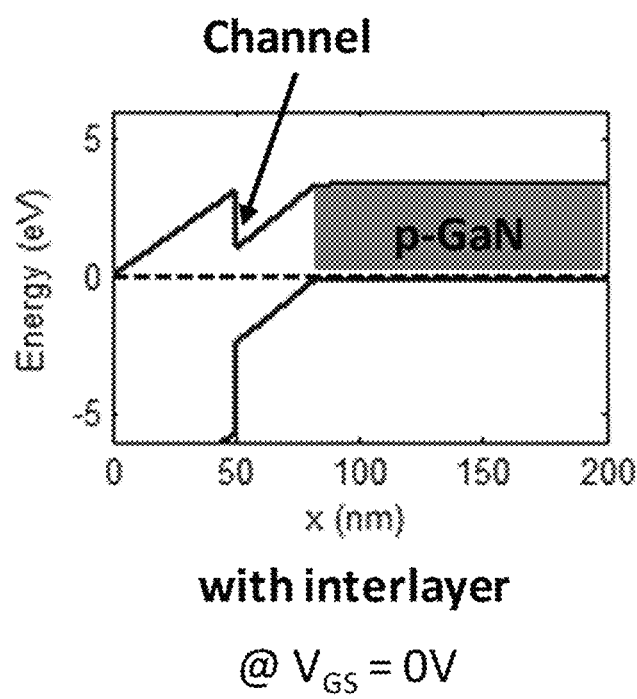

FIG. 39 shows the band diagram of a device with the interlayer, according to one or more embodiments of the invention.

Figure 40:
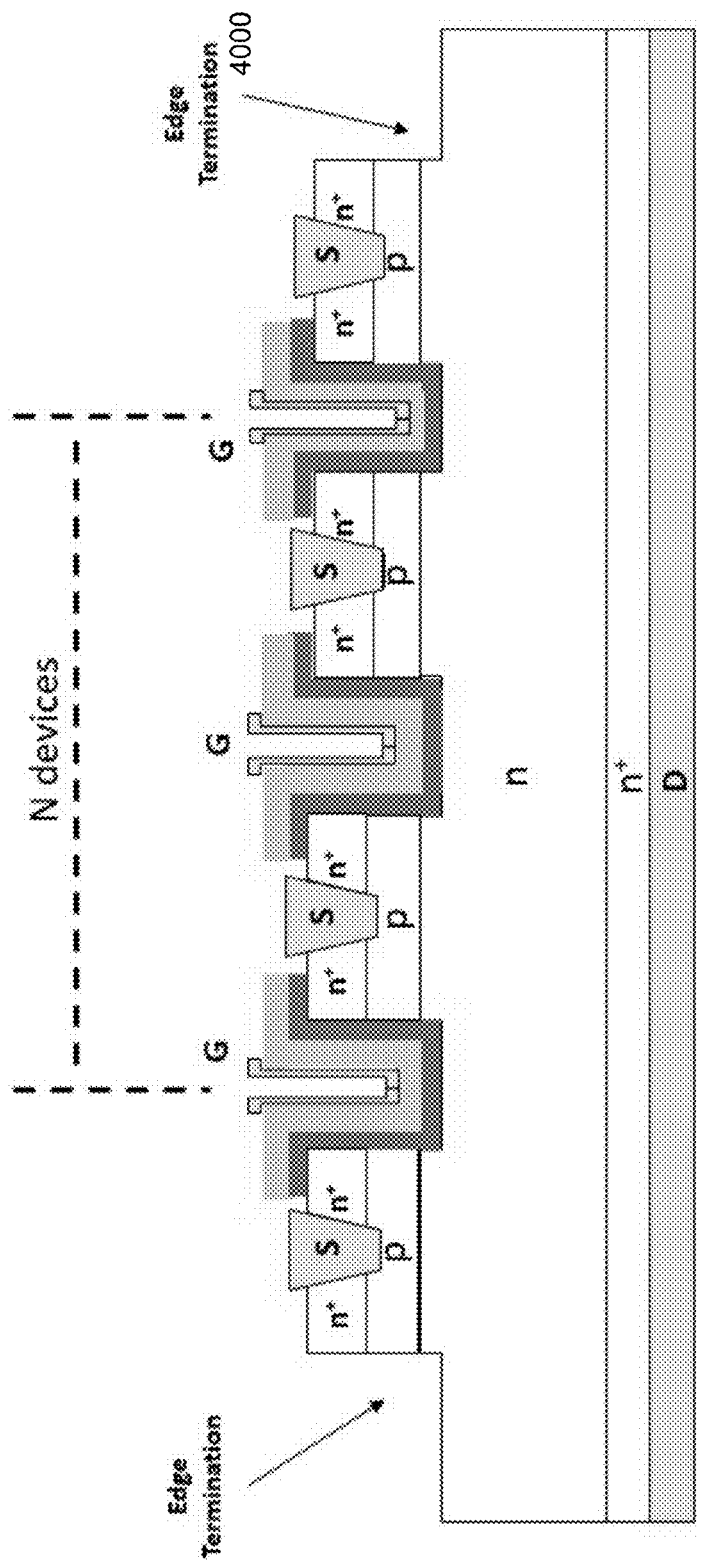
Figure 41:
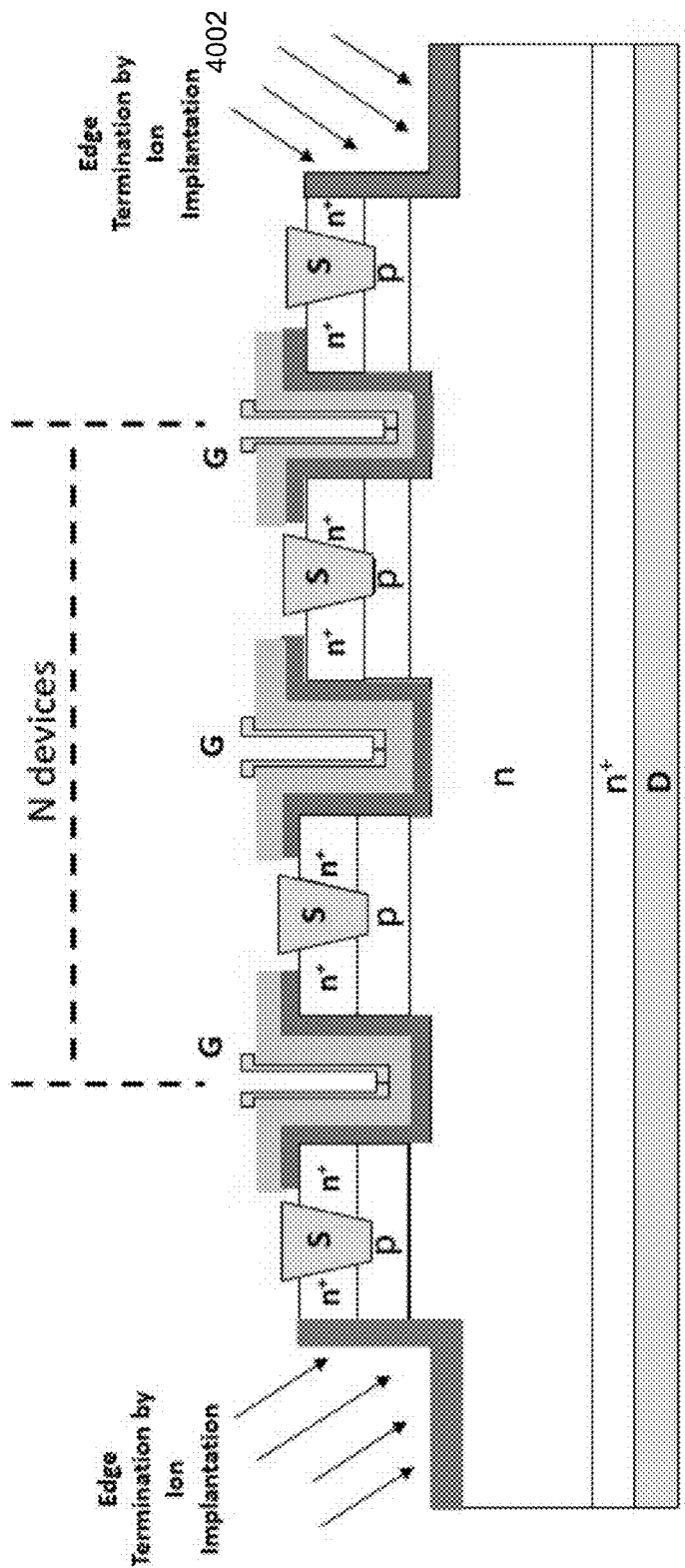
Figure 42:
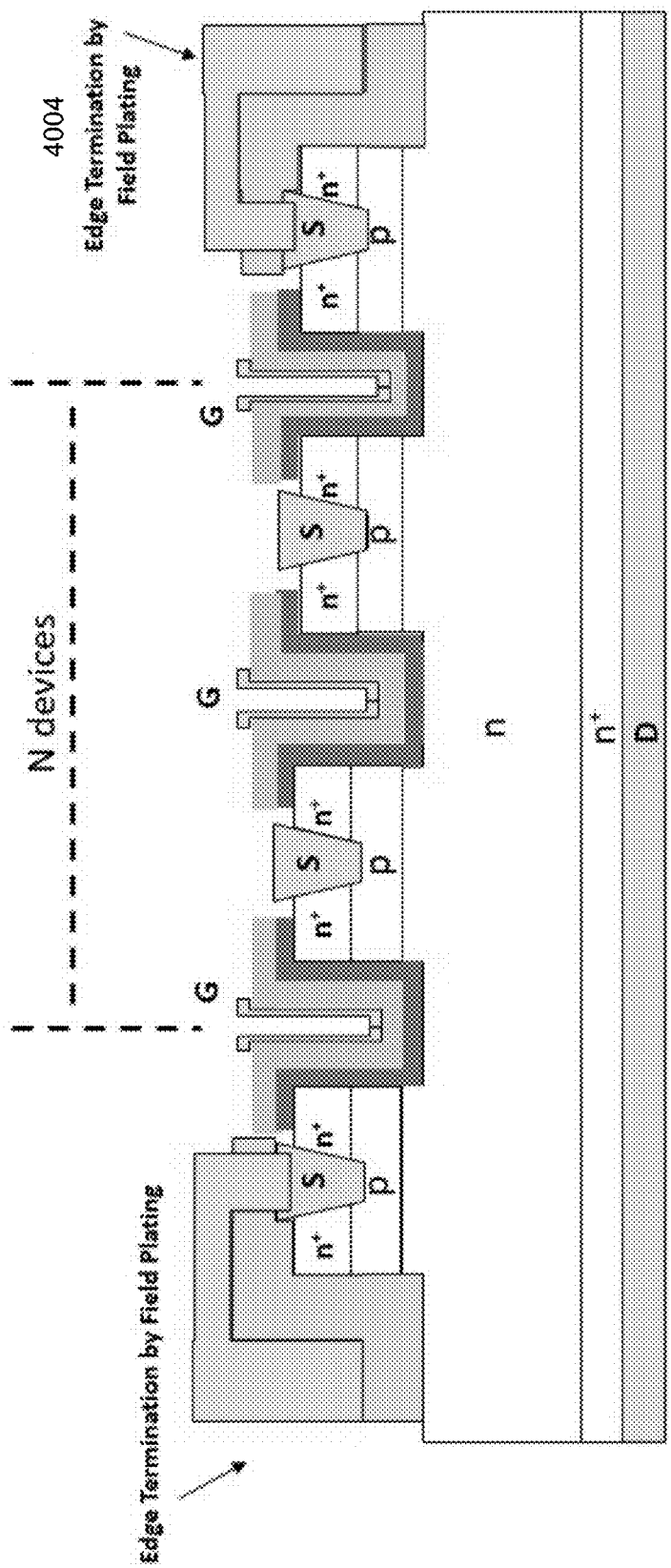

FIGS. 40-42 illustrate a plurality of the transistors forming a multi-cell device, wherein the multi-cell device has edge termination, according to one or more embodiments of the present invention.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Technical Description

I. Trenched Vertical Power Field-Effect Transistors a. Principle of Operation of One or More Embodiments One or more embodiments of present invention relate to novel vertical power low-loss semiconductor devices attainable by direct wafer-bonding, wherein the modulation of the current flow of the transistor occurs in a lateral channel, whereas the voltage is predominantly held in the vertical direction in the off-state. When the device is in the on-state, the current is channeled through an aperture in a current-blocking region after it flows under the gate region into a drift region.

Depending on its design, the current-carrying region in the drift region carries current either in a 2-dimensional or 3-dimensional manner. Implementing 2-dimensional vertical conduction along channels with high mobility will provide additional benefits such as an increase in device speed as well as a reduction in on-resistance ($R_{ON}$), thereby providing a design with benefits superior to Si-based super-junction-based field-effect transistors.

The main current-blocking region is based on, but not limited to, a metal-insulator combination. This region is fabricated by filling up the trenches with desired types and thicknesses of insulator and metal, respectively. The insulator is deposited in a manner such that it is thicker at the bottom of the trench and thinner at the sidewalls, which simultaneously provides increased breakdown voltage ($V_{BR}$) and reduced $R_{ON}$ from the device.

Under a high drain bias, the metal/insulator interface in the current-blocking region holds a sheet charge of the opposing polarity to that of the current-carrying region; thus, it fully compensates for the ionized dopant concentration in the current-carrying region. Therefore, the dimension of the insulator, as well as the doping and dimensions of the current-carrying regions, should be determined such that the electric field held in the insulator is much less than its breakdown field in the off-state. When this condition is met, the current-carrying region becomes fully depleted, thus enabling a high $V_{BR}$ of the device.

On top of the drift region, bounded in part by trenched metal-insulator-semiconductor (MIS) based regions, a laterally conductive channel material is directly wafer-bonded (i.e. strong bonds are formed between the separately grown, high-quality wafers by applying heat and pressure) to fabricate the desired device. This lateral carrier flow can also be either 2-dimensional or 3-dimensional depending on its design, but a 2-dimensional lateral conduction is preferred due to the advantages aforementioned in the description of 2-dimensional vertical conduction in the drift region and also in its ability to control the threshold voltage of the gate.

The source and gate electrodes are formed on the lateral wafer-bonded channel and the drain electrodes on the highly conductive bottom layer of the drift region, respectively. The source electrodes are also connected to the metal that fills up the MIS-based current-blocking regions.

The placement of a lateral channel on top of a template that is comprised of a current-carrying region surrounded by current-blocking regions resembles the invention of the Current Aperture Vertical Electron Transistor (CAVET) [Ref. 1]. However, it is noted that the lateral channel material, for the case of a CAVET, is regrown by heteroepitaxy on its template.

In this embodiment of the invention, which utilizes direct wafer-bonding instead of heteroepitaxy, the choice of the template material imposes no restriction on the choice of the lateral channel material. This gives an extra degree of freedom in terms of selecting the best material to be applied for each section of the structure to maximize the device performance. Successful implementations of wafer-bonding in fabricating electrically active heterojunctions have been reported previously [Ref. 2-4]. Further, the extension of deep MIS-gated regions into the drift region results in significant loss reduction.

In the event that the materials in the channel and drift region are substantially similar, then the proposed structure can be constructed without bonding the lateral channel to the vertical drift region. In this case, the deep trench can be formed after the material growth of the current carrying regions of the full device is completed.

This embodiment is enabled by the use of wafer-bonding technique, which can be performed at much lower temperatures than typical heteroepitaxy, allowing for the use of metal fillings in the trenches for the current-blocking regions. Therefore, the proposed MIS-based current-blocking regions can be implemented based on wafer-bonding and provide an enhanced $V_{BR}$—along with a superior on-state performance (e.g. low $R_{ON}$, high current) due to the 2-dimensional carrier flow—in comparison to other conventional transistors for high-power applications. The device, if electrons are chosen as the majority carrier, is termed a FABET (Fully Apertured Bonded Vertical Electron Transistor), representing that both the current and the voltage in the device are apertured.

This invention, with a potentially very high breakdown voltage, as well as a superior on-state performance, is an excellent candidate for high-power switching applications. It will become further attractive for such applications by an implementation of the enhancement-mode (i.e. normally off) gating scheme.

Figure 1:
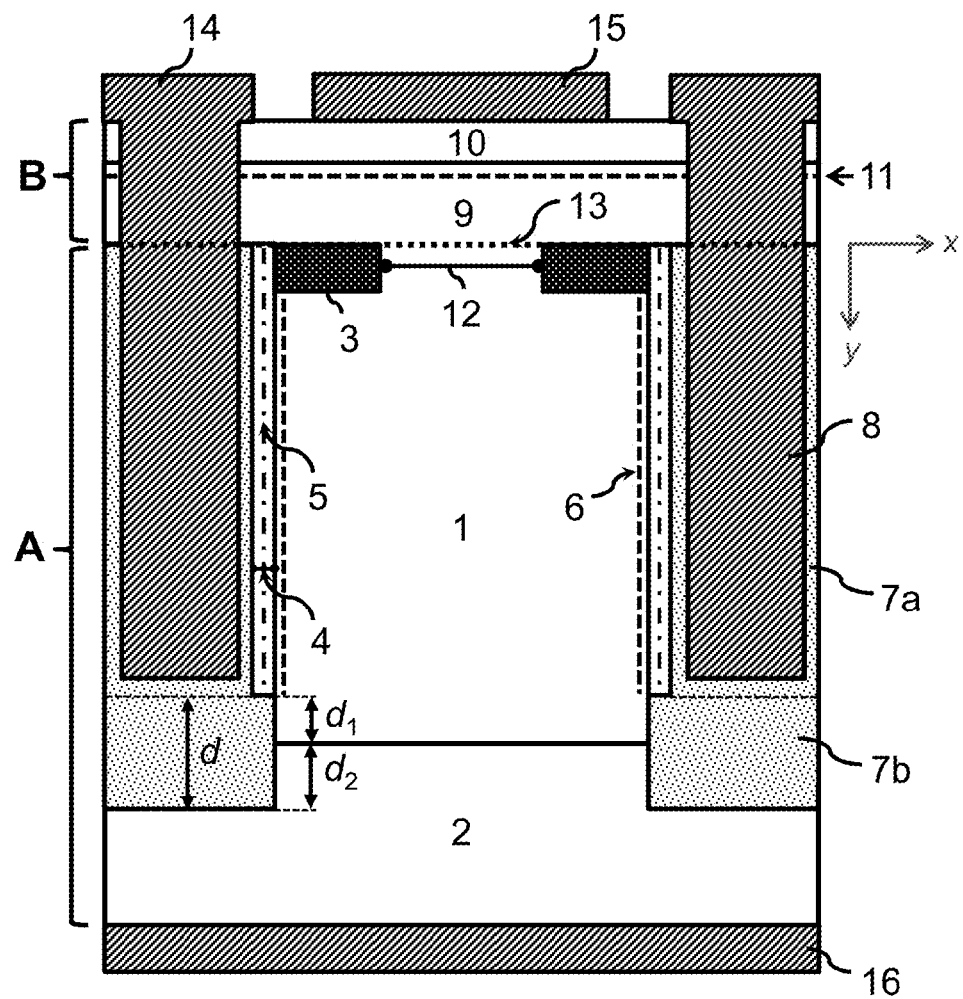
FIG. 1 is a schematic of the device structure according to one embodiment of the present invention.

Referring to FIG. 1, in the on-state, the carriers originating from the source electrodes 14, flow through the lateral channel as a 2-dimensional flow 11 with a very low resistance. They are modulated at the overlap regions between the gate electrodes 15 and the current-blocking regions 3. Because of the electric field set up by the drain electrode 16 at the bottom of the device, the carriers are swept vertically through the aperture 12 by turning the corners of the current-blocking regions 3. Then, they flow through the current-carrying region 1 as a substantially 2-dimensional flow 6, again with an extremely low resistance, and reach the drain electrode 16 at the bottom. The sheet charge at the interface of insulator-metal 7a-8 that fills up the trenches for forming the current-blocking regions 3 should appropriately compensate for the ionized dopants in the (relatively lowly doped or unintentionally doped) current-carrying region 1 without breaking down the insulator. Also, the thick insulator 7b at the bottom of the trench should be designed such that it supports the voltage in the off-state per device specifications. Therefore, a very low $R_{ON}$ (due to both the lateral and vertical 2-dimensional conduction with high mobility), as well as a very high breakdown voltage (due to the MIS-based current-blocking regions along with the use of a high breakdown material in the drift region), can be achieved in this device.

b. Device Structure According to One or More Embodiments

The device structure can be divided into two portions: the drift region A and the lateral channel B, as shown in FIG. 1, the two of which are wafer-bonded to one another in this embodiment. If the materials in region A and B can be grown epitaxially, then that interface need not be bonded.

(i) Drift Region A

The template possesses similar features to that of typical superjunction power devices, with alternating current-carrying and current-blocking regions that extend toward the bottom conductive layer 2, which is connected to the drain electrode 16. Hence, a template grown on a conductive substrate is preferred, but it is also possible to place the drain electrode 16 laterally away from the bottom of the current-carrying region when using an insulating substrate or remove the substrate, whether it is conducting or insulating (examples include sapphire, ZnO, GaN, $Ga_2O_3$, SiC, Si, etc.). FIG. 1 depicts a device fabricated on a conductive substrate.

For applications related to high-power operations, the best choice for the drift region would be a semiconductor material with a high breakdown electric field. An example is an III-N material, although this structure can also be implemented in conventional elemental and compound semiconductors.

The current-carrying region 1 can be doped either n- or p-type: (1) uniform doping; (2) abruptly changed doping; or (3) graded doping. The doping can be intentional or unintentional; it is not necessary to intentionally dope the region 1. It is noted that the electron concentration is designed to ensure depletion in all of the relevant regions and to obtain a lower peak electric field under the device off-state while maintaining a low on-resistance in the on-state. On the other hand, variations in doping concentration throughout the current-carrying region as a function of both x and y as identified in FIG. 1) can be accommodated for enhanced conductivity and/or adjusting the electric field distribution in the device structure.

An important feature of this invention is the accommodation of a 2-dimensional carrier flow 6 in its vertical direction. One way to achieve this is by a modulation doping 5 in the barrier material 4, which is regrown after the formation of trenches in the drift regions and will become a part of the MIS-based current-blocking regions. Also, a use of semiconductor material that is polar in the horizontal direction (i.e. the x direction in FIG. 1) can be utilized such that the 2-dimensional carrier gas 6 is formed without substantial doping, but instead by polarization-induced charges. The existence of 2-dimensional carriers 6 is very beneficial to reducing $R_{ON}$, and it allows for even lower doping levels in the current-carrying region 1 without compromising $R_{ON}$, thus resulting in an even higher $V_{BR}$ of the device.

Another important feature of this invention is the design of the current-blocking region that is comprised of an insulator-metal 7a,b-8 combination, which is placed adjacent to the aforementioned barrier material 4 that induces 2-dimensional carriers 6. The sidewall insulator 7a blocks potential leakage between the metal 8 and the current-carrying region 1 and, under bias, supports the desired voltage per device specifications. Therefore, both the thickness of the insulator 7a as well as the doping and dimensions of the current-carrying region 1 should be designed such that the insulator can easily support the voltage required to completely deplete the region 1.

Further, as depicted in FIG. 1, the insulator 7b is much thicker toward the bottom of the trenches than the sidewall insulator 7a, and this plays a critical role in significantly enhancing the $V_{BR}$ of the device. Insulators 7a and 7b may be the same insulator or different insulators. It is important to determine the thickness d of insulator 7b such that the electric field held across the insulator in the off-state is not greater than the breakdown field of the insulator itself.

The trenched current-blocking layer extends down toward the highly conductive bottom layer 2, which represents either the conductive substrate or a highly doped layer grown on the substrate. The depth of the current-blocking region (i.e. depth of trench) can be shallower, identical, or deeper compared to the position of the interface between the regions 1 and 2. FIG. 1 depicts a case of the current-blocking region that extends deeper into the highly conductive layer 2. The dimensions $d_1$ and $d_2$ should be appropriately adjusted such that the imposed tradeoff between the offered benefits in low $R_{ON}$ and high $V_{BR}$ is optimized.

Another type of current-blocking region 3, which defines the aperture 12, can be accommodated as desired. When it is incorporated as shown in FIG. 1, the current flowing in the lateral channel B would be modulated where the current-blocking region 3 and the gate metal 15 overlap. Its current-blocking (i.e. insulating) property can be obtained by (1) ion implantation, (2) employment of a material with an opposite doping type compared to the current-carrying region 1, or (3) insertion of a material that provides a high barrier height to the channel carrier type (e.g. insulator, semiconductor with a much higher bandgap, air-gap, etc.). Its location, as well as dimensions, can be optimized in a manner that it allows for a smooth transition of the lateral carrier flow 11 to the vertical flow 6 near the aperture 12.

(ii) Lateral Channel B

The channel 9 preferably is comprised of a 2-dimensional carrier flow 11, which ensures higher mobility of the carriers. The 2-dimensional carrier in the channel can be realized either by accommodating a modulation doping in the barrier material 10 or by polarization engineering if a polar semiconductor such as III-N is implemented. The interface 13 identifies the borderline between the drift region A and the lateral channel B, and may be an epitaxial or wafer-bonded interface. The best choice for the lateral channel material would be a semiconductor material that offers high mobility for the majority carrier to enhance the device speed and on-state performance, including $R_{ON}$, without presenting a barrier to carrier transfer across the water-bonded interface 13.

The source electrodes 14 are designed such that, in one embodiment, they contact the carriers in the lateral channel as well as the metal 8 that fills up the MIS-based current-blocking regions. Moreover, optional source and/or gate-connected field plates can be placed over the gate metal 15 after depositing the passivating insulator layer to further enhance the breakdown voltage.

The geometry of the gate electrode 15 can be varied. For instance, it can be defined by a uniform metallization (as shown in FIG. 1) or by a split-design metallization, where the flow of current from either source is modulated by physically separated gates (which may be electrically connected).

The transistor shown in FIG. 1 depicts a depletion-mode (i.e. normally on) device. However, its gate design can be altered such that it operates as an enhancement-mode (i.e. normally off) device by employing a fluorine-based treatment underneath the gate electrodes, recessed gate region, or doping of the gate barrier material with an opposite dopant type from the channel (e.g. p-type gate barrier for n-channel), etc.

Thus, FIG. 1 illustrates a semiconductor device, comprising a vertical device that is comprised of a lateral channel B bonded to a drift region A; wherein modulation of a current from a source 14 to a drain 16 occurs in the lateral channel B; voltage is predominantly held in a vertical direction in an off-state; and the current is channeled through an aperture 12 in a current-blocking region after it flows under a gate region 15 into the drift region A in an on-state. FIG. 1 further illustrates the source and gate can be formed on the lateral channel B and the drain 16 can be formed on the drift region A. FIG. 1 further illustrates the current-blocking region can be comprised of trenches filled with insulator 7a-b and metal 8, wherein the insulator 7b is thicker at a bottom of the trench and the insulator 7a is thinner at sidewalls of the trenches.

c. Possible Modifications and Variations

Figure 2:
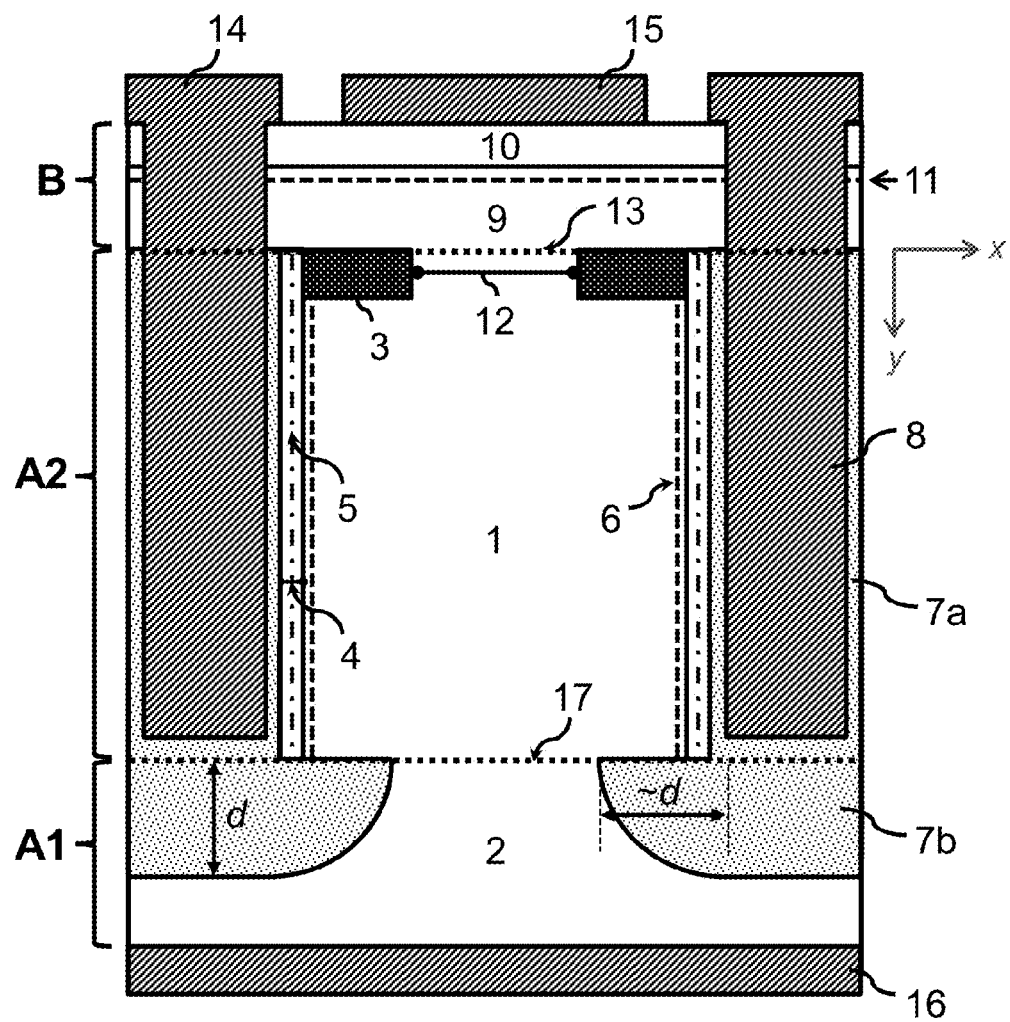
FIG. 2 is a schematic of a first modified design of the device structure.

FIG. 2 depicts a modified design of the MIS-based vertical power transistor. The drift region A1 is prepared by firstly etching off parts of the highly conductive layer 2 to form the voltage-holding regions, which are subsequently filled with dielectric 7b. After a planarization (if needed), the drift region A2 is either wafer-bonded to or regrown on the drift region A1. The interface 17 identifies the borderline between the two regions. As a result, the dielectric 7b (with a predetermined optimal thickness d) is placed fully within the highly conductive layer 2. The remaining device regions A2 and B are identical to the regions A and B of the device structure shown in FIG. 1.

This invention also discloses the addition of spacers (e.g. rounded spacers with a radius of ~d in the case of FIG. 2) to further enhance the breakdown voltage of the device. This is to address the device breakdown path in the off-state between the metal filling 8 and the highly conductive region 2. The shape and dimensions of these spacers is based on device specifications, but are intended to minimize peaking of deleterious electric fields in the structure, which can reduce breakdown.

To suppress the potential increase in resistance near the interface between the dielectric 7b and the current-carrying region 1 at the interface 17, a highly doped but thin (thus it has negligible impact to the device $V_{BR}$) interlayer can be accommodated at the bottom of the drift region A2. In doing so, the design space for trade-off between $R_{ON}$ and $V_{BR}$ potentially present in the device depicted in FIG. 1 (which is determined by $d_1$ and $d_2$) is expanded.

Figure 3:
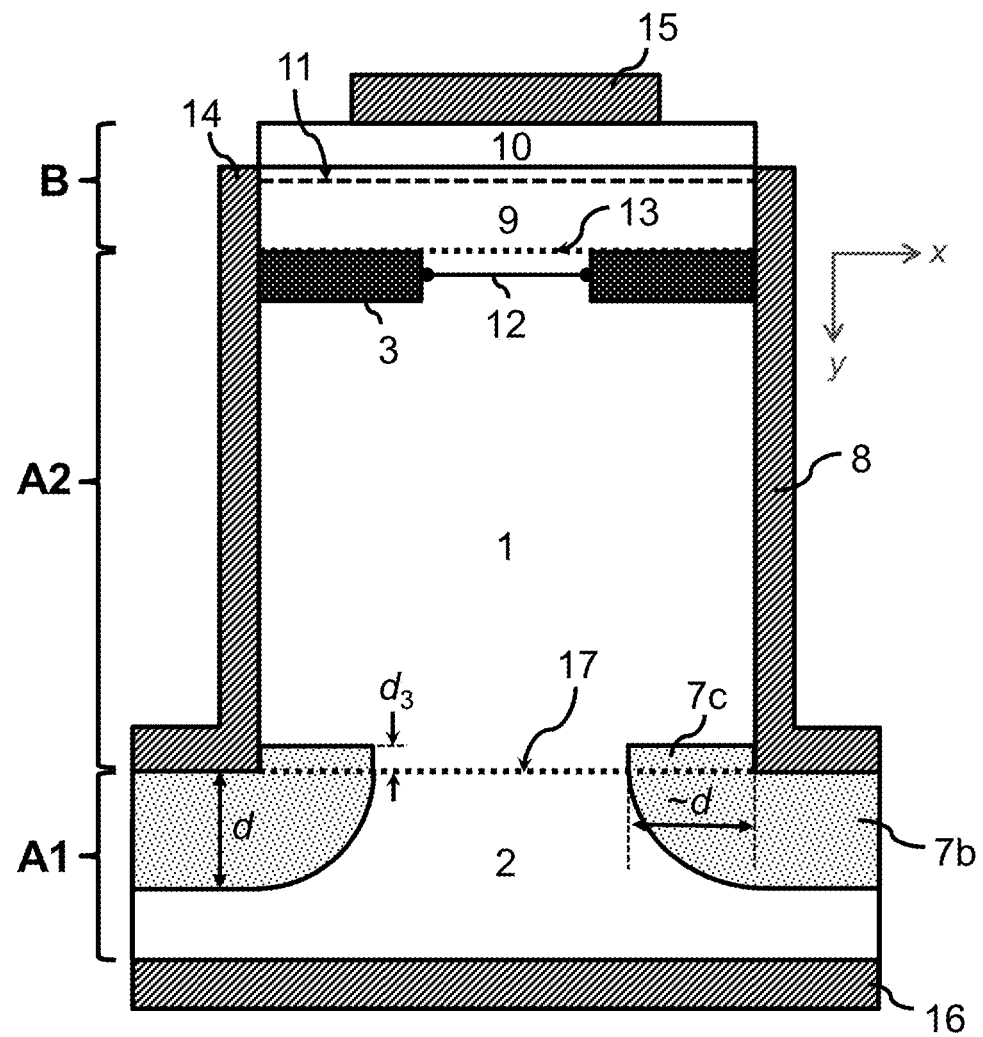
FIG. 3 is a schematic of a second modified design of the device structure.

FIG. 3 shows another permutation of the proposed vertical power transistors. It features Schottky barrier based sidewalk 8, which are connected to the source regions of the devices not shown in the figure). In the off-state, the depleted ionized (intentional or unintentional) dopants in the current-carrying region 1 would image on the sidewall metal 8. All of the regions A1, A2, and B can be either wafer-bonded to or regrown on each other. The thickness $d_3$ of the dielectric material 7c (which can be the same as or different from the buried dielectric 7b) is another design knob available in the structure, and it can be varied from zero to any desired thickness to further enhance the overall device performance.

d. Method of Fabrication According to One or More Embodiments

To fabricate the device shown in FIG. 1, according to one embodiment of the present invention, a template A comprised of layers 1, 2 with desired doping concentrations and thicknesses is grown, preferably, on a conductive substrate. The current-blocking regions 3 are formed by one of the aforementioned insulating methods, i.e., (1) ion implantation, (2) employment of a material with an opposite doping type compared to the current-carrying region 1, or (3) insertion of a material that provides a high barrier height to the channel carrier type (e.g. insulator, semiconductor with a much higher bandgap, air-gap, etc, and thus define the aperture 12 of the device. The trenches are firstly formed by etching (shown in FIG. 4(a)), and subsequently a desired type of insulator 7b is deposited such that the trenches become completely filled (shown in FIG. 4(b)). The insulator is dry-etched until its remaining thickness at the bottom is close to the desired thickness d (shown in FIG. 4(c)). Next, a layer of barrier material 4 (either modulation doped 5 or polarization-engineered or both) that induces 2-dimensional carriers 6 of a desired conductivity type in the drift region is deposited (shown in FIG. 4(d)), preferably using a selective regrowth method such as metalorganic chemical vapor deposition (MOCVD). The insulator 7a is then deposited until it reaches the desired thickness for the trench sidewalls (shown in FIG. 4(e)); thus, this second deposition forms the sidewall layers for the MIS junctions in the current-blocking regions. Next, a desired type of metal 8 is deposited, which fills up the remaining regions of the trenches, thereby completing the current-blocking regions of the template (shown in FIG. 4(f)).

It is noted that the process steps other than those represented in FIG. 2 can be also used to produce the identical current-blocking region profile. If necessary, a planarization of the template takes place to prepare a flat surface for wafer-bonding it to the lateral channel B. Post a low-temperature wafer-bonding process that does not alter the MIS junctions (especially metal) in the template, appropriate processes for source, gate, and drain regions are performed to complete the fabrication.

Figure 4:
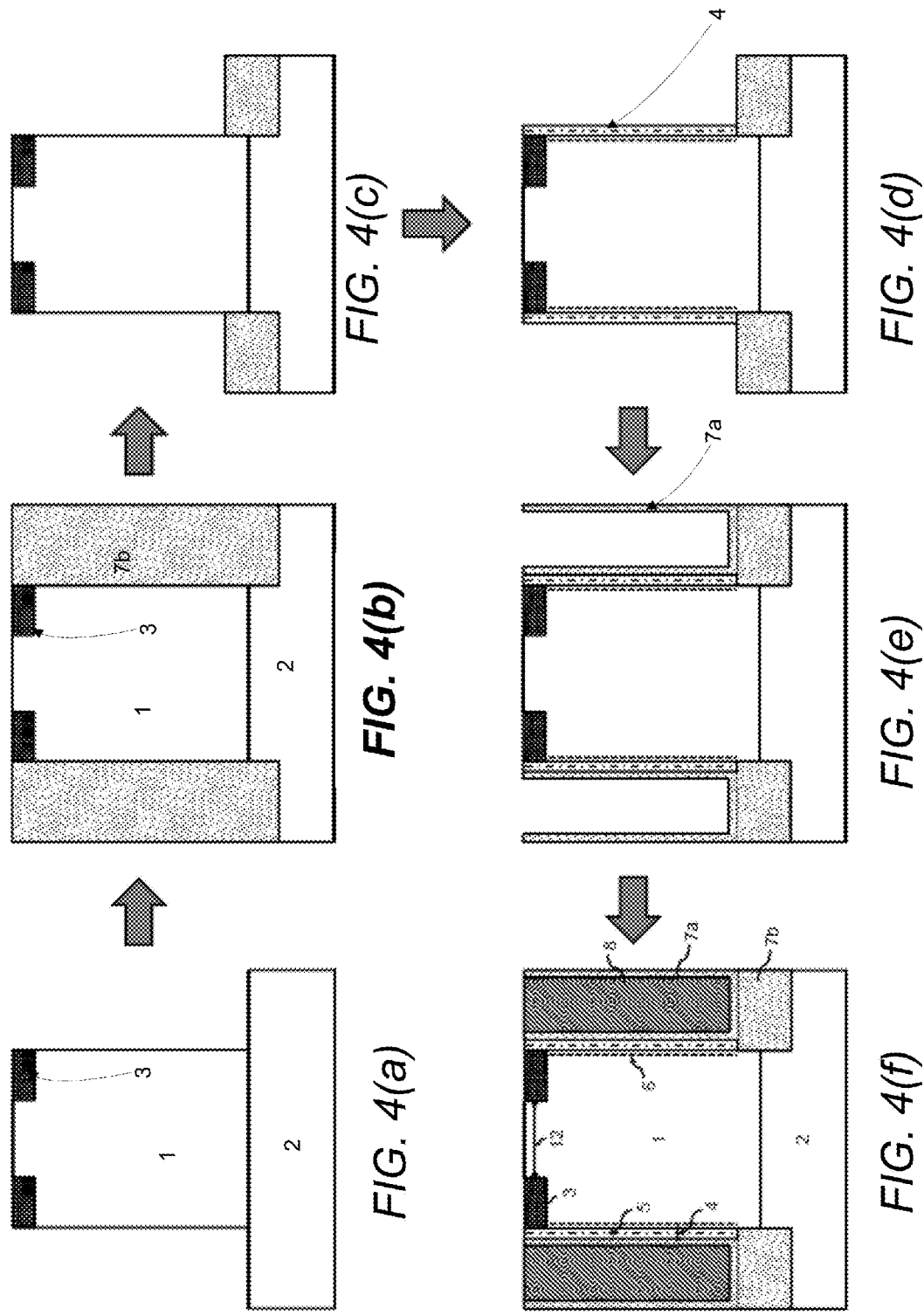
FIGS. 4(a)-4(f) illustrate a method of fabricating a semiconductor device, showing how to fabricate the device shown in FIG. 1.

It is also noted that other embodiments could use different methods of fabrication that those described herein with regards to FIG. 4.

There are some process developments that will play a critical role in successfully fabricating the proposed device with a III-N based drift region. These include III-N deep trench etching technique for current-blocking regions and sidewall AlGaN regrowth to achieve 2-dimensional vertical flow in the current-carrying regions.

Superjunction Current Aperture Vertical Electron Transistor for Ultra-Low On-Resistance a. Principle of Operation of One or More Embodiments One or more embodiments of the present invention disclose a semiconductor multi-junction device in III-nitride and non-III-nitride material systems, which aims at providing ultra-low on-resistance along with high breakdown voltage. Specifically, the proposed semiconductor device is a vertical device, namely, an SJCAVET that is comprised of two parts, namely, Parts A and B.

Part A of the device comprises a channel which controls current in the lateral direction by modulating a two-dimensional or three-dimensional channel. It contains at least one source and one gate.

Part B of the device is a drift region, which is a voltage blocking region that contains a substantial part of the blocked voltage in the off-state in the vertical dimension.

Current blocking layers form an aperture to restrict current flow from source to drain to the aperture form where it spreads to other conductive parts of the drift region. The current blocking layers can be formed by or comprise either p-type regions, wide bandgap materials, insulators or any dielectric including air-gaps.

An important feature of the device in one embodiment is a vertical or sloped 2-DEG on the sidewall to reduce the resistance to current flow, thereby achieving ultra-low on-resistance. This vertical 2-DEG is achieved by modulation doping an AlGaN layer which is adjacent to the current carrying drift region.

If the crystal were such that the crystal were polar in the x-direction, the 2-DEG could be formed because of polarization differences. Positive fixed charges of any form can be used to induce a 2-DEG in the drift region.

The device also has trenched p-n junctions which fully deplete laterally (x-direction) on applying a drain voltage substantially smaller than the breakdown voltage of the device. This allows the voltage to be held from source to drain in a region which has substantially a constant electric field in y-direction rather than the decreasing electric field typical for doped drift regions. This is a phenomenon similar to Si superjunction devices.

Together these features provide for ultra-low on-resistance ($R_{ON}$) and high breakdown voltage. This device structure is highly advantageous for high power switching applications.

b. Device Structure According to One or More Embodiments

Figure 5:
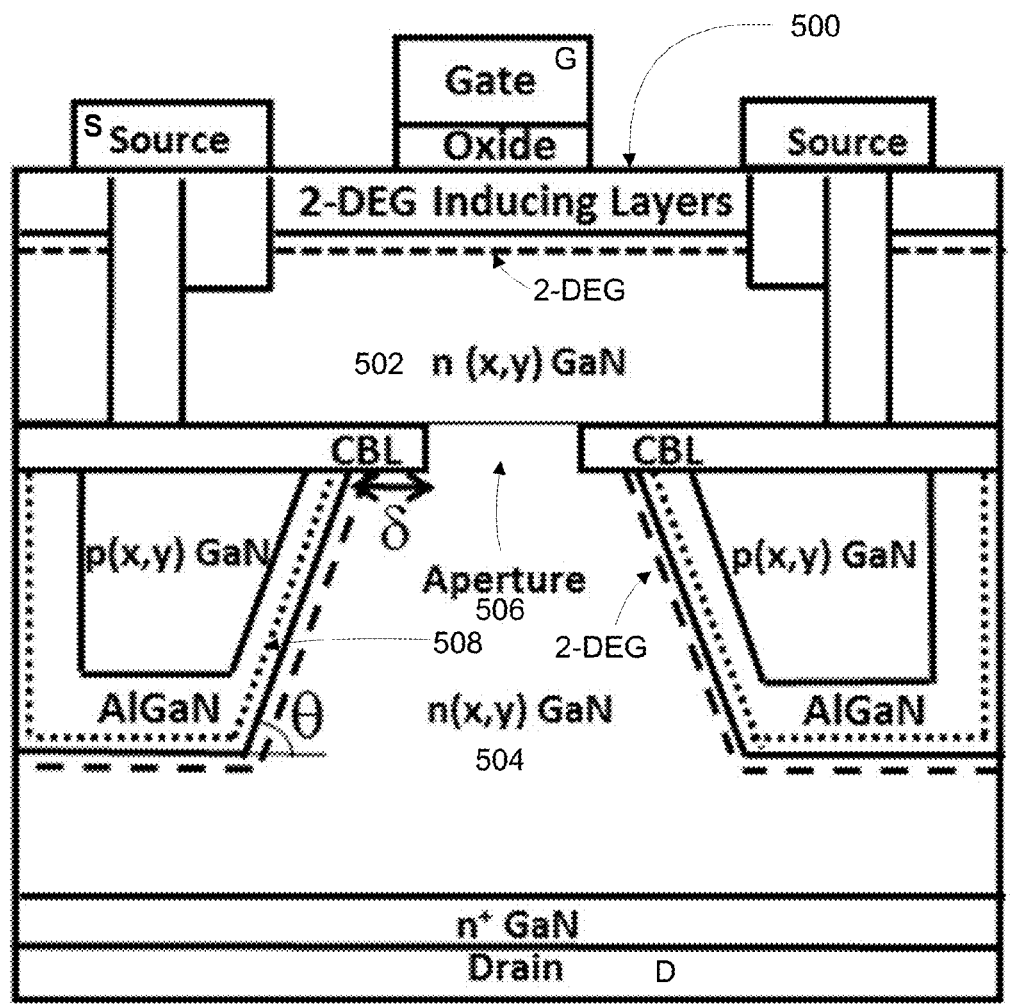
FIG. 5 is a schematic of a proposed semiconductor device according to one embodiment of the present invention.

FIG. 5 is a schematic of a proposed semiconductor device according to one embodiment of the present invention, illustrating a superjunction current aperture vertical electron transistor (SJCAVET) for ultra-low on-resistance, comprising a lateral channel (comprising 2-DEG inducing layers 500 and layer 502 comprising n(x,y) GaN) that controls current flow from source S to drain D, wherein this channel may provide conductance via two-dimensional electron gas (2-DEG), a doped channel, or both. The device further comprises drift region or a voltage blocking region which carries the current via either a vertical or sloped 2-DEG and/or along with current through an adjacent doped region 504 comprising n(x,y) GaN. The current flow from the lateral channel to the vertical drift region is confined substantially to an aperture 506 defined by one or more current blocking layers (CBLs).

Figure 6:
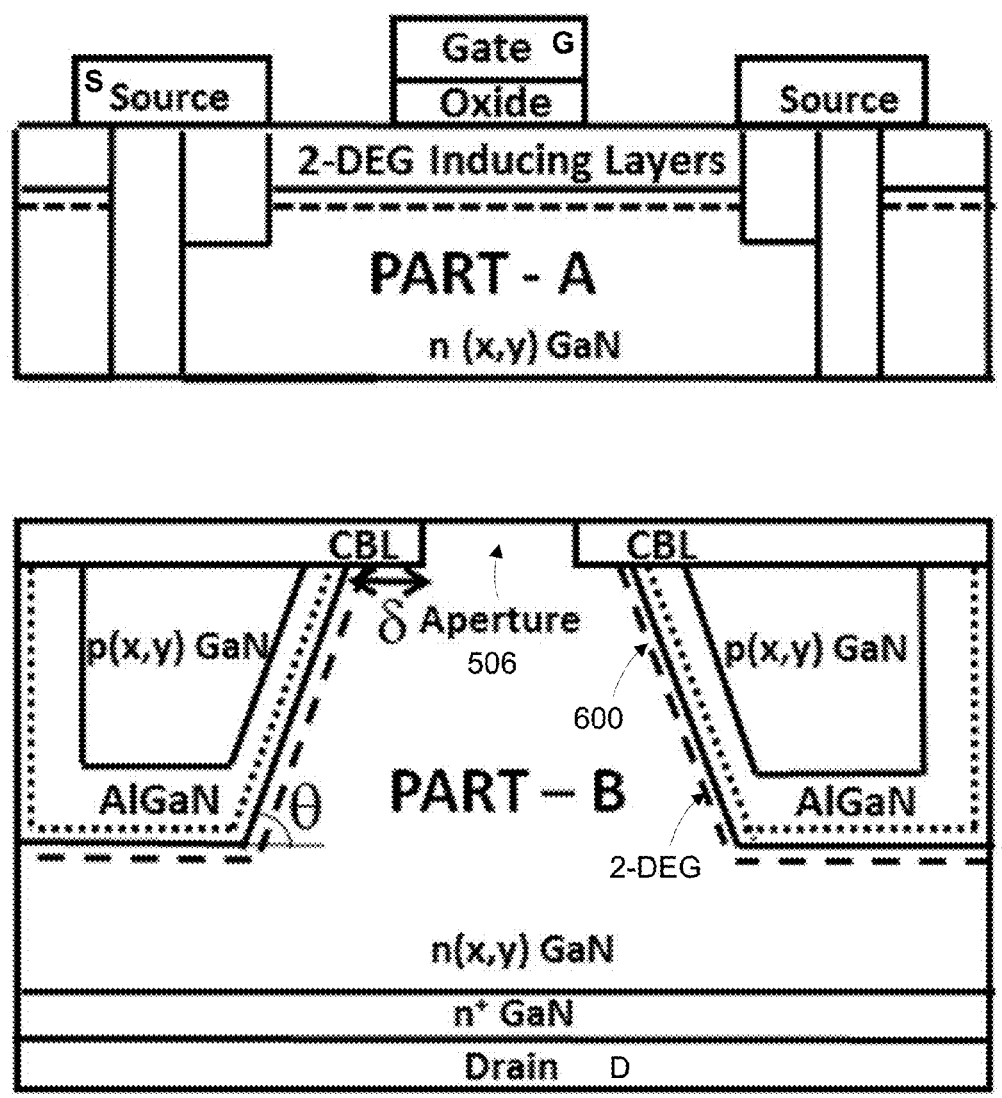
FIG. 6 shows the schematic of FIG. 1 divided into two regions labeled as Part A and B.
Figure 7:
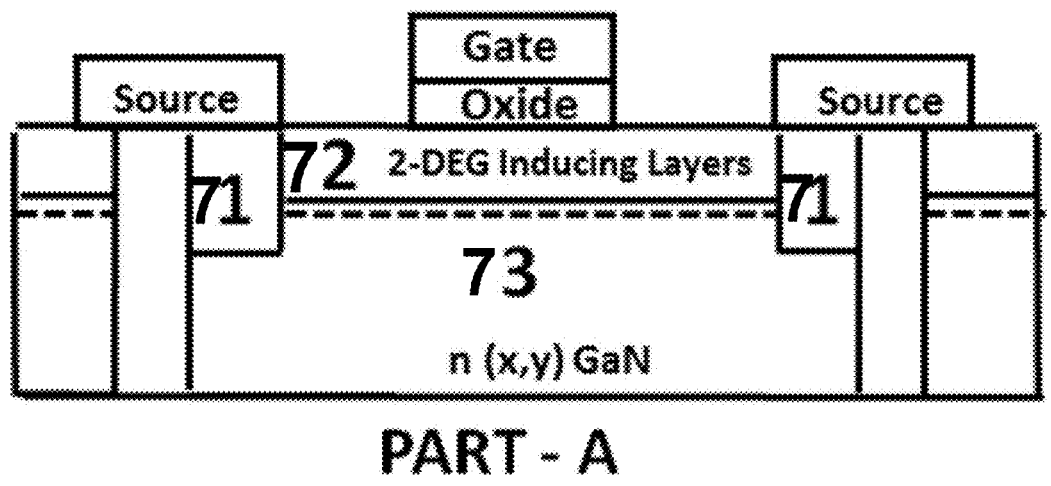
FIG. 7 shows Part A of FIG. 6 further sub-divided into regions labeled as Regions 71, 72 and 73.

The proposed semiconductor device shown in FIG. 5 could be broadly divided into two regions labeled as Part A and B as shown in FIG. 6.

FIG. 6 illustrates a semiconductor multi-junction device, comprising the vertical device that is comprised of Parts A and B, wherein the Part A comprises at least one gate G, at least one source S, and the lateral channel that controls a current flow from the source S to a drain D; the Part B comprises a drift region that carries the current flow via a vertical or sloped two-dimensional electron gas (2-DEG) and along a sidewall 600; and the current flow from the lateral channel to the drift region is confined substantially to an aperture 506 defined by one or more current blocking layers (CBLs).

The part A is comprised of a channel that controls current in the lateral direction, and the least one gate G can be single, multiple or split gated, for example. A 2-DEG is shown to be the sole current carrying region in Part A, although the channel could also have three-dimensional conductivity.

Part A can be further sub-divided into regions labeled as Regions 71, 72 and 73 as shown in FIG. 3.

Source contact (Region 71) to the 2-DEG is ohmic and acts as a source for electrons in the channel region. The ohmic source contact can be achieved by multiple methods, such as regrowth, anneal, etc.

Region 72 provides the 2-DEG in the channel. This could be achieved in multiple ways, for example, by having a wide band gap material with a positive polarization interface followed by a lower band gap material. In absence of polarization, modulation doping can also be utilized to obtain the 2-DEG. The main purpose of the layered structure in Region 72, which may comprise a single layer of c-plane (1000) AlGaN or multiple layers of AlGaN/AlN/GaN, is to induce 2-DEG in the channel.

Region 73, which is the region under the gate, modulates the charge in the 2-DEG channel, and thus controls the current flow. The device may comprise a metal-oxide-semiconductor (MOS) structure with oxide, dielectric, or other wide band gap material buried under the gate (with an oxide shown in the figures). The thickness of the oxide, dielectric, or other wide band gap material, is variable. The doping concentration in Region 3 could be variable to meet design criteria.

The device shown is a depletion mode device (negative threshold voltage/normally on), but it could also be enhancement mode device as well (positive threshold voltage/normally off). This can be achieved using ion implantation, recess etch, p-type gate, and other methods.

All dimensions in Part A are variable and can be altered to meet design criteria.

Figure 8:
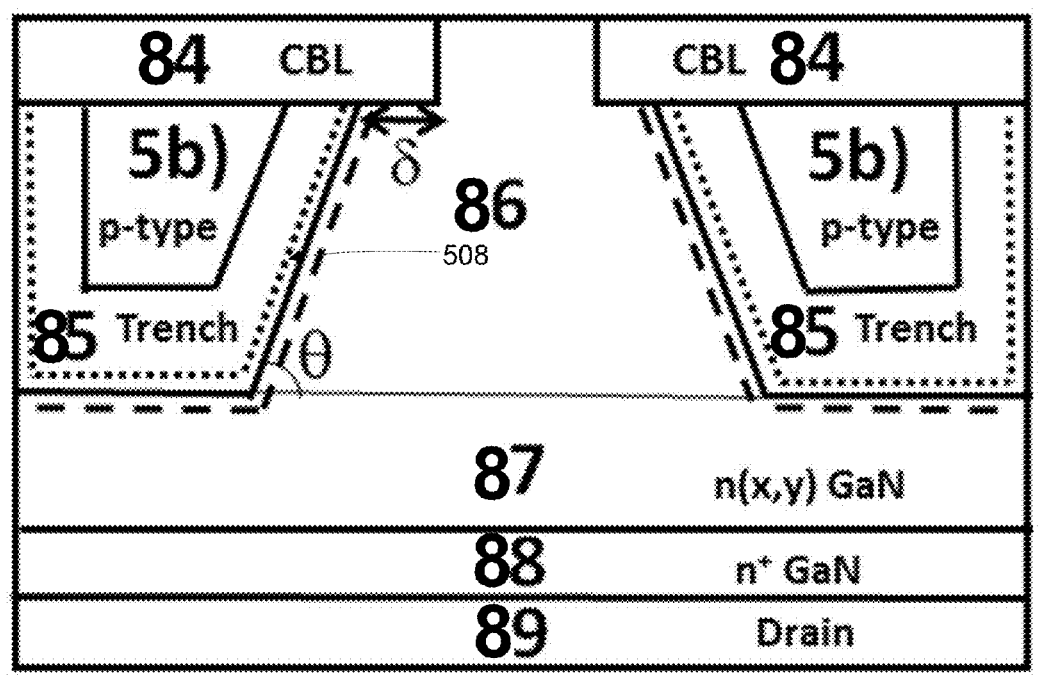
FIG. 8 shows Part B of FIG. 6 further sub-divided into regions labeled as Regions 84, 85, 86, 87, 88 and 89.

Part B is shown FIG. 8, and includes the drift region, as well as the drain.

Part B can be further sub-divided into regions labeled as Regions 84, 85, 86, 87, 88 and 89.

Region 84 is comprised of a current blocking layer (CBL). The function of the CBL is to act as barrier to carrier flow through the CBL, thereby forcing and/or directing the source current from Part A through the gated region into the aperture in Part B, wherein this current is modulated by the lateral gate. The CBL could be actualized by ion implantation, growth, insulating material, p-type GaN, and other methods. Aperture width could be varied to meet design criteria. The dimensions of the current blocking layer are variable and can be altered to meet design criteria.

The current blocking layer is followed by the trenched structure (Region 85). The trench could be angled and the θ (theta) angle could vary from 5 degrees to 175 degrees from the horizontal plane. The δ (delta) spacing shown in the FIG. 8 could be positive, negative or zero, wherein the δ represents the overlap of the trenched structure with the current blocking layer.

This trenched structure provides the opportunity to get a 2-DEG along the sidewalls 600, which is essential in reducing on-resistance. The 2-DEG on the sidewalls could be achieved by modulation doping (shown as the dotted line along the trench structure).

If the nature of the interface is polar, then the polarization charge at the interface between the wide band gap material followed by lower band gap material (Region 86) can provide the 2-DEG. Graded polar regions can also be employed, so called 3-DEGs.

Region 5b) is comprised of opposite conductivity semiconductor to Region 86. When a blocking voltage is applied to the semiconductor device, the lateral p-n junction formed between Regions 85 and 86 in Part B gets fully depleted, forming a space charge region, wherein the vertical electric field is substantially constant, unlike the decreasing electric field in one-dimensional n-type semiconductors. This leads to the highest breakdown voltage with the lowest on-resistance. Region 5b) can be variably p-type doped in both the x and y directions to allow for the compensating charges 508 and to control the electric field.

Figure 9:
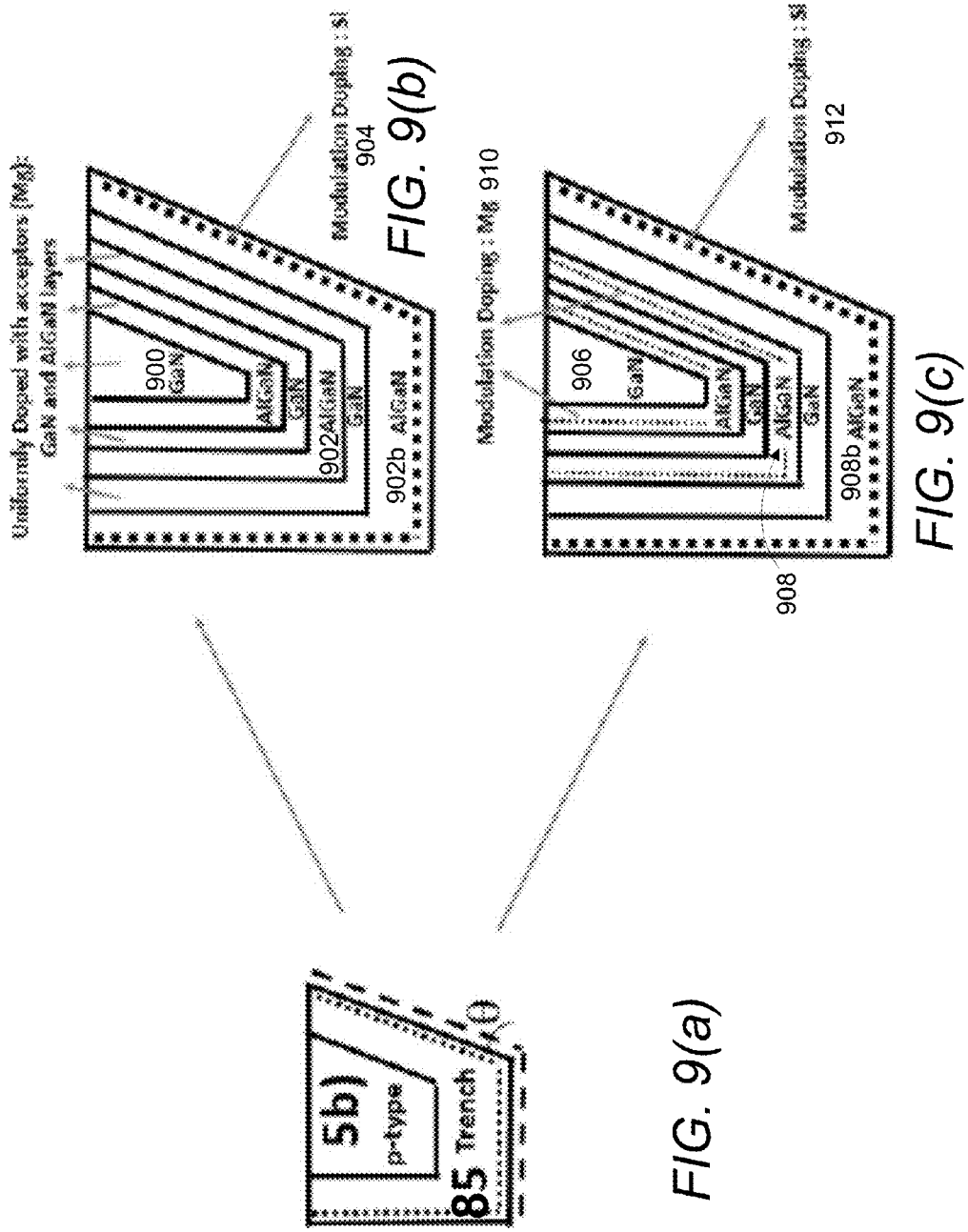
FIGS. 9(a)-(c) show Region 85 of FIG. 8 further defined as a trench region including modulation doping.

Since variable p-type doping is difficult to control, a different method to achieve effective p-type doping may also be used. Specifically, the concept of super-lattice or multi-layer structures with modulation or uniform doping can be utilized to obtain compensating charges in the trenched structure shown in FIG. 9(a)-(c). Alternating layers of modulation doped higher band gap material followed by lower band gap material ($Ga_wAl_xIn_yB_zN/Ga_wAl_xIn_yB_zN$) would form the super-lattice or multi-layer structure and thus provide the necessary compensating charges. Alternatively, the super-lattice or multi-layer region can also be uniformly doped with acceptors and produce substantially the same results. FIG. 9(b) illustrates a variation of FIG. 9(a) comprising GaN layers 900 and AlGaN layers 902 that are uniformly doped with acceptors (Mg), wherein an AlGaN layer 902b is modulation doped with Si 904. FIG. 9(c) illustrates a variation of FIG. 9(a) comprising GaN layers 906 and AlGaN layers 908, wherein AlGaN layers 908 are modulation doped with Mg 910 and AlGaN layer 908b is modulation doped with Si 912.

To re-emphasize, wider band gap material (barrier), or narrow band gap material (well), or both wider band gap material (barrier) and narrow band gap material (well), can be doped (either modulation doped or uniformly doped with acceptors) to meet design criteria. Different carrier concentration can be achieved by varying the dimensions, spacing, doping and number of the layers. Polarization fields if available can also be utilized in super-lattices to provide the necessary charges for charge compensation.

The current blocking layer and p-type semiconductor region in the trenched structure can be electrically connected such that, in operation, there is no bias between them as shown in FIG. 5.

Region 86 shown in FIG. 8 is generally n-type with variable doping in both the x and y directions.

Region 87 is also of the same conductivity type as Region 86. Region 87 allows the spread of the current from 2-DEG towards the drain contact. Region 87 can also hold the blocking voltage, depending on the doping and thickness of the region. This may or may not involve the same semiconductor as in Region 86. The thickness of Region 87 is variable from zero to any positive value.

Region 88 is a highly conductive layer providing good ohmic contact to the drain (Region 89).

c. Possible Modifications and Variations

Various alterations can be made to this device design.

The combination of Parts A and B into the semiconductor device shown in FIG. 5 creates the aperture to allow the flow of current and can be achieved in multiple ways:

(a) Part A can be regrown on top of Part B. This may or may not involve the same semiconductor in Regions 73, 84 and 86.

(b) Part A can be wafer bonded to the top of Part B. Again, this may or may not involve the same semiconductor in Regions 73, 84 and 86. Bonding can be achieved in different ways.

(c) This structure can be realized in different shapes and forms such as cylindrical, hexagonal and other geometries.

(d) Note also that, in the drawings, the source contact only contacts the CBL. In practice, the source contact can also contact the p-type region below, including, but not limited to, the super-lattice or multi-channel region.

A semiconductor device according to one or more embodiments of the invention can provide ultra-low on resistance with high breakdown voltage. A semiconductor device according to one or more embodiments of the invention can achieve low loss, reducing a major cost of a power converter system, the heat sink and enabling system-design flexibility.

III. GaN Based Vertical Metal Oxide Semiconductor (MOS) Transistors and Junction Field Effect Transistors (JFETS)

a. Introduction

Figure 10:
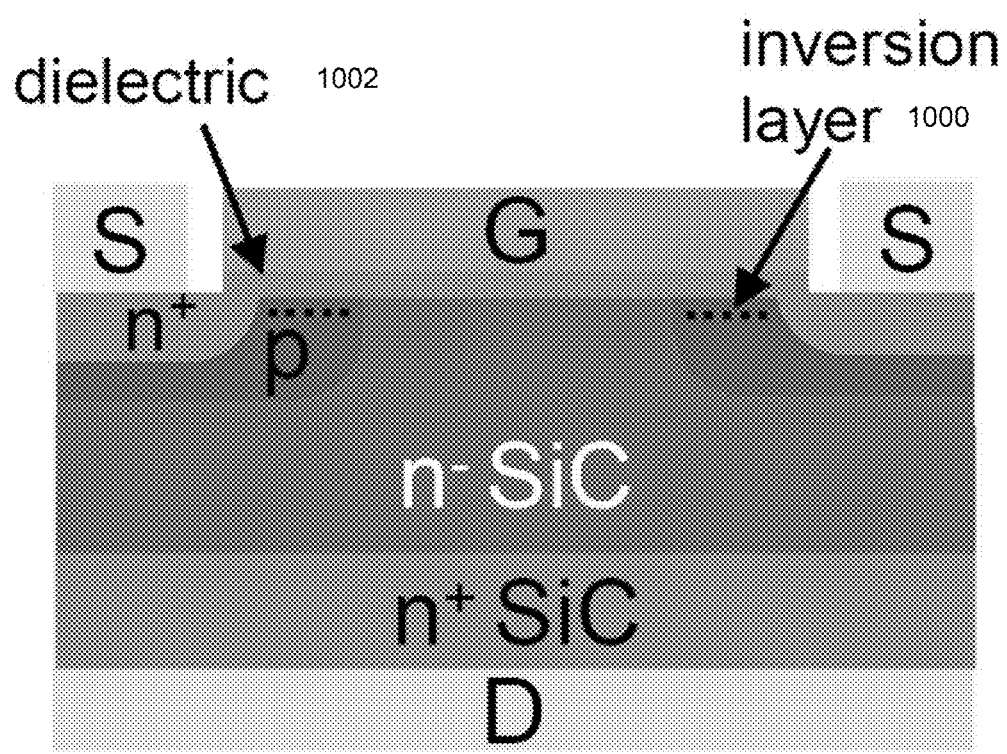
FIG. 10 is a cross-sectional schematic of a device illustrating limitations of a SiC MOSFET are effectively addressed by GaN based devices, and showing Source (S), Drain (D), and gate (G) contacts.

Three novel and practical approaches are proposed that have the common theme of markedly reducing chip size compared to commercially available lateral GaN on Si based High Electron Mobility Transistors (HEMTs), coupled with simplicity of fabrication processes to reduce cost. These result in vertical devices where the voltage in the off-state is substantially held in the vertical dimension, completely, different from the devices qualified and in the market today. The limitations facing Silicon Carbide (SiC) MOSFETs today are shown in FIG. 10. FIG. 10 illustrates Source S, Drain D, Gate G, inversion layer 1000, dielectric 1002, n$^-$ SiC, n$^+$ SiC, p-type region p, and n$^+$ type region p. Contacts to SiC have a contact resistance of ~1 mΩcm$^2$ whereas a GaN device can have low contact resistance made to n$^+$GaN. The inversion layer has a contact resistance of ~1 mΩcm$^2$ whereas a GaN device can comprise a 2DEG, high mobility channel. The drift resistance in SiC is ~1 mΩcm$^2$ whereas a GaN device can have a unique device structure to reduce drift resistance.

Figure 11:
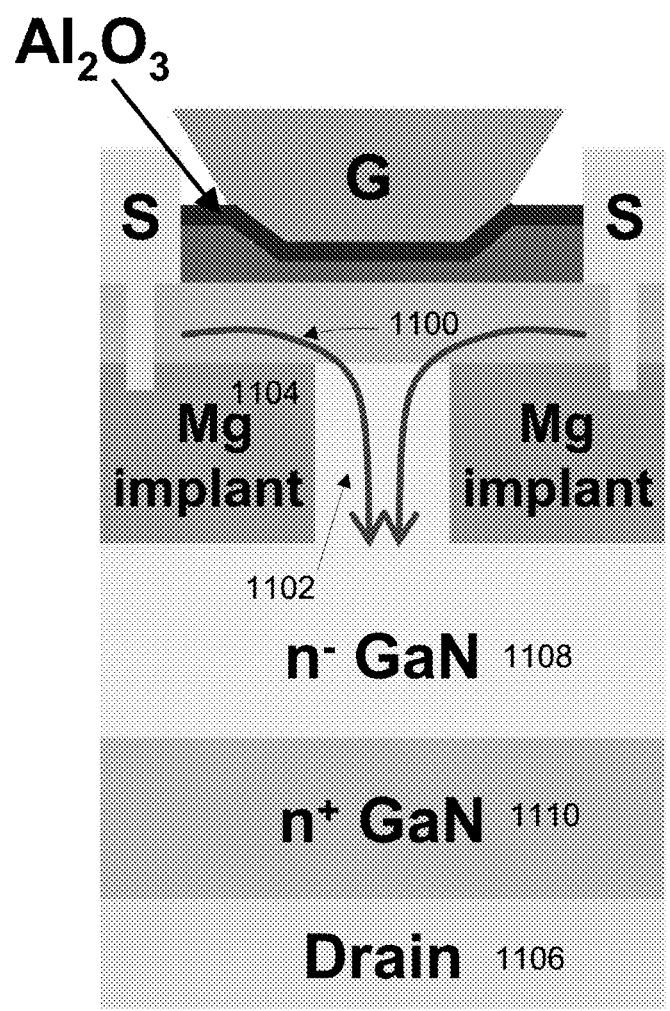
FIG. 11 is a cross-sectional schematic of a CAVET showing current modulation laterally under the gate with electrons flowing through the aperture vertically into the drain.

Here, one or more embodiments of the invention propose a true vertical transistor, where the gating is also performed on electrons traveling perpendicular to the surface in a vertical channel (different from a CAVET, illustrated in FIG. 11).

FIG. 11 is a cross-sectional schematic of a CAVET showing current modulation laterally under the gate G with electrons flowing 1100 through the aperture 1102 (formed by Magnesium (Mg) implant 1104) vertically into the drain 1106. Also shown are n-type GaN (n$^-$ GaN) layer 1108, n-type GaN (n$^+$ GaN) layer 1110, and source S contact.

Figure 12:
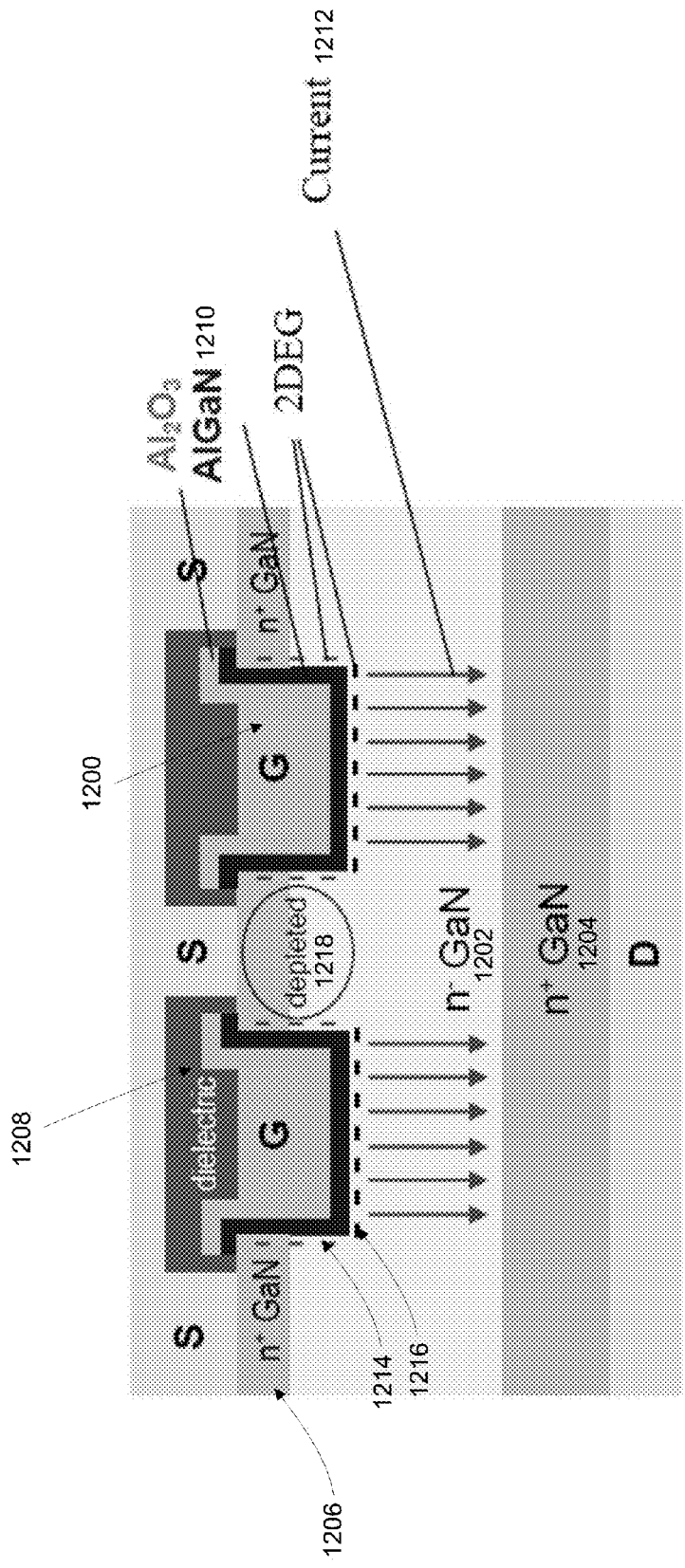
FIG. 12 is a cross-sectional schematic of a Vertical MOS transistor with a highly conductive lateral two dimensional electron gas (2DEG) to reduce drift region spreading resistance.

In one embodiment, illustrated in FIG. 12, an extremely low drift region spreading resistance is achieved by the insertion of a two dimensional electron gas (2DEG) produced at the AlGaN/GaN heterojunction present on either side of the channel (the trench region 1200). This can significantly improve on the device performance by utilizing the full area of the drift region for conduction. The device comprises Source S, Drain D, n$^-$GaN layer 1202, n$^+$GaN layer 1204, 1206, dielectric 1208, Al$_2$O$_3$, AlGaN layer 1210, vertical current flow 1212, 2DEG 1214 on either side of the channel, 2DEG 1216, and depleted region 1218.

The gating of this device can be either via a MOS structure to create a vertical MOSFET as is shown in FIG. 12, or a p-n junction to create a vertical JFET, where the p-region may be created by ion implantation and activation. In the case of the MOSFET, embodiments of the invention have the ability of depositing the dielectric by high vacuum Atomic Layer Deposition (ALD), by MOCVD, by Chemical Vapor Deposition (CVD), or in-situ by MOCVD, for example. An alternate approach addresses epitaxially grown p-type regions.

To reduce the on resistance $R_{on}$ (in the mΩcm$^2$ range) while simultaneously reducing chip cost, it is essential that the electrically active device area be equal to the geometric chip area. For example a 1 mΩcm$^2$ device has three times smaller chip area for the same $R_{on}$ as a 3 mΩcm$^2$ device.

b. MOSHEMT Schematic (FIG. 12) and Process Flow (FIG. 13)

FIG. 12 shows an embodiment of a normally-off Vertical MOSFET wherein the built-in voltage of the side gates fully deplete (depleted region 1218) the vertical channel in between. Depletion-mode Vertical MOSFETs can be also fabricated. An example of the fabrication process is described below and shown in FIG. 13(a)-13(h). The first 6 μm of GaN (doped n-type at 5×10$^{15}$ cm$^{-3}$) are epitaxially grown on GaN substrates to serve as the drift and channel layer, followed by 0.5 μm of epitaxial n$^+$ GaN or n$^+$ GaN to serve as a contact layer or layers, as shown in FIG. 13(a). Next, 1.5 μm deep multiple channels are formed using photolithography and dry etch techniques (Mask M, FIG. 13(b)). A blanket regrowth of AlGaN is then conducted. A polarization induced 2DEG is formed in the regions between the channels (trench regions) resulting in a high conductivity two dimensional electron gas (2DEG) which spreads the current efficiently in the drift region to make the full chip area active (FIG. 13(c)).

Channels with either no or small 2DEG densities are formed along the sidewalls because of their non-polar or semi-polar nature enabling normally-off operation. The regrowth is either followed by an in-situ growth of Al$_2$O$_3$ dielectric, or by an ex-situ technique such as ALD (FIG. 13c). In the latter case, appropriate care to remove unintentional Si at the regrowth interface will be implemented [7].

Figure 14:
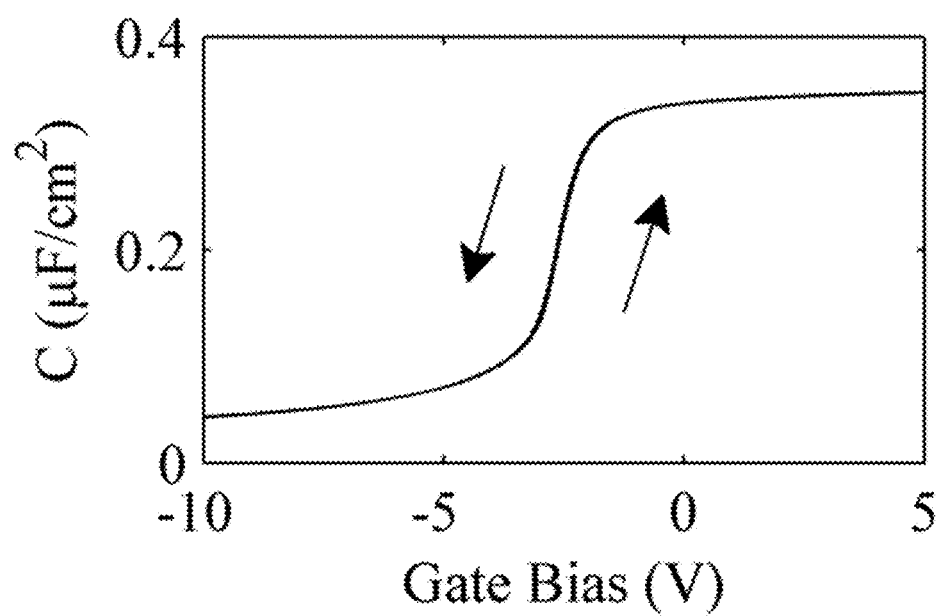
FIG. 14 plots capacitance per centimeter square (microfarads per centimeter square, μF/cm$^2$) as a function of gate bias (Volts, V), showing a first pair of upward and downward sweeps measured with an additional 10 minute stress in accumulation for a MOS capacitor (MOSCAP) with 25 nanometers (nm) Al$_2$O$_3$ grown in-situ by Metal Organic Chemical Vapor Deposition (MOCVD) at 1000° C.

FIG. 14 shows initial work done at the University of California, Santa Barbara (UCSB) on MOCVD dielectrics (that shows minimum threshold shift under voltage for dielectrics deposited in-situ after planar Ga-polar GaN growth, showing the feasibility of this approach.

After dielectric deposition (by Metalorganic Chemical Vapor Deposition (MOCVD) or Plasma Enhanced Atomic Layer Deposition (PEALD) as examples), 1 micrometer (μm) of Ti/Al (high workfunction metal 1300) is sputtered over the entire sample (FIG. 13(d)). The spacing of the channels is designed to be 2 μm. This enables the metal to be planar over the full sample. A blanket etch is carried out to remove 1 micron of Aluminum (Al), leaving behind a gate length of 1 micron on the sidewalls (FIG. 13(e)). Next, the device is covered with dielectric 1302 (FIG. 13(g)). A blanket-etch to remove a portion of the dielectric to expose the tops of the channels is then performed. The Ti and the $Al_2O_3$ dielectric is then removed (FIG. 13(g)) and aluminum metal 1304 is deposited over the whole sample to form the source ohmic contact and active pads (FIG. 13(h)). The metal regions 1306 between the active gates (FIGS. 13d and 13e) mitigate high field regions at gate edges and ensure the peak field is in the bulk of the device (FIG. 13h).

c. Possible Modifications

In the Vertical MOSHEMT process, the AlGaN layer can be replaced by InAlN or any (B,Al,Ga,In)N layer, and the $Al_2O_3$ can be replaced by any other dielectric, for example $Si_3N_4$ or $Si_2$, or higher k dielectrics. Incorporating no heterojunction material is also an embodiment which leads to a Vertical MOSFET and any of the above dielectrics may be used as an example.

The process flow can be modified in any suitable other way to fabricate the device.

For all devices, instead of MOCVD, any other suitable growth technique can be used, for example molecular beam epitaxy (MBE) or chemical beam epitaxy (CBE), or hydride vapor phase epitaxy (HVPE), or a combination of different growth techniques. Also all materials can be (Al,Ga,In)N of constant or varying compositions.

d. Advantages and Improvements

The disclosed devices designs allow the fabrication of devices that exceed the performance of current GaN based transistors for power switching applications, as well as SiC MOSFETs, by allowing high voltage operation in combination with an extremely low contact resistance, high switching speed, and low drift resistance.

IV. Process Steps a. First Example

FIG. 15 illustrates a method of fabricating a vertical transistor.

Block 1500 represents forming (e.g., depositing and/or bonding) a semiconductor structure comprising a lateral channel connected to a drift region. The step can comprise bonding a part A to a part B, wherein the part A comprises the lateral channel and the Part B comprises the drift region.

The step can comprise growing III-nitride layers, comprising a channel region and a drift region, on or above a Gallium Nitride substrate. The step can comprise growing/depositing one or more first III-nitride layers and one or more second III-nitride layers on or above a Gallium Nitride substrate to form the lateral channel, the drift region, and a contact layer, and for example, wherein polar c-plane interfaces between the layers are formed. The drift region can comprise one or more doped III-nitride layers (e.g., Gallium Nitride layers), on a Gallium nitride substrate.

The step can comprise depositing a first III-nitride layer on a second III-nitride layer and comprising the lateral channel. The channel region or conductive channel can comprise a two dimensional electron gas (2DEG) confined in the III-nitride layers, or confined in the first III-nitride layer by the interfaces with the second III-nitride layer. The first III-nitride layer can be (e.g., doped) GaN and the second III-nitride layer can be AlGaN. The first III-nitride layer can be grown on the drift region.

The lateral channel can provide conductance via a two-dimensional electron gas and/or a doped channel.

The drift region and channel region can be n-type. The channel region can comprise a junction between a p-type region and an n-type region in the III-nitride layers, or the interfaces in the lateral channel can comprise junctions between a p-type region and an n-type region, wherein the p-type region is in the first III-nitride layer and the n-type region is in the second III-nitride layer, or the n-type region is in the first III-nitride layer and the p-type region is in the second III-nitride layer of the lateral channel.

Block 1502 represents forming one or more trench regions in the semiconductor structure.

The step can comprise forming a trench region around a current carrying region of the drift region, wherein the trench region comprises a current blocking structure comprising different material layers that can provide a compensating charge, and the compensating charge can fully deplete an ionized dopant concentration in a current carrying region of the drift region in the off-state.

The current-blocking structure can be comprised of trenches filled with insulator and metal, e.g., wherein the insulator is thicker at a bottom of the trench and thinner at sidewalls of the trenches. The current-blocking structure can be comprised of trenches filled with alternating layers of (e.g., different) semiconductor material (e.g., alternating layers of different III-nitride material, e.g., alternating AlGaN and GaN layers).

The current blocking structure can comprise one or more sidewalls adjacent to a current carrying region of the drift region, and be structured such that the one or more sidewalls reduce resistance to the current's flow in the current carrying drift region.

The trench rations can be such that current flow can be carried via a vertical sloped two-dimensional electron gas (2-DEG) and along the sidewall; and the current flow from the lateral channel to the drift region is confined substantially to an aperture defined by the current blocking structure.

One or more trenches can be formed in the III-nitride layers, wherein the trenches shape the lateral channel. For example, one or more trench regions in III-nitride layers of the semiconductor structure can be formed such that a polar c-plane interface and nonpolar and/or semipolar interfaces e.g., in-plane interface are between the first III-nitride layer and the second III-nitride layer forming the lateral channel and/or 2DEG.

Block 1504 represents depositing a source contact to the lateral region or channel region.

Block 1506 represents depositing a drain contact to the drift region.

Block 1508 represents depositing one or more gates positioned to modulate conductivity of the channel region and/or modulate current flowing vertically from the source contact, through the drift region, and to the drain contact.

A dielectric layer (e.g., $Al_2O_3$) can be formed between the gates and the lateral channel and/or between the gates and the second III-nitride layer and along the interfaces. The dielectric can provide negligible threshold shift under gate voltages between −10 V and +10 V.

A polar interface can be between the drift region and the one or more gates. One of the gates can be formed in each of the trenches formed in Block 1502.

Block 1510 represents the end result, a semiconductor (e.g., vertical) device.

The device can comprise a lateral channel connected (e.g., bonded) to a drift region; a source contact to the lateral region; a drain contact to the drift region; one or more gates positioned to modulate current flowing vertically from the source contact, through the drift region, and to the drain contact, wherein the drift region comprises a current blocking structure; voltage is predominantly held in a vertical direction in an off-state; the current is channeled through an aperture in the current-blocking structure after it flows from under a gate region into the drift region in an on-state; and the one or more gates and/or the current blocking structure induce a two dimensional electron gas at one or more sidewalls of the gates and/or of the current blocking structure. The current blocking structure can comprise different material regions that can provide a compensating charge, and the compensating charge can fully deplete an ionized dopant concentration in a current carrying region of the drift region in the off-state.

The current-blocking structure can be comprised of trenches filled with insulator and metal to provide the compensating charge, or trenches filled with alternating layers of semiconductor material to provide the compensating charge.

In the on state, the gates can deplete the lateral channel adjacent the gates' sidewalls, so that the current flows predominantly from under the gate to the drift region.

The device can be a transistor further comprising a first III-nitride layer on a second III-nitride layer and comprising the lateral channel; a polar c-plane interface and nonpolar and/or semipolar interfaces between the first III-nitride layer and the second III-nitride layer; the source contact to the lateral channel; and the drift region, comprising one or more doped Gallium Nitride layers, wherein the polar interface is between the drift region and one or more gates.

In one or more embodiments, the trenched vertical power field-effect transistors with improved on-resistance and breakdown voltage can be fabricated by direct wafer-bonding of the drift region to the lateral channel, the modulation of the current flow of the transistor can occur in the lateral channel, whereas the voltage is predominantly held in the vertical direction in the off-state, and when the device is in the on-state, the current can be channeled through an aperture in a current-blocking region after it flows under a gate region into the drift region.

The device can comprise a (e.g., semiconductor multi-junction) device, comprising a vertical device that is comprised of Parts A and B; wherein the Part A comprises at least one gate, at least one source, and a lateral channel (e.g., that controls a current flow from the source to a drain); the Part B comprises a drift region that carries the current flow via a vertical or sloped two-dimensional electron gas (2-DEG or 2DEG) and along a sidewall; and the current flow from the lateral channel to the drift region is confined substantially to an aperture defined by one or more current blocking layers (CBLs) and/or the current blocking structure.

The first part A can be comprised of a Region 71 that includes the source; a Region 72 that includes the lateral channel; and a Region 73 that comprises a region under the gate. The second part B can be comprised of a Region 84 that is comprised of the current blocking layer; a Region 85 that is comprised of a trenched structure that provides the vertical or sloped two-dimensional electron gas along the sidewall; Region 86 that is comprised of the drift region; a Region 87 that allows the current flow towards the drain; a Region 88 that provides ohmic contact to the drain; and a Region 89 that includes the drain.

The drift region can be a voltage blocking region that can be (e.g., fully) depleted at voltages lower than a desired breakdown voltage.

The current blocking structure can have one or more dimensions and materials, and the current-carrying regions can have doping and one or more dimensions, such that an electric field held in the current blocking region is (e.g., much) less than its breakdown field in the off-state, such that the current-carrying region becomes fully depleted in the off-state, thus enabling a breakdown voltage of the device.

One or more of the source contacts can form metal regions between the gates and mitigate high field regions at the gate edges, ensuring the peak field is in the bulk of the device.

A polarization induced 2DEG can be formed in regions between the trenches resulting in the high conductivity 2DEG which spreads the current efficiently in the drift region to make the full chip area active.

In one or more embodiments, the 2DEG along the vertical non-polar and/or semipolar interfaces is induced only wider forward bias on the gates and the 2DEG on the polar c-plane is always present for all operating conditions. The nonpolar interface can include an m-plane interface.

The transistor's electrically active device area can be equal to a geometric chip area on which the device is formed. A device having an on resistance of 1 m$\Omega$cm$^2$ can have three times smaller chip area for the same $R_{on}$ as a 3 m$\Omega$cm$^2$ device.

The transistor can be a vertical Metal Oxide Semiconductor Field Effect Transistor (MOSFET) or a vertical Junction Field Effect Transistor. The MOSFET can be a Metal Oxide Semiconductor High Electron Mobility Transistor (MOSHEMT).

The transistor can comprise a Gallium Nitride based transistor, comprising III-nitride layers, comprising a channel region and a drift region, formed on or above a Gallium Nitride substrate; a source contact to the channel region; a drain contact to the drift region; one or more gates positioned to modulate conductivity of the channel region and modulate current flowing vertically through the III-nitride layers from the source contact, through the drift region, and to the drain contact, wherein the current from the source contact to the drain contact spreads laterally in the drift region in an on-state of the device, utilizing substantially a full area of the drift region for conduction, the gates modulate the current spreading laterally and passing from the source contact to the drain contact, and voltage in an off-state of the device is substantially held in the doped drift region in a vertical direction between the source and drain contacts.

The transistor can comprise Gallium Nitride based transistor, comprising a polar c-plane interface between one or more first III-nitride layers and one or more second III-nitride layer formed on a Gallium Nitride substrate; nonpolar and/or semipolar interfaces between one of the first III-nitride layers and one of the second III-nitride layers; one or more source contacts to one of the first III-nitride layers; a drift region, comprising one or more doped Gallium Nitride layers, wherein the polar interface is between the drift region and one or more gates, a drain contact to the drift region, the gates, positioned adjacent to the interfaces, modulating a conductive channel formed at the interfaces and a current passing through the conductive channel between the source and the drain contacts, wherein: the current from the source contact to the drain contact spreads laterally in the drift region in an on-state of the device, the gates modulate the current spreading laterally and passing between the source and the drain contact, and voltage in an off-state of the device is substantially held in the doped drift region in a vertical direction between the source and drain contacts.

b. Additional Examples

FIG. 16 illustrates a method of fabricating a transistor, Block 1600 represents growing n-type GaN layers on a GaN substrate to serve as drift and channel layers.

Block 1602 represents growing n$^{++}$ GaN on the drift n-type GaN layer to serve as a contact layer.

Block 1604 represents etching one or more trenches in one or more of the n-type GaN layers to form multiple channels in one or more of the n-type GaN layers.

Block 1606 represents growing one or more III-nitride layers (e.g., blanket regrowing III-Nitride) on top of the channel layers/n-type GaN layers inside and outside the trenches.

Block 1608 represents growing a first dielectric layer on the one or more III-nitride layers/re-grown III-nitride layer, inside and outside the trenches.

Block 1610 represents depositing a planar metal layer on the first dielectric layer.

Block 1612 represents etching the metal to leave a metal only in the trenches, wherein the metal forms gates.

Block 1614 represents depositing and covering the device with a second dielectric layer.

Block 1616 represents etching the second dielectric to remove a portion of the second dielectric to expose the top of the channel GaN layer outside the trenches.

Block 1618 represents depositing metal on regions exposed by removal of the second dielectric layer to form a source ohmic contact to the channel GaN layer. The depositing can form metal regions between the gates that mitigate high field regions at gate edges and ensure the peak field is in the bulk of the device.

Block 1620 represents depositing metal on the drift region to form a drain ohmic contact.

Unintentional Si at the regrowth interface can be removed.

FIG. 17 illustrates a method of fabricating a Gallium Nitride based transistor.

Block 1700 represents growing or depositing one or more first III-nitride layers and one or more second III-nitride layers on a Gallium Nitride substrate, wherein polar c-plane interfaces between the layers are formed, and a drift region, comprising one or more doped Gallium Nitride layers, is formed;

Block 1702 represents forming nonpolar and/or semipolar interfaces between the first III-nitride layer and the second III-nitride layer.

Block 1704 represents depositing one or more source contacts to the III-nitride layers.

Block 1706 represents depositing a drain contact to the drift region.

Block 1708 represents depositing one or more gates that modulate a conductive channel formed at the interfaces and a current passing through the conductive channel between the source and the drain contacts, wherein the polar interface is between the drift region and the one or more gates, the current from the source contact to the drain contact spreads laterally in the drift region in an on-state of the device, the gates modulate the current spreading laterally and passing between the source and the drain contact, and voltage in an off-state of the device is substantially held in the doped drift region in a vertical direction between the source and drain contacts.

V. Device Structure to Achieve Enhancement Mode Operation

One or more of the following embodiments of the present invention describe a novel vertical power low-loss semiconductor multi-junction device in III-nitride and non-III-nitride material systems designed for providing enhancement mode (normally-off) operation alongside low or ultra-low on resistance and high breakdown voltage. The proposed semiconductor device could be divided into three regions A, B, and C.

Region A of the device consists of/comprises the source layer and the current blocking layer (CBL). The CBL prevents the current flow from the source to the drain, in both the ON-State and the OFF state. The CBL can be formed by either p-type regions, wide bandgap materials, insulators, implantation, or any dielectric including air-gaps, for example. An important feature of the device in one embodiment is utilizing the CBL as a threshold control region, thereby achieving enhancement mode or depletion mode operation with the desired threshold voltage.

In one embodiment, enhancement mode operation can be achieved by using magnesium doped p-GaN as the CBL. Similar device structures with enhancement mode operation have been demonstrated in III-N material systems [8-12]. However, these devices suffer from low current density and high on-resistance due to the poor mobility of the inversion layer formed in the p-GaN in the ON-state. Region B of the proposed device structure aims to improve the channel mobility in the ON-state.

Region B of the device consists of/comprises a channel region which cont the current flow (from the source) in the vertical direction by modulating one or more two dimensional channels (e.g., two dimensional electron gas, 2DEG) or a three dimensional channel (e.g., three dimensional electron gas, 3DEG). Examples include the channel consisting of/comprising a single layer or multiple layers (for example, AlGaN/GaN/AlN).

Therefore, ultra-low on-resistance could be achieved alongside enhancement mode operation. In one or more embodiments, the channel also contains a defect blocking layer (DBL) to arrest the diffusion of defects in the channel layers. Examples of the DBL include, but are not limited to, the DBL comprising an opposite conductivity type material/wide band-gap material/insulator/dielectric. In one or more embodiments, the thickness of DBL is desired to be kept at a minimum to maintain low on-resistance of the device.

Device examples include the channel in region B capped by insulator/dielectric/wide band gap material of desired thickness. Region B also consists of/comprises at least one gate electrode. Example locations for the gated region include the gated region on the sidewall region, or on a combination of both lateral and vertical sidewall regions. Also, in one or more embodiments as discussed above, the channel region consists of/comprises a DBL to block the flow of defects from the etched surface into the channel.

Region C of the device is the drift region, a voltage blocking region which contains a substantial part of the blocked voltage in the OFF state in the vertical dimension. The main current-blocking region is based on, but not limited to, a metal-insulator-semiconductor combination. Using edge termination techniques [11], high blocking voltage could be sustained in the drift region.

In one or more embodiments of the device, the main current blocking region is a metal-insulator combination. In one or more embodiments, the insulator/dielectric/wide band gap material is deposited in such a manner that it is thicker at the bottom of the trench and thinner at the sidewalls, which simultaneously provides increased breakdown voltage and reduced on-resistance from the device.

In another embodiment of the device, p-GaN is regrown to obtain breakdown voltage of a p-n diode. In this device structure, in the gate-drain region, initially, the reverse voltage will be held by the metal-insulator-semiconductor (MIS) junction and the depletion region of p-n junctions on either side of the device will not have merged yet. However, on further application of reverse bias, the depletion widths of p-n junction (on either side of the device) would merge and would allow this device to achieve the breakdown voltage of a p-n diode.

In region C, current flowing vertically in the sidewall channel spreads laterally in the drift region (in one embodiment with the help of a 2 DEG formed in the channel region) and then flows vertically to the drain electrode.

In one or more embodiments, these features together provide for enhancement mode operation, ultra-low on-resistance, and high breakdown voltage. Such a device structure is highly advantageous for high power switching applications/embodiments.

a. Device Embodiments

FIG. 18 illustrates a specific device structure according to one or more embodiments of the invention, showing region A consists of/comprises at least one source electrode S. The device further comprises drain contact D (comprising metal) on an $n^+$-GaN contact layer 1800 (providing ohmic contact to the drain D), and region 1802 on the $n^+$-GaN layer 1800. The CBL comprising p-GaN is on the region 1802. The source contact S makes contact to the CBL through an opening/separation/division in an $n^+$-type region 1804. A mesa 1806 is defined in the device structure, wherein the mesa comprises the $n^+$-type layer 1804 and the CBL. A channel layer 1808 is deposited on the region 1802, sidewalls 1810 of the mesa 1806, and on a top surface of the mesa without contacting the source). A dielectric layer 1812 covers the channel layer 1808 on the region 1802, the sidewalls 1810, and the top surface of the mesa. The dielectric layer 1812 is between a gate G and the channel layer 1808, and the gate G contours the sidewalls 1810, top of the mesa 1806, and top of the region 1802.

FIG. 19(a), FIG. 19(b), and FIG. 19(c) show how the semiconductor device structure in FIG. 18 could be broadly divided into the three regions/parts A, B and C and further illustrates the trench 1806. Examples of methods for fabricating/forming the trench 1806 include, but are not limited to, dry etching, wet etching, or a combination of dry etching and wet etching. In one or more embodiments, region/part A is angled with angle Φ. Examples of the angle Φ include (but are not limited to) the angle Φ varying from 5 degrees to 175 degrees from the horizontal plane. FIG. 19(a) also shows that region/part A is sub-divided into region 1 (CBL) and region 2 (1804). The CBL blocks the flow of current from source to drain in both the ON-State and the OFF state.

As described above, the CBL can be formed by either p-type regions, wide bandgap materials, insulators, implantation, polarization doped barriers, or any dielectric including air-gaps. An important feature of the device in one embodiment is utilizing the CBL as a threshold control/plug, thereby, achieving enhancement mode or depletion mode operation with desired threshold voltage. The utilization of the CBL as threshold control layer can be achieved in multiple ways or by a combination of the following listed methods:

(i) Doped p-GaN: p-GaN in the CBL would allow enhancement mode operation by pinching of the sidewall channel at zero gate bias. The application of positive gate bias would result in either inversion/formation of 2-DEG, therefore achieving normally-off behavior. The p-GaN layer can also be achieved in multiple ways, e.g., via doping or grading. Doping could be uniform, graded or abruptly changing. Doping variations throughout region 1 (comprising CBL) (as a function of both x and y) can be accommodated as desired. Another way to achieve the p-GaN layer is via grading.

(ii) Super-lattice: In one or more embodiments, the concept of super-lattice structures with modulation or uniform doping is utilized to form a threshold plug. Alternating layers of modulation doped/uniformly doped higher band gap material followed by lower band gap material ($Ga_wAl_xIn_yB_zN/Ga_wAl_xIn_yB_zN$ where $0 \le w \le 1$, $0 \le x \le 1$, $0 \le y \le 1$, $0 \le z \le 1$, and $w+x+y+z=1$) would form the super-lattice and thus provide the necessary compensating charges (with respect to the 2-DEG). The superlattice region can also be uniformly doped with acceptors and produce substantially the same results. To re-emphasize, wider band gap material is either modulation doped, or both the barrier (higher band gap material) and the well (lower band gap material) can be doped, or just the narrow band gap region can be doped, to meet different design criteria. Different carrier concentrations can be achieved by varying the dimensions, spacing, doping, and number of the layers. Polarization fields, if available, can also be utilized in super-lattices to provide the necessary charges for charge compensation.

(iii) Polarization grading: on the polar planes, grading results in 3DEGs or 3 dimensional hole gases (3DHGs). These 3 DEGs/3 DHGs could be employed to obtain threshold control. In one embodiment, grading of GaN to InGaN on the Ga-face results in formation of 3DHGs. In one embodiment, the graded layers are doped with the dopants. In another embodiment, the graded layers are not doped with dopants. In one or more embodiments, the graded layers (3 DHGs/3 DEGs) are capped with a doped p-GaN/n-GaN layer. In one or more embodiments, the graded layers (3 DHGs/3 DEGs) are not capped with a doped p-GaN/n-GaN layer. Also, in one or more embodiments, a combination of a graded region followed by a doped p-GaN layer is utilized to obtain a threshold plug layer.

(iv) Implantation: In one or more embodiments, region 1 (CBL) or a part of region 1 is implanted with compensating charges to obtain a threshold plug.

Carrier concentration in all of the methods listed above can be controlled by varying the dimensions, spacing, doping, alloy composition, number of implanted species, implant energy, and number of the layers (as applicable).

Ohmic contact to region 1 (CBL) is needed for power switching applications and the CBL may or may not be electrically connected with the source ohmic contact such that in operation there is no bias between the source and the CBL. Region 2 (1804) is the source contact layer. Region 2 (1804) can be obtained either by growth over region 1 (CBL) or by implanting region 1 (CBL). Source contact (to region 2, 1804) is ohmic and acts as a source for electrons in the channel region 1808. Ohmic contacts can be achieved by multiple methods such as regrowth, annealing, etc. All dimensions in part/region A are variable and can be altered to meet device design criteria.

FIG. 19(b) illustrates how region/part B of the device is sub-divided into two regions numbered 1812 (Region 3) and 1808 (Region 4).

Region 3 (1812, the region under the gate G) can be or can form a Metal-Oxide-Semiconductor (MOS) structure with oxide/dielectric/insulator/any wide band gap material. Thickness of oxide/dielectric/insulator/any wide band gap material is variable to meet device design criteria. Region 3 is generally capped by gate electrode G as shown in FIG. 18. The gated region could be on the sidewall 1810 region or a combination of both the lateral and vertical sidewall 1810 regions.

Region 4 (as illustrated by 1808 in FIG. 19(*b*)) consists of/comprises a channel region 1808 which controls the current flow (from the source S) in the vertical direction by modulating one or more two dimensional channels or a three dimensional channel. Region 4 could have a single layer or multiple layers (for example AlGaN/GaN/AlN). In one embodiment, the channel region 1808 comprises, or is achieved by having, a wide band gap material followed by a lower band gap material as shown in FIG. 20. In one embodiment, the channel also contains a DBL (as shown in FIG. 21) to arrest the diffusion of defects in the channel layers. In one embodiment, the DBL comprises opposite conductivity type material/wide band-gap material/insulator/dielectric. In one embodiment, the thickness of the DBL is desired to be kept at minimum to maintain low on-resistance of the device. Therefore, in one or more embodiments, ultra-low on-resistance can be achieved alongside enhancement mode operation. The layered structure in region 4 (1808) can comprise layers which have uniform/graded/abrupt/modulation doping or layers that are undoped. The layered structure can also be realized by grading a single layer or grading multiple layers. The thicknesses and alloy composition of different layers in region 4 could be varied to meet different design criteria.

In one embodiment, prior to regrowth of region/part B, the device structure as shown in region/part A undergoes a cleaning procedure (thermal or wet process).

FIG. 19(*c*) illustrates region/part C of the device is the drift region comprising regions numbered 1802 and 1800. Region 5 (1802) is the voltage blocking region which contains a substantial part of the blocked voltage in the OFF state in the vertical dimension. The main current-blocking region is based on, but not limited to, a metal-insulator-semiconductor combination. Using edge termination techniques [11-12], high blocking voltage could be sustained in this region. Region 5 (1802) also allows the spread of the current from 2-DEG towards the drain contact D. Region 5 is generally doped with a lower concentration than region 6 (1800) as region 6 (1800) is the highly conductive layer which facilitates the ohmic drain contact. Both region 5 and 6 are n-type in nature with variable doping in the x and/or y directions. The thickness of region 5 and 6 is variable from zero to any positive value.

In one embodiment of the device, as shown in FIG. 22, the main current blocking region is a metal-insulator combination. In this example, the insulator/dielectric/wide band gap material is deposited in such a manner that it is thicker at the bottom of the trench and thinner at the sidewalk, which simultaneously provides increased breakdown voltage and reduced on-resistance from the device. Such a dielectric deposition may be done in single or multiple steps. Also, the dielectric/insulator/any wide band gap material on the sidewall (region 2200*a*, FIG. 22) may or may not differ from the thick dielectric (region 2200*b*, FIG. 22) on the planar region. The regions 2202, 2204 and 2206 are of same conductivity type. However, they may or may not be same semiconductor. In general, the thickness of region 2204 would be less than the thickness of region 2206 to obtain high breakdown voltage due to metal insulator junction. All regions 2202, 2204 and 2206 can have variable doping in both x and y directions. This device structure allows the possibility of achieving normally-off operation, low on-resistance, and high breakdown voltage simultaneously. The CBL in this embodiment refers to the CBL region described above (FIG. 19(*a*)). Region 2208 in this embodiment refers to the channel region described above (region 1808, FIG. 19(*b*)).

In another embodiment of the device, as shown in FIG. 23, regrowth of opposite conductivity type is employed to obtain high breakdown voltage of a p-n junction 2300. In the OFF state, in the device structure shown in FIG. 23, initially, the reverse voltage will be held by MIS junction (in gate-drain region) and the depletion region of p-n junctions 2300 (on either side of the device) will not have merged yet. However, on further application of reverse bias, the depletion widths of p-n junction 2300 (on either side of the device) would merge and would allow this device to achieve the breakdown voltage of a p-n diode. The regions 2302, 2304, and 2306 are of same conductivity type. However, they may or may not be same semiconductor. All regions 2302, 2304 and 2306 can have variable doping in both x and y direction. Region 2308 refers to a dielectric/wide band gap material/insulator. The DELTA shown in FIG. 23 (region 2310) could be positive, negative or zero. A positive value of delta would allow a super-junction type device. Region 2310 (p-GaN) can be obtained in a similar way as the CBL region (described as the CBL in part A of FIG. 19(*a*)). In one embodiment, region 2310 is regrown and the ohmic contact to region 2310 is electrically connected to the source contact S such that in operation there is no bias between the source S and the p-GaN 2310. The spacing between region 2310 and 2310 can be adjusted to meet specific design criteria. The space between region 2310 and region 2312 can be filled with dielectric which may or may not be similar to region 2308. Region 2312 in this embodiment refers to the channel region described above (region 1808, FIG. 19(*b*)).

b. Further Possible Modifications and Variations

The structures described above can be realized in different shapes and forms, such as cylindrical, hexagonal and other geometries.

c. Process Stem

FIGS. 24A-24E and FIG. 25 illustrate a method of fabricating a device. The method comprises the following steps (referring also to FIGS. 18-23).

Block 2500 and FIG. 24A illustrate depositing a semiconductor/epitaxial structure comprising a CBL on a drift region. In one embodiment, the CBL comprises doped III-nitride, e.g., p-GaN formed by doping or polarization grading. In one or more embodiments, the CBL comprises a superlattice, the superlattice comprising doped higher band gap material followed by lower band gap material ($Ga_wAl_x$-$In_yB_zN/Ga_wAl_xIn_yB_zN$ where $0 \le w \le 1$, $\le x \le 1$, $0 \le y \le 1$, $0 \le z \le 1$, and $w+x+y+z=1$). In one or more embodiments, the CBL is implanted with compensating charges (e.g., that compensate the channel). In one or more embodiments, the epitaxial structure comprises an $n^+$-type region on a Hype region on an $n^-$-type region on an $n^+$-type region, wherein the $n^+$-type regions have higher n-type doping than the n-type regions and the $n^-$-type doped regions, and an $n^-$-type doped regions have lower n-type doping than the n-type doped regions and the $n^+$-type doped regions.

Block 2502 and FIG. 24B illustrate etching a first region A into the semiconductor/epitaxial structure to form a mesa 1806 and/or trench. The p-type region in the mesa comprises the CBL. Sidewalls can have various shapes e.g., sloped or vertical). In one or more embodiments, trench corners can be shaped to reduce the electric field.

Block 2504 and FIG. 24C illustrate depositing a second region B comprising a channel or interlayer 1808 on a sidewall 1810 of the mesa or trench, e.g., by MOCVD regrowth. In one or more embodiments, the channel/interlayer comprises a two dimensional or three dimensional electron or hole gas. In one or more embodiments, the CBL, the channel, and the drift region comprise III-nitride layers.

In one or more embodiments, the CBL and the drift region are GaN layers. In one or more embodiments, the channel/interlayer is a single layer, e.g., GaN. In one or more embodiments, the channel/interlayer comprises multiple layers (for example, AlGaN/GaN/AlN, AlGaN/GaN). In one or more embodiments, the channel comprises a wide band gap material followed by a lower band gap material. In one or more embodiments, the channel further comprises a DBL. In one or more embodiments, the DBL comprises at least one material selected from: a material having opposite conductivity type to the other layers in the channel, a wide band-gap material, an insulator, and a dielectric. In one embodiment, the thickness of the DBL is minimized. In one or more embodiments, doping of the channel is achieved using at least one technique selected from uniform doping, graded doping, abrupt doping, and modulation doping. In one or more embodiments, the channel/interlayer comprises one or more undoped or unintentionally doped (UID) layers. In one or more embodiments, the channel comprises a graded single layer or graded multiple layers. In one or more embodiments, thickness and alloy composition of the channel are selected to achieve specific design criteria.

Block 2506 and FIG. 24C represents depositing a dielectric layer 1812 on the channel 1808 (e.g., via in situ MOCVD regrowth). In one or more embodiments, the dielectric is thicker at a bottom of the mesa sidewall than at a top of the sidewall/mesa. In one or more embodiments, this layer comprises at least one material selected form an oxide, dielectric, insulator, and any wide band gap material.

In one or more embodiments, the surface of the interlayer/channel (on which the dielectric is deposited) does not comprise impurity (such as silicon) that provides a positive charge at the interface between the dielectric (e.g., oxide) and the channel. In one or more embodiments, the interface state density at the interface between the oxide dielectric and the channel is small (e.g., less than $10^{11}$). In this way, robust and reliable enhancement mode operation can be achieved.

In one or more embodiments, negative charges are placed in the vicinity of the gate oxide/dielectric to reduce the electric field.

Block 2508 and FIG. 24D represent/illustrate an optional etch step (for source contact) and/or activation anneal.

Block 2510 and FIG. 24E represent metallization. The step comprises depositing a gate contact G on the dielectric layer 1812. The step comprises depositing a source contact S on the CBL and the n$^+$ type region 1804. The step comprises depositing a drain contact D on the drift region. In one or more embodiments, the channel, the dielectric, and the gate form a MOS structure. In one or more embodiments, the gate and CBL control current flow (from the source S to the drain) in the vertical direction by modulating one or more two or three dimensional electron or hole gases in the channel.

Block 2512 and FIGS. 24F and 24G represent the end result, a device such as a semiconductor transistor, comprising a first region A comprising a source contact S on a CBL; a second region B comprising a channel 1808 on a sidewall 1810 of the first region A, a dielectric layer 1812 on the channel 1808, and a gate contact G on the dielectric layer 181; a third region comprising a drift region 1802/1800; and a drain contact D on the drift region. The CBL is doped and/or structured to prevent current flow from the source S to the drain D in both an ON-state and an OFF state (and, e.g., to achieve a desired threshold voltage). The gate contact G controls or modulates the current flow from the source S in a vertical direction through the channel 1808 (or through the 2DEG or 3DEG in the channel), wherein modulation of the channel 1808 reduces on-resistance of the transistor. The drift region is a voltage blocking region (e.g., which contains a substantial part of the blocked voltage in the OFF state in a vertical dimension). In one or more embodiments, an interface between the dielectric and the channel does not comprise positive charge, or comprises positive charge such that the transistor is an enhancement mode transistor.

In one or more embodiments, $V_{BR}$ is at least 1000 V, in orange of 1000-2000 V, or in a range of 1700-2000 V ($E_{BR}$=2.4-3.0 MV/cm), $R_{ON}$<1 mΩ·cm$^2$ and $V_{TH}$>2V.

In one or more embodiments, charge at the dielectric/channel or oxide/channel interface is such that the threshold voltage is greater than 1V, greater than 2V, greater than 3V, in a range of 1-5 V, in a range of 1-3V, or in a range of 2-3V, for example. In one or more embodiments, the charge at the interface is such that the transistor's threshold voltage is greater than 1 Volt and/or a density of interface states at the interface in the channel is less than $10^{11}$ cm$^{-2}$.

In one or more embodiments, this is achieved by growing the oxide/dielectric in situ with the channel, to avoid exposure of the channel surface to air/dopants such as silicon/nitrogen vacancies that provide positive charge on the surface of the channel. In one or more embodiments, in situ deposition is achieved by growing the channel and dielectric/oxide in the same growth reactor (e.g., MOCVD), e.g., without removing the device with the channel from the reactor prior to depositing the oxide/dielectric). However, other fabrication methods that reduce/eliminate interface charge may also be used.

In one or more embodiments, the drift region comprises a p-GaN region 2310 and an n-GaN region 2304, the n-GaN region 2304 is between the drain D and the channel 2312 and between the drain D and the p-GaN region 2310. In these embodiments, the p-GaN region 2310 is outside a region between the channel 2312 and the drain D, and the p-GaN region 2310 is ohmically connected to the source contact S such that upon application of a reverse bias, a depletion width of a p-n junction 2300 formed between the p-GaN 2310 and the n-GaN 2304 merges such that the transistor achieves a breakdown voltage of a p-n diode.

In one or more embodiments, a plurality of the transistors are integrated in a device, e.g., with edge termination, forming multi-cell devices, or the transistors arranged in a grid or array.

In one or more embodiments, the channel, the CBL, and the drift region comprise III-Nitride materials. However, embodiments of the invention are not limited to the use of GaN based or III-nitride materials. Oxide materials or other polar materials for the epitaxial structure can be used. For example, in one or more embodiments, the epitaxial structure layers (drift region, n-type regions, CBL, p-type regions) comprise Zinc Oxide. For example, the CBL may comprise p-type ZnO formed by doping or polarization doping (e.g., the CBL can comprise a grade from ZnO to Zinc Cadmium Oxide (ZnCdO)). In one or more embodiments, the channel, the CBL, and the drift region comprise oxide materials.

d. Advantages and Improvements

One or more embodiments of the present invention, having enhancement mode operation with a potentially very high breakdown voltage as well as a superior on-state performance, are great candidates for high-power switching applications.

One or more embodiments of the present invention disclose a semiconductor device majorly consisting of a current blocking layer (CBL), a channel region, and a drift region. The CBL prevents the current flow from the source to the drain, in both the ON-State and the OFF state. The CBL can be utilized as a threshold control region, thereby achieving enhancement mode or depletion mode operation with a desired threshold voltage. Similar device structures with enhancement mode operation have been demonstrated in III-N material systems [8-12]. However, these devices suffer from low current density and high on-resistance due to the poor mobility of the inversion layer formed in the p-GaN in the ON-state. The channel region according to one or more embodiments of the proposed device structure addresses this problem: the channel region controls the current flow (from the source) in the vertical direction by modulating one or more two dimensional channels or a three dimensional channel. Therefore, ultra-low on-resistance could be achieved alongside enhancement mode operation. The drift region is a voltage blocking region which contains a substantial part of the blocked voltage in the OFF state in the vertical dimension. Alongside the drift region, a novel way to improve breakdown voltage by p-GaN regrowth, or thicker dielectric deposition, is also proposed here.

Therefore, together, these features provide for enhancement mode operation, ultra-low on-resistance, and high breakdown voltage. This device structure is highly advantageous for high power switching applications.

e. Experimental Results for Trench MOSFET Embodiment

The device structure was grown by Metal Organic Chemical Vapor Deposition (MOCVD) on a sapphire substrate. The epitaxial stack is shown in FIG. 26A. The device fabrication process started with the formation of trench structures. A high power $Cl_2$/Ar etch was done in an ICP system to obtain vertical sidewalls. Thereafter, the samples went through a MOCVD regrowth process where three different GaN interlayers with thicknesses of 0 nm, 10 nm and 30 nm were deposited. The sample without a GaN interlayer served as reference sample to compare the device characteristics of the interlayer samples to those of existing trench MOSFET device structures [13-16]. The GaN interlayer regrowth was followed by 50 nm thick MOCVD aluminum oxide. The aluminum oxide was grown using oxygen (100 sccm) and tri-methyl aluminum (1.6 μmol/min) at 700° C. Thereafter, source, body and drain etches were performed. The samples were annealed in $N_2$/$O_2$ ambient at 700° C. for 15 minutes in order to activate the p-GaN. Ti/Au (30 nm/200 nm) was then used as contact for body, source, drain and gate. The device schematic is shown in FIG. 26B.

FIGS. 27A-27C show the transfer $I_{DS}$-$V_{GS}$ characteristics for three samples with different GaN interlayer thicknesses at $V_{DS}$=1 V. The threshold voltages thus obtained are 9 V, 3 V and −3 V for 0 nm, 10 nm and 30 nm thick GaN interlayers respectively, therefore demonstrating enhancement mode operation for 10 nm thick GaN interlayer.

FIGS. 28A-28C shows the output DC characteristics ($I_{DS}$-$V_{DS}$) for different GaN interlayers. The drain current density is significantly higher in the devices with GaN interlayer (FIG. 28B and FIG. 28C) in comparison to those with no interlayer (FIG. 28A). This strongly evidences the enhancement in the electron mobility in the channel. A similar trend is also observed in the on-resistance of these devices. The on-resistance is calculated here by considering the active area (10 μm diameter) and evaluated at $V_{GS}$-$V_{TH}$=6 V and $V_{DS}$=1 V. The on-resistance decreased from 2.6 mΩ·cm2 to 0.97 mΩ·cm² by changing from no GaN interlayer to 10 nm GaN interlayer. However, the further decrease from 10 nm to 30 nm GaN interlayer is not as significant (0.97 mΩ·cm₂ to 0.71 mΩ·cm²). One or more of the inventors hypothesize that as the GaN interlayer thickness increases, the channel is spaced further away from the p-GaN interface, thereby increasing electron mobility. However, after a certain GaN thickness, this advantage tends to saturate as electron mobility in the channel would become increasingly limited by scattering at the $Al_2O_3$/GaN interface.

FIG. 29 shows the breakdown characteristics of devices with 0 nm and 10 nm GaN interlayer thickness. The breakdown in both devices occurred at the gate-drain junction and was catastrophic in nature. The 30 nm GaN interlayer thickness sample suffered from source-drain leakage. The low breakdown and source-drain leakage in devices with GaN interlayer indicates the presence of positive charges at the regrown interface or in the regrown GaN interlayer. The positive charges could arise from the etch damage and subsequent regrowth. Therefore, surface pretreatment and regrowth conditions need to be optimized to improve device breakdown.

These device results demonstrate the enhancement of drain current density and lowering of on resistance in III-N trench MOSFETs by insertion of a MOCVD-regrown GaN interlayer between the trenched structure and the dielectric. For an optimal GaN interlayer thickness of 10 nm, enhancement mode operation ($V_{TH}$=3 V) was achieved alongside a lower on-resistance ($R_{ON}$=0.97 mΩ·cm²) and higher current density (300 mA/mm) as compared with a device without an interlayer. These results are promising for the future application of MOSFETs for high voltage and high-power electronics in the III-N material system.

f. Experimental Results for OG-FET Device According to One or More Embodiments

The OG-FET device structure was grown by MOCVD on sapphire substrates using trimethylgallium (TMGa) and ammonia ($NH_3$) as precursors. Disilane (Si2H6) and bis-cyclopentadienyl-magnesium ($Cp_2Mg$) were used for n- and p-type doping respectively. First, a heavily Si-doped ($3 \times 10^{18}$ $cm^3$) n⁺-layer of 1 μm thickness followed by 6 μm thick, lightly Si doped ($5-10 \times 10^{15}$ $cm^{-3}$) drift region was grown. Thereafter, 0.3 μm of p-GaN (Mg: $3 \times 10^{19}$ $cm^{-3}$) was deposited. The magnesium (Mg) doping density was kept sufficiently high (Mg: $3 \times 10^{19}$ $cm^{-3}$) to avoid punch through. The thickness of the p-GaN layer was the nominal gate length of the device. Afterwards, the sample underwent a surface cleaning to strip residual magnesium off the surface [24]. This was performed to prevent surface riding of magnesium into the n⁺-GaN layer [24]. Finally, the sample was capped with a heavily doped 0.2 μm thick n⁺-GaN layer ([Si]=$5 \times 10^{18}$ $cm^{-3}$) for the source contact. The OG-FET fabrication process started with the formation of vertical trench structures (15° from vertical) as shown in FIG. 31A. A high power (75 W) $Cl_2$/Ar etch of ~650 nm was performed in an inductive coupled plasma (ICP) system to obtain vertical sidewalls. Residual Si, which is commonly observed at regrown interfaces, could add positive charges and potentially result in both lower breakdown and threshold voltage [25]. In order to remove the residual Si at the interface prior to the MOCVD regrowth process, the sample underwent UV-Ozone and conc. HF treatment [25]. Thereafter, the samples went through a MOCVD regrowth process where the samples were annealed at 930° C. in a $N_2$/$NH_3$ ambient for 30 min. in the MOCVD chamber to heal etch damage [26]. After annealing, UID-GaN interlayer was re-grown on one of the sample. The other sample without GaN interlayer served as reference sample to compare the device characteristics of the interlayer sample to those of existing trench MOSFET device structures [17-23]. The unintentional doping (UID) of the GaN interlayer is anticipated to be $2-5 \times 10^{15}$ cm$^{-3}$. The GaN interlayer regrowth was performed 950° C. At this temperature, no mass reflow was observed. FIG. 31B and FIG. 31C shows the grown GaN interlayer on c-plane (~7 nm thick) and a-plane oriented sidewall (~1 nm thick) respectively. This implies that the growth rate of GaN interlayer on c-plane was much higher than growth rate of GaN interlayer on a-plane oriented sidewall. It should be noted that the sidewall plane is not a crystallographically accurate crystal a-plane because the trench sidewall is formed with a taper angle of 75°. A longer regrowth (~200 nm) was performed on a test sample to confirm the regrowth of GaN on etched sidewall as shown in FIG. 31D. The GaN interlayer regrowth was followed by 50 nm of MOCVD aluminum oxide which was grown using oxygen (100 sccm) and tri-methyl aluminum (1.6 µmol/min) at 700° C. [27]. Thereafter, source, body and drain etches were performed. The samples were annealed in $N_2/O_2$ ambient at 700° C. for 15 min. in order to activate the p-GaN prior to the metal deposition. Ti/Au (30 nm/200 nm) were then used as contacts for body, source, drain and gate. The device schematic and epitaxial stack of OG-FET are shown in FIG. 30A and FIG. 30B.

The device size under test is 125 µm×125 µm inclusive of gate and source pads. The gate-source spacing is 0.5 µm on either side. The source area is 260 µm$^2$. The device consists of 2 µm trench width and 220 µm (110×2) gate width. The pitch of the device is considered to be 8 µm (trench width+ drift region thickness) as shown in FIG. 30A-30B. The drift region thickness is considered to allow for current spreading in the drift region. Therefore, the active area of the device is 8 µm×116 µm (110 µm gate width+6 µm drift region thickness).

The output DC characteristics of the drain current (IDS-VDS) normalized by active area for both samples is shown in FIGS. 32A-32B. The drain current density is significantly higher in the device with GaN interlayer (FIG. 32B) in comparison to those with no interlayer (FIG. 32A). This strongly evidences the enhancement in the electron mobility in the channel now formed in the GaN interlayer (in OG-FET) instead of the p-GaN. A similar trend is also observed in the on-resistance of these devices. The on-resistance is calculated here by considering the active area (as described above), exclusive of contact pads and evaluated at $V_{GS}$=15 V and $V_{DS}$=0.25 V. The on-resistance decreased from 9.3 mΩ·cm2 to 3.8 mΩ·cm2 by changing from no GaN interlayer to GaN interlayer. The lowering of on-resistance could occur as a result of improved channel mobility with GaN interlayer. The maximum channel mobility extracted from n$^+$-p$^+$-n$^+$ test structure (without drift region) for 0 nanometer (nm) and 1 nm thick GaN interlayer were 7-10 cm$^2$/V-s and 25-40 cm$^2$/V-s respectively, thereby, asserting our hypothesis. The increased electron mobility with GaN interlayer could occur due to reduced scattering from dielectric/semiconductor interface or/and from p-GaN layer. Further increment in GaN interlayer thickness (more than 1 nm) might help in reducing on-resistance even further as channel would be further spaced away from p-GaN layer thereby decreasing ionized impurity scattering.

FIG. 33 shows the transfer $I_{DS}$-$V_{GS}$ characteristics normalized by gate width for both samples without and with GaN interlayer at $V_{DS}$=1 V. Low gate leakage (<100 pA/min) and excellent $I_{ON}$-$I_{OFF}$ ratio of 108 was observed for both devices. The threshold voltage, $V_{TH}$, (defined at IDS=1 µA/mm, forward sweep) thus obtained was 5.8 V ($V_{TH}$=8 V, Linear extrapolation) and 2V ($V_{TH}$=3.6 V, Linear extrapolation) for sample without and with GaN interlayer, respectively. The expected threshold voltage values obtained from one dimensional self-consistent Schrödinger-Poisson solver were 26 V and 22.4 V for 0 nm and 1 nm thick GaN interlayers (sidewall) respectively [18]. While the threshold voltages exhibited the expected trend, the experimental values were significantly lower than the calculated values. Lowered experimental threshold voltage values compared with theoretical values have been observed by other researchers as well [17-22] and was attributed to sidewall etch damage, which can cause nitrogen vacancies to form and behave as donors. A clockwise hysteresis of $\Delta V_{TH}$~0.3 V and $\Delta V_{TH}$~1.3 V was observed for the sample with and the sample without the GaN interlayer, respectively. Lower hysteresis value indicates lower interface trap density for the sample with in-situ gate oxide. Lower sub-threshold slope (SS) was observed for the GaN interlayer sample (400 mV/dec) as compared to the sample without the GaN interlayer (500 mV/dec) measured from $I_{DS}$=10-6 mA/mm to 10-3 mA/mm. Lower SS with GaN interlayer could be a result of improved dielectric/semiconductor interface [26].

The off-state characteristics of both devices measured at zero gate bias is shown in the FIG. 34. The leakage current is normalized by the total device area (125 µm×125 µm). Almost similar breakdown voltages were obtained for both devices, 190 V for device without GaN interlayer and 195 V for device with GaN interlayer. Similar breakdown voltage is expected for both devices because breakdown voltage is governed by the thickness and doping of the drift region. The addition of GaN interlayer shouldn't affect the breakdown voltage as drift region thickness (~6 µm) is much greater than GaN interlayer. The breakdown occurred at the gate-drain junction and was catastrophic in nature. The breakdown field, thus obtained for both devices is low (~0.6-0.9 MV/cm) and needs to be improved. A probable cause of low breakdown field could stem from the etch damage on the trenched region. The ICP trench etch power (75 W) could be lowered in this regard. Therefore, trench etch alongside surface pre-treatment need to be optimized to improve device breakdown. Uniform device performance with marginal variation was observed for all parameters except breakdown voltage for both devices. The breakdown voltage varied from 150-200 V.

These device results demonstrate the enhancement of drain current density and lowering of on-resistance in III-N trench MOSFETs by insertion of a MOCVD-regrown GaN interlayer between the n-p-n trenched structure and the dielectric. With GaN interlayer and the in-situ dielectric, enhancement mode operation ($V_{TH}$=2 V) was achieved alongside a lower on-resistance ($R_{ON}$=3.8 mΩ·cm2) and similar breakdown voltage (195 V) as compared with a device without an interlayer. These results are promising for the future application of MOSFETs for high voltage and high-power electronics in the III-N material system.

FIG. 35A illustrates the output IV for the normally on device of FIG. 24F but without the GaN interlayer and FIG. 35B shows the output IV for the normally on device of 24F with the GaN interlayer (10 nm thickness). The on resistance $R_{ON}$ and the electron mobility $\mu_{CH,e}$ in the channel without the interlayer are 10 mΩ·cm$^2$ and 7-10 cm$^2$/Vs, respectively. The on resistance $R_{ON}$ and the electron mobility $\mu_{CH,e}$ in the channel with the interlayer are 5 mΩ·cm$^2$ and 25-40 cm$^2$/Vs respectively. The device with the GaN interlayer provides 3-4 higher electron mobility in the channel as compared to without the GaN interlayer. The on resistance decreases with GaN interlayer at the same $V_{GS}$. For these devices, MOCVD $Al_2O_3$ thickness was 50 nm, n$^-$-GaN thickness was 3 µm (doping concentration 6×10$^{16}$ cm$^{-3}$), the p$^+$-GaN had a thickness of 0.3 µm (Mg dopant concentration $3\times10^{19}$ cm$^{-3}$), and the gate, source, drain & body metallization was Ti/Au.

FIG. 35C shows similar breakdown voltage $V_{BR}$ for both devices with ($V_{BR}$=195 V) and without the GaN interlayer ($V_{BR}$=190 V). In other words, the GaN interlayer does not affect device breakdown, although the breakdown field is low ($E_{BR}$=0.6-0.8 MV/cm), possibly because the device is grown on sapphire.

g. Experimental Results for OG-FET Device According to One or More Embodiments Fabricated on a Bulk GaN Substrate In these experiments, the GaN interlayer had a thickness of 10 nm, the MOCVD Al$_2$O$_3$ thickness was 50 nm, the n-GaN had a thickness of 9 µm, the p$^+$-GaN had a thickness of 0.3 µm (doped with Mg to $3\times10^{19}$ cm$^{-3}$), and gate, source, drain & body metallization is Ti/Au. The device structure is illustrated in FIG. 24G.

FIGS. 36A-36C illustrate the OG-FET output I-V for the drift region doping $N_D$-$N_A$=7, 10, $14\times10^{15}$ cm$^{-3}$, respectively. The on resistance is 1.6 mΩ·cm$^2$ in FIG. 35A, 2.1 mΩ·cm$^2$ in FIG. 35B, and 2.5 mΩ·cm$^2$ in FIG. 35C, illustrating that on resistance increases with a decrease in drift region doping.

FIGS. 37A-37C illustrate transfer I-V curves for the OG-FET, showing $I_{on}/I_{off}$, threshold voltage $V_{th}$, $\Delta V_{th}$ (hysteresis) and subthreshold slope are independent of drift region doping and $V_{th}$ greater than 2.5 Volts for all devices.

FIG. 38A and FIG. 38B illustrate the off state I-V and that breakdown voltage $V_{BR}$ increases with decrease in drift region doping but breakdown field $E_{BR}$ is independent of drift region doping. A device achieved $V_{br}$ of 1000 V ($E_{br}$=1.6 MV/cm), on resistance of 2.5 mΩ·cm$^2$, and threshold voltage $V_{th}$ of 3 volts.

h. Band Diagram

FIG. 39 shows the band diagram of the device with the interlayer, according to one or more embodiments of the invention, leading to the advantage of increased mobility (leading to low on resistance), same breakdown voltage and normally off operation.

i. Multi-Cell Devices

FIGS. 40-42 illustrate multiple devices (N devices, where N is an integer) connected to each other, and with edge termination 4000, 4002, 4004. FIGS. 40-42 comprise repeats of the devices in FIG. 18 (i.e., the device of FIG. 18 is a unit cell which is repeated to form a multi device structure as shown in FIGS. 40-42 with the addition of edge termination). Similarly, multi-cell devices can be obtained using the unit cells in FIG. 22 and FIG. 23 with similar or different edge termination. The edge termination techniques shown in FIGS. 40-42 (such as ion implantation 4002 and field plating 4004) are merely for illustration purposes—any edge termination technique can be used. Standard examples of edge termination to reduce the electric field at the edge include field plating, ion implantation, guard rings, implant isolation etc.

In FIGS. 40-42, n$^+$ represents the region (e.g., 1804), p represents the CBL, n represents the n-GaN region (e.g., 1802) and n$^+$ represents another n$^+$-region (e.g., 1800).

Multi cell devices can also comprises repeats of a structure illustrated in FIG. 24F or FIG. 24G.

VI. Nomenclature

The terms "(AlInGaN)" "(In,Al)GaN", or "GaN" as used herein, as well as the terms "III-nitride," "Group-III nitride", "III-N," or "nitride," used generally, refer to any alloy composition of the (Ga,Al,In,B)N semiconductors having the formula Ga$_w$Al$_x$In$_y$B$_z$N where 0≤w≤1, 0≤x≤1, 0≤y≤1, 0≤z≤1, and w+x+y+z=1. These terms are intended to be broadly construed to include respective nitrides of the single species, Ga, Al, In and B, as well as binary, ternary and quaternary compositions of such Group III metal species. Accordingly, it will be appreciated that the discussion of the invention hereinafter in reference to GaN and AlGaN materials is applicable to the formation of various other (Ga,Al,In,B)N material species. Furthermore, (Ga,Al,In,B)N materials within the scope of the invention may include minor quantities of dopants and/or other impurity or inclusional materials. The term "non-III-nitride" or "non-III-N" refers to any semiconductor that is excluded from the definition provided for the term "III-nitride" or "III-N."

The term "non-III-nitride" refers to any semiconductor that is excluded from the definition provided for the term "III-nitride."

Many (Ga,Al,In,B)N devices are grown along the polar c-plane of the crystal, although this results in an undesirable quantum-confined Stark effect (QCSE), due to the existence of strong piezoelectric and spontaneous polarizations. One approach to decreasing polarization effects in (Ga,Al,In,B)N devices is to grow the devices on nonpolar or semipolar planes of the crystal.

The term "nonpolar plane" includes the {11-20} planes, known collectively as a-planes, and the {10-10} planes, known collectively as m-planes. Such planes contain equal numbers of Group-III (e.g., gallium) and nitrogen atoms per plane and are charge-neutral. Subsequent nonpolar layers are equivalent to one another, so the bulk crystal will not be polarized along the growth direction.

The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the crystal will have reduced polarization along the growth direction.

The term "on-resistance" refers to the linear relationship between current and drain to source voltage when the device is turned on via gate control and positive bias is applied to the drain contact.

The term "blocking voltage" refers to the positive voltage applied to the drain contact when the device is off.

Further information on one or more embodiments of the present invention can be found in [29-31].

REFERENCES

The following references are incorporated by reference herein:

[1] U.S. Publication No. 2012/0319127, filed Jun. 20, 2012, published Dec. 20, 2012, by S. Chowdhury, R. Yeluri, C. Hurni, U. K. Mishra, and I. Ben-Yaacov, and entitled "Current Aperture Vertical Electron Transistors with Ammonia Molecular Beam Epitaxy Grown P-type Gallium Nitride as a Current Blocking Layer."

[2] J. Kim, N. G. Toledo, S. Lal, J. Lu, T. E. Buehl, and U. K. Mishra. "Wafer-Bonded p-n Heterojunction of GaAs and Chemomechanically Polished N-Polar GaN," IEEE Electron Device Lett., 34, no, 1, pp. 42-44, (2013).

[3] S. Lal, J. Lu, M. Guidry, B. Thibeault, S. P. DenBaars, and U. K. Mishra. "Controlling electronic properties of wafer-bonded interfaces among dissimilar materials: A path to developing novel wafer-bonded devices," IEEE Device Research Conference (DRC), pp. 121-122, (2013).

[4] J. Kim, S. Lal, M. A. Laurent, and U. K. Mishra. "Vertical electron transistors with In$_{0.53}$Ga$_{0.47}$As channel and N-polar $In_{0.1}Ga_{0.9}N$/GaN drain achieved by direct wafer-bonding," IEEE Device Research Conference (DRC), pp. 221-222, (2014).

[5] U.S. Pat. No. 5,438,215, issued Aug. 1, 1995, to Tihanyi, and entitled "Power MOSFET."

[6] U.S. Pat. No. 6,677,643, issued Jan. 13, 2004, to Iwamoto et al., and entitled "Super-junction semiconductor device."

[7] Srabanti Chowdhuri, PhD thesis, University of California, Santa Barbara, December 2010.

[8] M. Kodama, M. Sugimoto, E. Hayashi, N. Soejima, O. Ishiguro, M. Kanechika, K. Itoh, H. Ueda, T. Uesugi, and T. Kachi, Appl. Phys. Express 1, 021104 (2008).

[9] H. Otake, S. Egami, H. Ohta, Y. Nanishi, and H. Takasu, Jpn. J. Appl. Phys. 46, L599 (2007).

[10] H. Otake, K. Chikamatsu, A. Yamaguchi, T. Fujishima, and H. Ohta, Appl. Phys. Express 1, 011105 (2008).

[11] T. Oka, Y. Ueno, T. Ina, and K. Hasegawa, Appl. Phys. Express 7, 021002 (2014).

[12] T. Oka, Tsutomu Ina, Yukihisa Ueno, and Junya Nishii, "1.8 mΩ·cm2 vertical GaN-based trend metal-oxide-semiconductor field-effect transistors on a free-standing GaN substrate for 1.2-kV-class operation." *Applied Physics Express* 8, no. 5 (2015): 054101.

[13] H. Nie et al., *IEEE-EDL*. vol. 35, p. 939, (2014).

[14] T. Oka et al., *Appl. Phys. Exp.*, vol. 8, p. 054101 (2015).

[15] H. Otake et al., *Appl. Phys. Exp.*, vol. 1, p. 011105 (2008).

[16] M. Kodama et al., *Appl. Phys. Exp.*, p. 021104 (2008).

[17] H. Otake, S. Egami, Ohta, Y. Nanishi and H. Takasu, "GaN-based trench gate metal oxide semiconductor field effect transistors with over 100 cm2/(V-s) channel mobility," *Jpn. J. Appl. Phys.* vol. 46, no. 25, pp, L599-L601, June 2007. DOI: 10.1143/JJAP.46.L599

[18] H. Otake, K. Chikamatsu, A. Yamaguchi, T, Fujishima and H. Ohta, "Vertical GaN-based trench gate metal oxide semiconductor field-effect transistors on GaN bulk substrates," *Appl. Phys. Exp.*, vol. 1, no. 1, pp. 011105-1-011105-3, January 2008, DOI: 10.1143/APEX.1.011105

[19] M. Kodama, M. Sugimoto, E. Hayashi, N. Soejima, O. Ishiguro, M. Kanechika, K. Itoh, H. Lieda, T. Uesugi and T. Kachi, "GaN-based trench gate metal oxide semiconductor field-effect transistor fabricated with novel wet etching," *Appl. Phys. Exp.*, vol. 1, no. 2, pp, 021104-1-021104-3, February 2008. DOI: 10.1143/APEX.1.021104

[20] M. Okada, Y. Saitoh, M. Yokoyama, K. Nakata, S. Yaegassi, K. Katayama, M. Ueno, M. Kiyama, T. Katsuyama, and Takao Nakamura, "Novel Vertical Heterojunction Field-Effect Transistors with Re-grown AlGaN/GaN Two-Dimensional Electron Gas Channels on GaN Substrates," *Appl. Phys. Exp.*, vol. 3, no. 5, pp. 054201-1-054201-3, April 2010. DOI: 10.1143/APEX.3.054201

[21] T. Oka, Y. Ueno, T. Ina and K. Hasenwa, "Vertical GaN-based trench metal oxide semiconductor field-effect transistors on a freestanding GaN substrate with blocking voltage of 1.6 kV,"*Appl, Phys. Exp.*, vol. 7, no. 2, pp. 021002-1-021002-3, January 2014. DOI: 10.7567/APEX.7.021002

[22] T. Oka, T. Ina, Y. Ueno and J. Nishii, "1.8 mΩ·cm2 vertical GaN-based trench metal-oxide-semiconductor field-effect transistors on a free-standing GaN substrate for 1.2-kV-class operation," *Appl. Phys. Exp.*, vol. 8, no. 5, pp. 054101-1-054101-3, May 2015. DOI: 1.0.7567/APEX.8.054101

[24] R. Chu, Y. Cao, R. Li, M. Chen, B. Hughes and K. Boutros, "Normally-off GaN power transistors: from lateral to vertical", International Conference on Nitride Semiconductors (ICNS'15), Beijing, China. September 2015.

[25] Xing, D. S. Green, H. Yu, T. Mates, P. Kozodoy, S. Keller, S. P. Denbaars and U. K. Mishra, "Memory effect and redistribution of Mg into sequentially regrown GaN layer by metalorganic chemical vapor deposition," *Jpn. J. Appl. Phys.*, vol. 42, no. 1, pp. 50-53, January 2003. DOI: 10.1143/JJAP.42.50

[26] S. Chowdhury, "AlGaN/GaN CAVETs for high power switching application Title of dissertation," Ph.D. dissertation, ECE. Dept., UC Santa Barbara, Santa Barbara, Calif., 2010.

[26] S. H. Chan, S. Keller, M. Tahhan, H. Li, B. Romanczyk, S. P. Denbaars and U.K. Mishra, "High electron mobility recovery in AlGaN/GaN 2DEG channels regrown on etched surfaces," *Semicond. Sci. Technol.*, 31.6 065008, pp. 1-8. April 2016. DOL 10.1088/0268-1242/31/6/065008.

[27] X. Liu, S. H. Chan, F. Wu, Y. Lie, S. Keller, J. S. Speck and U. K. Mishra, "Metalorganic chemical vapor deposition of Al2O3 using trimethylaluminum and O2 precursors: Growth mechanism and crystallinity," vol. 408, pp. 78-84, September 2014. DOI: 10.1016/j.jcrysgro.2014.09.029.

[28] M. Grundmann. BANDENG, accessed on Jun. 30, 2016. [Online]. Available: http://my.ece.ucsb.edu/mgrundmann/bandeng.htm

[29] C. Gupta; S. H. Chan; Y. Enatsu, A. Agarwal, S. Keller and U. K. Mishra, "A novel device design to lower the on-resistance in GaN trench MOSFETs," 2016 *74th Annual Device Research Conference (DRC)*, Newark, Del., 2016, June 2016, pp. 1-2. doi: 10.1109/DRC.2016.7548466.

[30] C. Gupta; S. H. Chan; Y. Enatsu; A. Agarwal; S. Keller; U. K. Mishra, "OG-FET: An in-situ Oxide, GaN interlayer based vertical trench MOSFET," in *IEEE Electron Device Letters*, vol. PP, no. 99, pp. 1-1 doi: 10.1109/LED.2016.2616508, http://ieeexplore.ieee.org/stamp/stamp.jsp?tp=&arnumber=7588148&isnumber=4357973, October 2016.

[31] Chirag Gupta, Yuuki Enatsu, Silvia H. Chan, Agarwal Agarwal, Davide Bisi, Stacia Keller, Umesh K. Mishra, "Regrown Mg doped GaN interlayer to enhance breakdown voltage in trench MOSFET", International Workshop on Nitrides 2016, Orlando Fla., at https://www.mrs.org/docs/default-source/meetings-events/mrs-conference-services/58th-emc/iwn-program.pdf?sfvrsn=14, October 2016.

[32] U.S. Pat. No. 9,281,183.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A vertical transistor, comprising:
a first III-nitride layer on a second III-nitride layer and comprising a lateral channel;
a polar c-plane interface and nonpolar and/or semipolar interfaces between the first III-nitride layer and the second III-nitride layer;
a drift region connected to the lateral channel, the drift region comprising one or more doped Gallium Nitride layers;
a source contact to the lateral channel;
a drain contact to the drift region; and
one or more gates on the lateral channel and positioned to modulate current flowing vertically from the source contact, through the drift region, and to the drain contact, wherein:
the polar interface is between the drift region and one or more gates;
the drift region comprises a current blocking structure;
voltage is predominantly held in a vertical direction in an off-state;
the current is channeled through an aperture in the current-blocking structure after it flows from under the one or more gates, into the drift region in an on-state; and
the one or more gates and/or the current blocking structure:
(i) induce a two dimensional electron gas at one or more sidewalls of the gates and/or of the current blocking structure, and/or
(ii) the current blocking structure comprises different material regions that can provide a compensating charge, wherein the compensating charge can fully deplete an ionized dopant concentration in a current carrying region of the drift region in the off-state.

2. The device of claim 1, wherein the current-blocking structure is comprised of trenches filled with insulator and metal to provide the compensating charge.

3. The device of claim 1, wherein the current-blocking structure is comprised of trenches filled with alternating layers of semiconductor material to provide the compensating charge.

4. The device of claim 1, wherein the device is a III-nitride device.

5. The device of claim 1, wherein the current blocking structure:
has the one or more sidewalls adjacent to the current carrying region of the drift region, and
is structured such that the one or more sidewalls reduce resistance to the current's flow in the current carrying drift region.

6. The device of claim 1, comprising:
a part A bonded to a part B, wherein:
the Part A comprises the one or more gates, the source, and the lateral channel;
the Part B comprises the drift region that carries the current flow via a vertical or sloped two-dimensional electron gas (2-DEG) and along the sidewall; and
the current flow from the lateral channel to the drift region is confined substantially to an aperture defined by the current blocking structure.

7. The device of claim 1, wherein the drift region is a voltage blocking region that can be fully depleted at voltages lower than a desired breakdown voltage.

8. The device of claim 1, wherein:
the current blocking structure has one or more dimensions and materials, and
the current-carrying region has one or more dimensions and doping, such that:
an electric field held in the current blocking region is less than its breakdown field in the off-state, and
the current-carrying region becomes fully depleted in the off-state, thus enabling a breakdown voltage of the device.

9. The device of claim 1, wherein, in the on state, the gates deplete the lateral channel adjacent the gates' sidewalls, so that the current flows predominantly from under the gate to the drift region.

10. The transistor of claim 1, further comprising:
a plurality of trenches in one or more of the III-nitride layers, wherein the trenches shape the lateral channel; and
one of the gates in each of the trenches.

11. The transistor of claim 10, wherein the source contact forms metal regions between the gates and mitigates high field regions at the gate edges, ensuring the peak field is in the bulk of the device.

12. The transistor of claim 10, wherein a polarization induced two dimensional electron gas (2DEG) is formed in regions between the trenches, resulting in the 2DEG which spreads the current efficiently in the drift region to make the full chip area active.

13. The transistor of claim 12, wherein the channel comprising the 2DEG along the vertical non-polar and/or semipolar interfaces is induced only under forward bias on the gates and the 2DEG on the polar c-plane is always present for all operating conditions.

14. The transistor of claim 13, wherein the non-polar interface includes an m-plane interface.

15. The transistor of claim 14, wherein the first III-nitride layer is GaN and the second III-nitride layer is AlGaN.

16. The transistor of claim 1, further comprising:
a dielectric layer between the gates and the lateral channel, or
the dielectric layer between the gates and the second III-nitride layer and along the interfaces; and
wherein the dielectric provides negligible threshold shift under gate voltages between −10 V and +10V.

17. The transistor of claim 1, wherein the transistor's electrically active device area is equal to a geometric chip area on which the device is formed and a device having an on resistance of 1 mΩcm$^2$ has three times smaller chip area for the same $R_{on}$ as a 3 mΩcm$^2$ device.

18. The transistor of claim 1, wherein the transistor is a vertical Metal Oxide Semiconductor Field Effect Transistor (MOSFET) or a vertical Junction Field Effect Transistor.

19. A method of fabricating a vertical transistor, comprising:
depositing a semiconductor structure including a first III-nitride layer on a second III-nitride layer and comprising a lateral channel, wherein:
a polar c-plane interface and nonpolar and/or semipolar interfaces are between the first III-nitride layer and the second III-nitride layer;
the lateral channel is connected to a drift region;
the drift region comprising one or more doped Gallium Nitride layers;
depositing a source contact to the lateral channel;
depositing a drain contact to the drift region;

depositing one or more gates on the lateral channel and positioned to modulate current flowing vertically from the source contact, through the drift region, and to the drain contact; and forming a trench region around a current carrying region of the drift region; and wherein:

the polar interface is between the drift region and one or more gates, the trench region comprises a current blocking structure comprising different material layers that can provide a compensating charge, the compensating charge can fully deplete an ionized dopant concentration in a current carrying region of the drift region in an off-state, modulation of a current from a source to a drain occurs in the lateral channel, voltage is predominantly held in a vertical direction in the off-state, and the current is channeled through an aperture in the current-blocking structure after it flows from under the gates into the drift region in an on-state.

* * * * *

UNITED STATES PATENT AND TRADEMARK OFFICE
CERTIFICATE OF CORRECTION

PATENT NO. : 10,312,361 B2
APPLICATION NO. : 15/344377
DATED : June 4, 2019
INVENTOR(S) : Srabanti Chowdhury et al.

It is certified that error appears in the above-identified patent and that said Letters Patent is hereby corrected as shown below:

In the Specification

At Column 2, Line 10, please insert the following:
--STATEMENT REGARDING FEDERALLY SPONSORED RESEARCH AND DEVELOPMENT
This invention was made with Government support under Grant No. DE-AR0000451 awarded by the Department of Energy (DOE) Advanced Research Projects Agency - Energy (ARPA-E). The Government has certain rights in this invention.--

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*